(12) United States Patent
Okamura et al.

(10) Patent No.: US 8,007,903 B2
(45) Date of Patent: Aug. 30, 2011

(54) METHOD FOR MANUFACTURING CERAMIC MEMBER, AND CERAMIC MEMBER, GAS SENSOR DEVICE, FUEL CELL DEVICE, FILTER DEVICE, MULTI-LAYER PIEZOELECTRIC DEVICE, INJECTION APPARATUS AND FUEL INJECTION SYSTEM

(75) Inventors: Takeshi Okamura, Kirishima (JP);
Shigenobu Nakamura, Kirishima (JP);
Tomohiro Kawamoto, Kirishima (JP);
Nobuyuki Ito, Kirishima (JP);
Takafumi Tsurumaru, Kirishima (JP);
Tsuyoshi Setoguchi, Kirishima (JP)

(73) Assignee: Kyocera Corporation, Kyoto (JP)

( * ) Notice: Subject to any disclaimer, the term of this patent is extended or adjusted under 35 U.S.C. 154(b) by 478 days.

(21) Appl. No.: 12/280,768

(22) PCT Filed: Feb. 27, 2007

(86) PCT No.: PCT/JP2007/053650
§ 371 (c)(1),
(2), (4) Date: Nov. 12, 2008

(87) PCT Pub. No.: WO2007/097460
PCT Pub. Date: Aug. 30, 2007

(65) Prior Publication Data
US 2009/0220765 A1 Sep. 3, 2009

(30) Foreign Application Priority Data

| Feb. 27, 2006 | (JP) | 2006-050959 |
| Feb. 27, 2006 | (JP) | 2006-050961 |
| Apr. 27, 2006 | (JP) | 2006-123144 |
| Oct. 27, 2006 | (JP) | 2006-293008 |
| Oct. 30, 2006 | (JP) | 2006-293578 |

(51) Int. Cl.
*B32B 3/26* (2006.01)
*C04B 35/64* (2006.01)
*H01M 8/00* (2006.01)
*H01L 41/083* (2006.01)
*H01L 41/24* (2006.01)
*B05B 1/30* (2006.01)

(52) U.S. Cl. ............... 428/316.6; 428/319.1; 428/312.8; 428/457; 428/469; 428/699; 264/603; 264/628; 264/629; 264/642; 264/43; 264/45.1; 429/400; 310/364; 29/25.35; 239/569

(58) Field of Classification Search .................. None
See application file for complete search history.

(56) References Cited

FOREIGN PATENT DOCUMENTS

| JP | 06-258281 | 9/1994 |
| JP | 06-317555 | 11/1994 |
| JP | 11-051899 | 2/1999 |
| JP | 2001-250994 | 9/2001 |
| JP | 2005-101207 | 4/2005 |
| JP | 2005-183553 | 7/2005 |
| JP | 2005-203706 | 7/2005 |
| JP | 2006-041281 | 2/2006 |

*Primary Examiner* — Ling Xu
(74) *Attorney, Agent, or Firm* — DLA Piper LLP (US)

(57) ABSTRACT

A ceramic member in which the metal layers with high void ratio are sufficiently sintered to lower a residue of resin is produced. The method for manufacturing a ceramic member which comprises a step of forming a stacked compact from a plurality of metallic paste layers containing a metal component $M_1$ that are stacked one on another via ceramic green sheets, and a step of firing the stacked compact, wherein at least one of plural metallic paste layers is formed as a second metallic paste layer that has the mass percentage X higher than that of the metallic paste layer that adjoin therewith in the stacking direction and a ceramic powder is contained in the second metallic paste layer in the step of forming the stacked compact, the mass percentage X being the proportion of the metal component $M_1$ to the total metal content in the metallic paste layer.

56 Claims, 40 Drawing Sheets

511c
511a

511a

METHOD FOR MANUFACTURING CERAMIC MEMBER, AND CERAMIC MEMBER, GAS SENSOR DEVICE, FUEL CELL DEVICE, FILTER DEVICE, MULTI-LAYER PIEZOELECTRIC DEVICE, INJECTION APPARATUS AND FUEL INJECTION SYSTEM

CROSS-REFERENCE TO RELATED APPLICATIONS

This application is a national stage of international application No. PCT/JP2007/053650 filed Feb. 27, 2007, and claims the benefit of priority under 35 USC 119 of Japanese Patent Application No. 2006-050959, filed Feb. 27, 2006; Japanese Patent Application No. 2006-050961, filed Feb. 27, 2006; Japanese Patent Application No. 2006-123144, filed Apr. 27, 2006; Japanese Patent Application No. 2006-293008, filed Oct. 27, 2006; and Japanese Patent Application No. 2006-293578, filed Oct. 30, 2006, the entire contents of all of which are incorporated herein by reference.

TECHNICAL FIELD

The present invention relates to a method for manufacturing a ceramic member, and the ceramic member manufactured thereby. More particularly, the present invention relates to a gas sensor device used in, for example, monitoring indoor atmosphere, atmosphere in a cave or tunnel and exhaust gas, a fuel cell device used in power generation, a filter device and a multi-layer piezoelectric device to be used in a fuel injection system, micro movement drive apparatus, piezoelectric sensor device, piezoelectric circuit, etc., and methods for manufacturing the same.

BACKGROUND ART

The gas sensor device and the fuel cell device have functions to bring a gas into contact with the ceramic members that constitute these devices, so as to have particular component of the gas adsorbed onto the ceramic surface or permeate therethrough. To provide such a function, such attempts have been made as forming metal layers (electrodes) in a highly porous structure so as to increase gas permeability, or controlling the surface area covered by an electrode by forming the electrode in comb or other shape in case the electrode is dense (refer to, for example, Japanese Unexamined Patent Publication (Kokai) No. 6-317555 and Japanese Unexamined Patent Publication (Kokai) No. 6-258281).

A metal layer having a high void ratio can be manufactured by, for example, forming an electrode by printing a metal that can be sintered only at temperatures higher than the sintering temperature of ceramics, and firing the ceramics and the electrode metal at the same time.

There is also such a method as an electrode paste prepared by mixing a metal powder and a ceramic powder that cannot be sintered at the sintering temperature of the electrode metal is printed and fired. Other methods of forming a metal layer having high void ratio include firing of Pt electrode described in Japanese Unexamined Patent Publication (Kokai) No. 11-51899.

DISCLOSURE OF THE INVENTION

With the prior art method of forming the metal layer having high void ratio, there have been such cases as sintering of the electrode does not proceed sufficiently while the ceramics is sintered sufficiently during simultaneous firing. There may also be such a case as a component having low electrical conductivity existing in the metallic grain boundaries decreases the electrical conductivity that is the critical property of the electrode, with the higher resistance of the electrode resulting in a lower sensitivity of the electrical signal propagating through the electrode. This makes it necessary to increase the drive voltage, which causes the device to consume more electricity.

A method for manufacturing a typical ceramic member of the present invention comprises a step of forming a stacked compact from a plurality of metallic paste layers containing a metal component $M_1$ that are stacked one on another via ceramic green sheets, and a step of firing the stacked compact, wherein at least one of plural metallic paste layers is formed as a second metallic paste layer that has the mass percentage X higher than that of the metallic paste layer that adjoin therewith in the stacking direction and a ceramic powder is contained in the second metallic paste layer in the step of forming the stacked compact, the mass percentage X being the proportion of the metal component $M_1$ to the total metal content in the metallic paste layer.

The ceramic member according to the present invention has a three-layer structure comprising a metal layer containing the metal component $M_1$, lump containing layers that include more voids than the metal layers have and a plurality of ceramic lumps dispersed while being separated from each other by the voids, and ceramics layers sandwiched by the metal layer and the lump containing layer. The lump containing layer of the ceramic member further includes a plurality of metallic lumps that include the metal component $M_1$ and are dispersed while being separated from each other by voids.

In the method for manufacturing the typical ceramic member of the present invention, at least one of plural metallic paste layers is formed as the second metallic paste layer that has higher the mass percentage X of the metal component $M_1$ to the total metal content in the metallic paste layer than that of the metallic paste layer that adjoins therewith in the stacking direction, and the ceramic powder is contained in the second metallic paste layer.

As the stacked compact is fired with the mass percentage X of the metal component $M_1$ differentiated (concentration gradient) between the metallic paste layers that adjoin via the ceramic green sheet, it is made possible to cause the metal component $M_1$ to diffuse through the ceramic layer from a layer having higher the mass percentage X to a layer having lower the mass percentage X. As a larger amount of metal component $M_1$ diffuses out of the second metallic paste layer than that from the other metal layers during the firing process, the second metallic paste layer shrinks in volume and void ratio thereof increases. The ceramic powder contained in the second metallic paste layer coagulates to some extent and is sintered, thereby forming a plurality of ceramic lumps.

Thus the manufacturing method of the present invention makes it possible to manufacture the ceramic member having the lump containing layer that include a plurality of ceramic lumps dispersed among much voids, by firing the stacked compact having such a constitution as the mass percentage X of the metal component $M_1$ is differentiated between the first metallic paste layer and the second metallic paste layer that adjoin each other via the ceramic green sheet, and the ceramic powder is contained in the second metallic paste layer.

DESCRIPTION OF REFERENCE NUMERALS

Figure 1:
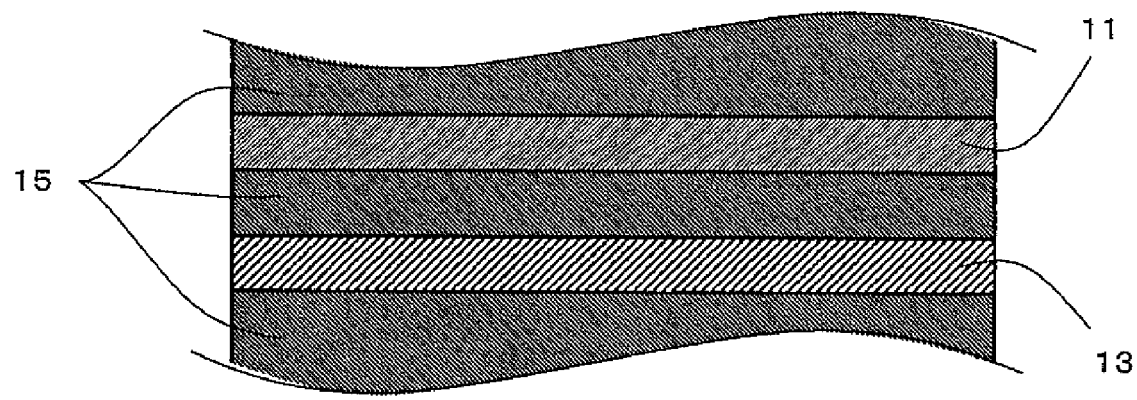
FIG. 1 is a sectional view showing a ceramic member according to one embodiment of the present invention.

11 Lump containing layer
11a Second metallic layer (high-content metallic paste layer)

13 Metal layer
13a First metallic paste layer
15 Ceramic layer
15a Ceramic green sheet
17 Ceramic member
17a Stacked compact

BEST FORM OF IMPLEMENTING THE INVENTION

The ceramic member according to one embodiment of the present invention and a method for manufacturing the same will now be described in detail. FIG. 1 is a sectional view showing the ceramic member according to this embodiment. As shown in FIG. 1, the ceramic member 17 has three-layer structure comprising metal layer 13 containing metal component $M_1$, lump containing layer 11 containing more voids than the metal layers 13 have, and the ceramic layer 15 sandwiched by the metal layer 13 and the lump containing layer 11. The lump containing layer 11 includes a plurality of ceramic lumps 3a that are disposed while being separated from each other.

Figure 2A:
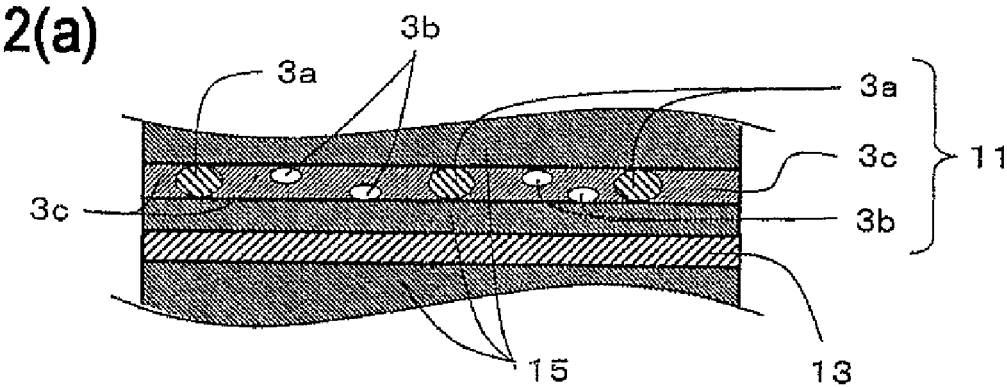
FIG. 2(a) to 2(c) are sectional views showing examples of the lump containing layer 11 in the embodiment shown in FIG. 1.
Figure 2B:
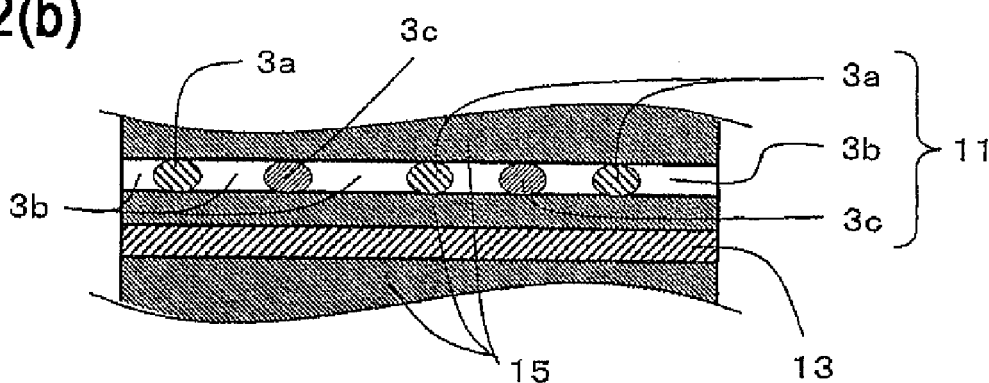
Figure 2C:
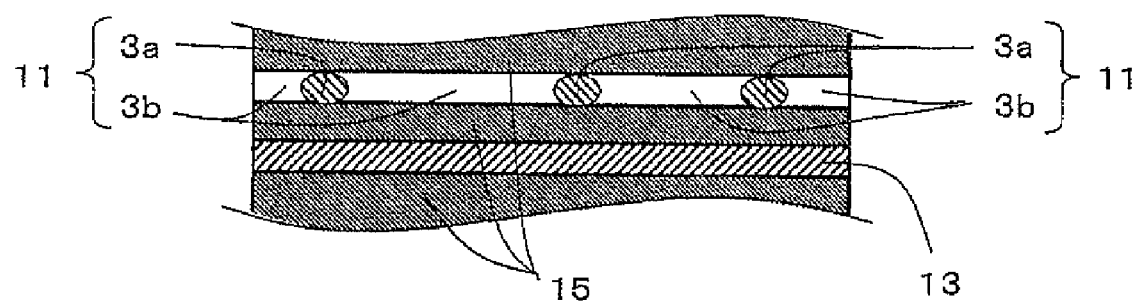

FIG. 2(a) to 2(c) are sectional views showing examples of the lump containing layer 11 of this embodiment. The lump containing layer 11 shown in FIG. 2(a) is a porous layer containing plural ceramic lumps 3a that are disposed while being separated from each other, a metal region 3c and a plurality of voids 3b. The lump containing layer 11 shown in FIG. 2(b) includes plural ceramic lumps 3a that are disposed while being separated from each other by the voids 3b and the metal region 3c that are disposed while being separated from each other by the voids 3b. The lump containing layer 11 shown in FIG. 2(c) includes plural ceramic lumps 3a that are disposed while being separated from each other by the voids 3b. The voids in the present invention are the spaces formed between the ceramic lumps 3a.

Figure 3:
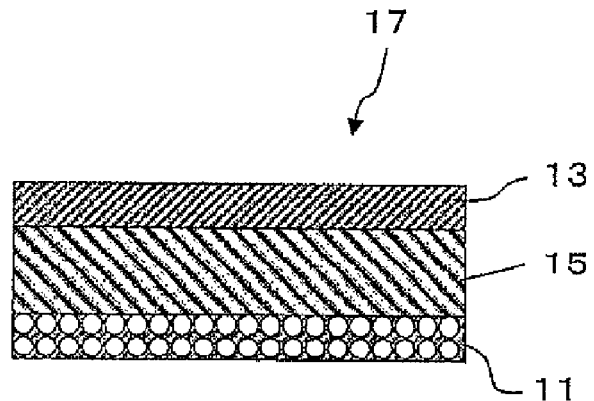
FIG. 3 is a schematic diagram showing the ceramic member shown in FIG. 2.

Embodiments of the present invention will now be described with reference to FIG. 3 that schematically shows the ceramic member 17 for the convenience of explanation. FIG. 3 is a sectional view schematically showing a section of the ceramic member 17 having the three-layer structure described above. As shown in FIG. 3, the ceramic member 17 is constituted from the metal layer 13 and the lump containing layer 11 that includes more voids than the metal layer 13 does, which are stacked one on another via the ceramic layer 15.

Figure 4A:
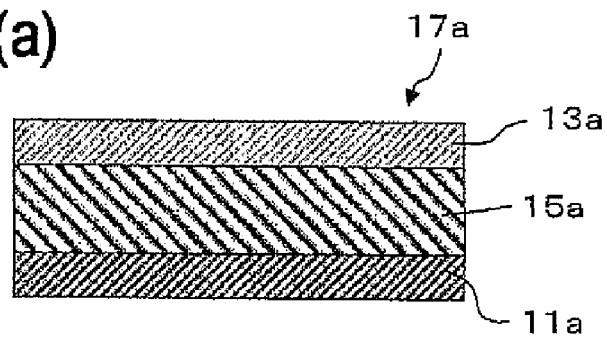
FIG. 4(a) to FIG. 4(c) are schematic diagrams showing the method of manufacturing the ceramic member according to one embodiment of the present invention.
Figure 4B:
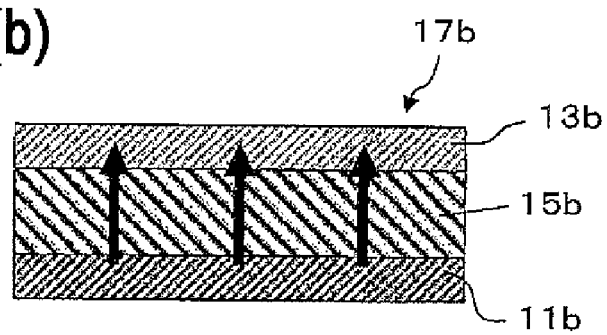
Figure 4C:
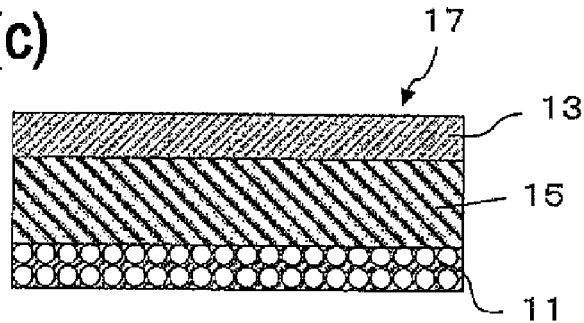

The manufacturing method according to one embodiment of the present invention for making the ceramic member 17 having the lump containing layer 11 will be described below. FIGS. 4(a) to 4(c) are schematic diagrams showing the method of manufacturing the ceramic member according to this embodiment. This manufacturing method comprises a step of forming a stacked compact 17a from metallic paste layers 11a, 13a that are stacked one on another via ceramic green sheet 15a, and a step of firing the stacked compact 17a.

As shown in FIG. 4(a), the stacked compact 17a is formed by stacking the metallic paste layer 11a and the metallic paste layer 13a on both principal surfaces of the ceramic green sheet 15a. The metallic paste layer 11a and the metallic paste layer 13a are disposed to oppose each other in the stacking direction. The metallic paste layer 11a and the metallic paste layer 13a include the metal component $M_1$ as the main component.

The second metallic paste layer 11a has the mass percentage X higher than that of the first metallic paste layer 13a that adjoins therewith in the stacking direction, the mass percentage X being the proportion of the metal component $M_1$ to the total metal content in the metallic paste layer. In the description that follows, the second metallic paste layer 11a may also be referred to as high-content metallic paste layer 11a. The second metallic paste layer 11a contains a ceramic powder.

The ceramic powder in the present invention is a powder of non-metallic inorganic material, that may have polycrystalline, single crystal or amorphous structure. For example, oxides such as alumina, lead titanate zirconate, barium titanate, sapphire, quartz, christobalite, silica glass, cordierite, titania, zirconia, lead oxide, potassium niobate, sodium potassium niobate and tungsten oxide, nitrides such as titanium nitride, zirconium nitride, aluminum nitride, silicone nitride and boron nitride, carbide such as silicon carbide, titanium carbide and tungsten carbide, oxide glass such as $SiO_2$, $SiO_2$—$(B_2O_3)$, $SiO_2$—$Al_2O_3$—$(B_2O_3)$, $SiO_2$—$MgO$—$(B_2O_3)$ and $SiO_2$—$Al_2O_3$—$MgO$—$(B_2O_3)$, oxynitteride glass such as $Al_2O_3$—$SiO_2$—$AlN$, or an inorganic material powder consisting of a mixture thereof may be used. Particularly it is preferable to use a powder of the same ceramics as the ceramics that constitutes the ceramic sheet, in order to increase the strength of bonding with the ceramic sheet and form liquid phase so as to improve the sintering performance during heat treatment.

It is preferable that the second metallic paste layer 11a contains the ceramic powder in a proportion not less than 0.01 part by mass and not more than 115 parts by mass in proportion to the total metal content of 100 parts by mass. When the ceramic powder of a The amount less than 0.01 part by mass is contained in proportion to the total metal content of 100 parts by mass, most of the ceramic powder is absorbed by the ceramic layer thus making it difficult to form the ceramic lumps. In contrast, when the ceramic powder is contained in a proportion more than 115 parts by mass in proportion to the total metal content of 100 parts by mass, sintering of the ceramic powder becomes predominant thus making it difficult for the metallic component to diffuse. When the ceramic member of the present invention is used in the multi-layer piezoelectric device, it is preferable to contain the ceramic powder in a proportion not less than 0.1 part by mass and not more than 75 parts by mass in proportion to the total metal content of 100 parts by mass, in order to achieve high stress relieving effect. In order to form plural ceramic lumps separated by the voids from each other and achieve higher stress relieving effect, it is more preferable to contain the ceramic powder in a proportion not less than 1 part by mass and not more than 50 parts by mass in proportion to the total metal content of 100 parts by mass.

The ceramic green sheet 15a is formed as follows. First, a ceramic material powder, a binder made of an organic polymer such as acrylic resin or a butyral resin and a plasticizer such as DBP (dibutyl phthalate) or DOP (dioctyl phthalate) are mixed to prepare a slurry. The slurry is formed into a sheet by a known method such as doctor blade method or calender roll process or other tape molding method, thereby to make the ceramic green sheet 15a.

The second metallic paste layer 11a and the first metallic paste layer 13a are formed as follows. First, a metal powder, an alloy powder or the like is mixed with a binder and a plasticizer to form a metallic paste. In this process, the metallic paste used to form the high-content metallic paste layer 11a is prepared so as to have higher the mass percentage X of the metal component $M_1$ than the metallic paste used to form the metallic paste layer 13a. The ceramic powder as described above is contained in the high-content metallic paste layer 11a. The amount of the ceramic powder to be added may be determined in accordance to the number and size of the ceramic lumps to be dispersed in the lump containing layer of the ceramic member after being fired.

Then the metallic pastes prepared as described above are applied onto both principal surfaces of the ceramic green sheet 15a by screen printing technique or the like, to form the high-content metallic paste layer 11a and the metallic paste layer 13a which are then dried. The stacked compact 17a thus formed may be cut into a desired shape as required. The thicknesses of the high-content metallic paste layer 11a and the metallic paste layer 13a are controlled in a range, for example, from 1 to 40 μm.

Two ceramic green sheets are prepared, with the high-content metallic paste layer 11a formed on the principal surface of one sheet and the metallic paste layer 13a formed on the principal surface of another sheet. Then the stacked compact 17a can be made also by placing the two ceramic green sheets one on another so that the principal surfaces thereof where the metallic paste layer is not formed face each other.

After heating the stacked compact 17a made as described above to a predetermined temperature to remove the binder, the stacked compact 17a is fired at a temperature from about 800 to 1,500° C. FIG. 4(b) shows the stacked compact 17b during firing, and FIG. 4(c) shows the ceramic member 17 after firing. As the stacked compact 17a is fired with the mass percentage X of the metal component $M_1$ differentiated (concentration gradient) between the metallic paste layers 11a, 13a that adjoin each other via the ceramic green sheet 15a as described above, it is made possible to cause the metal component $M_1$ to diffuse through the ceramic layer from a layer having higher the mass percentage X to a layer having lower the mass percentage X. During this process, the ceramic powder remains on the ceramic layer without diffusing.

Thus the lump containing layer containing a plurality of ceramic lumps 3a dispersed among much voids can be formed at a desired position. Moreover, since the ceramic member allows the sintering of the metallic layer to proceed sufficiently without using the acrylic resin unlike the prior art, there remain extremely small amount of impurities such as resin in the metallic layer.

Such diffusion of the metal component $M_1$ is supposed to occur for the following reason. As the stacked compact is fired with the mass percentage X of the metal component $M_1$ differentiated (concentration gradient) between the metallic paste layer that adjoin via the ceramic green sheet, the difference in concentration of the metal component $M_1$ becomes the driving force according to the Fick's law to cause the metal component $M_1$ to diffuse from the high-content metallic paste layer to the adjacent metallic paste layer.

The high-content metallic paste layer 11a has at least one of an alloy powder containing the metal component $M_1$ and a metal powder consisting of the metal component $M_1$, added therein. The metallic paste layer 13a that adjoins the high-content metallic paste layer 11a in the stacking direction has at least one of the alloy powder containing the metal component $M_1$ and the metal component $M_2$ and a mixed powder containing the metal powder consisting of the metal component $M_1$ and the metal powder consisting of the metal component $M_2$, added therein. Hereafter the metal powder, the alloy powder and the mixed powder will be collectively referred to as "metal powder and the like".

It is preferable to use such a combination of the metal component $M_1$ and the metal component $M_2$ that causes an alloy to be formed from these metal components. It is more preferable to use such a combination as these metal components do not easily form an inter-metal compound. It is further more preferable to use such a combination as these metal components react totally to form solid solution.

Specifically, it is preferable according to the present invention that the metal component $M_1$ is a Group 11 element of the Periodic Table and the metal component $M_2$ is a Group 10 element. Since an alloy of a Group 11 element and a Group 10 element reacts totally to form solid solution, an alloy consisting of the component elements in any proportions can be formed, and stable diffusion of the metal components is made possible. Also the alloy has melting point higher than the sintering temperature of the ceramics, which makes it to fire even in an oxidizing atmosphere. Among various alloys, it is preferable to use a silver-platinum alloy or a silver-palladium alloy that can be fired simultaneously with ceramics.

It is particularly preferable that the metal component $M_1$ is silver and the metal component $M_2$ is palladium. This is because silver oxide that is generated when silver is heated can form liquid phase of ceramics at a low temperature. Thus sintering of the ceramics can be caused to proceed by including silver. In addition to the fact that silver and palladium react totally to form solid solution, liquidus and solidus thereof are proximate to each other, so that they can easily form solid solution with each other. Therefore when the silver component diffuses from the lump containing layer 11b that has higher silver concentration into the metallic layer 13b via the liquidus, both elements selectively attract each other so as to form an alloy with various compositions. As a result, silver that has lower melting point that palladium diffuses earlier than palladium, and the diffusion proceeds in a shorter period of time (refer to FIG. 4(b)).

The mass percentage X ((metal component $M_1$/total metal content)×100) in the high-content metallic paste layer 11a is preferably in a range of $85 \leq X \leq 100$ so as to stabilize the electrical characteristics of the ceramic member. When the mass percentage X is less than 85, resistivity of the metal layer having high void ratio becomes higher, and it may become difficult for the metal layer to dissipate heat when electric current is supplied through the ceramic member.

In order to suppress ion migration of Group 11 element contained in the metal layer into the ceramic layer, the mass percentage X is more preferably in a range of $85 \leq X \leq 99.999$, and further more preferably in a range of $90 \leq X \leq 99.9$ so as to improve durability of the ceramic member. In order to achieve higher durability, the mass percentage X is more preferably in a range of $90.5 \leq X \leq 99.5$, and further more preferably in a range of $92 \leq X \leq 98$ so as to improve the durability further.

The mass percentage X in the metallic paste layer 13a is preferably in a range of $85 \leq X < 100$ so as to stabilize the electrical characteristics of the ceramic member. In order to suppress ion migration of Group 11 element contained in the metal layer into the ceramic layer, the mass percentage X is more preferably in a range of $85 \leq X \leq 99.999$.

The mass percentage X is more preferably in a range of $90 \leq X \leq 99.9$ so as to improve durability of the ceramic member. In order to achieve higher durability, the mass percentage X is more preferably in a range of $90.5 \leq X \leq 99.5$, and further more preferably in a range of $92 \leq X \leq 98$ so as to improve the durability further.

The mass percentage X in the high-content metallic paste layer 11a may be set higher than that in the metallic paste layer 13a that adjoins therewith in the stacking direction. There is no restriction on the difference in mass percentage between these layers (mass percentage XH in high-content metallic paste layer 11a minus the mass percentage XL in metallic paste layer 13a).

In a case where the metal component $M_1$ is silver and the metal component $M_2$ is palladium or platinum, the difference in the mass percentage is preferably set as follows. In order to promote diffusion of the metal component $M_1$, the difference in mass percentage is preferably 0.1 or larger. On the other hand, the difference in mass percentage is preferably not larger than 30, in order to suppress the metal component $M_1$ from excessively diffusing into the metallic paste layer 13a and causing adjacent ceramic layers from joining with each other. Thus the difference in mass percentage is preferably in a range from 0.1 to 30.

When the metal component $M_1$ is slow to diffuse, much metal component $M_1$ may remain in the ceramics at the time when sintering of ceramics completes in the ceramic green sheet 15a that is adjacent to the high-content metallic paste layer 11a. In order to suppress the metal component $M_1$ from remaining in the ceramics, the difference in mass percentage may be increased so that the metal component $M_1$ diffuses faster. In order to increase the diffusion rate of the metal component $M_1$, the difference in mass percentage is preferably 1 or larger.

When the mass percentage is different between the high-content metallic paste layer 11a and the metallic paste layer 13a, as mentioned previously, silver diffuses in such a direction as the concentration gradient between the paste layers decreases. When the difference in mass percentage increases to some extent, palladium is caused to diffuse from the metallic paste layer 13a into the high-content metallic paste layer 11a in addition to the diffusion of silver from the high-content metallic paste layer 11a into the metallic paste layer 13a. In order to accelerate the mutual diffusion, the difference in mass percentage is preferably 2 or larger.

When the rate of diffusion of the metal component $M_1$ becomes faster, sintering of the metallic layer tends to complete earlier, and the metallic layer may be sintered at a temperature lower than the sintering temperature of the ceramic layer. When the liquid phase generated from the metallic layer during firing decreases, the density of sintered ceramics tends to become lower. Therefore, in order to control the rate of diffusion of the metal component $M_1$ so as to increase the density of sintered ceramics, the difference in mass percentage is more preferably not larger than 10. Thus the difference in mass percentage is preferably in a range from 1 to 10, and more preferably from 2 to 10.

In order to achieve both the stress relieving effect and the insulating effect, the difference in mass percentage is particularly preferably in a range from 3 to 5. When the difference in mass percentage is in a range from 3 to 5, silver diffuses to a favorable extent and the lump containing layer 11 of such a constitution is obtained after firing that consists of a plurality of metallic lumps separated from each other by voids. The metallic lumps are dispersed between the ceramic layers while being electrically isolated from each other. As a result, the lump containing layer 11 becomes a layer of high insulation that does not function as an electrode. Moreover, since a plurality of metallic lumps with proper size and proper The amount are dispersed between the ceramic layers, the ceramic layers on both sides can be prevented from joining together during firing.

As described above, the lump containing layer 11 containing plural metallic lumps dispersed therein achieves the stress relieving function extremely well during operation of the device, when used as the multi-layer piezoelectric device. The lump containing layer 11 has lower rigidity than the other portions of the device, and therefore stress tends to concentrate in the lump containing layer 11 during operation. In particular, the stress tends to concentrate particularly around the interface between plural metallic lumps and piezoelectric layer. It is supposed that stress is relieved as the piezoelectric layer in the interface undergoes localized deformation.

Now let the mass percentage of the metal component $M_2$ in the total metal content in the metallic paste layer be Z. In case the metal component $M_2$ is an element of Group 8 to 10 of the Periodic Table, resistivity of the metallic layer can be suppressed from increasing by controlling the mass percentage Z ((metal component $M_2$/total metal content)×100) within 15. This enables it to suppress heat generation from the metallic layer when electric current is supplied to the ceramic member. As a result, the ceramic layer that has temperature dependency is suppressed from changing the electrical characteristics thereof under the influence of heat, so as to suppress device characteristics from varying during operation in sensor, fuel cell, filter device, multi-layer piezoelectric device and the like.

In case the metallic layer is constituted only from Group 11 element, ion migration tends to occur when used in high humidity over a long period of time, and therefore mass percentage Z is preferably in a range of $0.001 \leq Z \leq 15$.

In order to improve the durability of the ceramic member, mass percentage Z is preferably in a range of $0.1 \leq Z \leq 10$. When high heat conductivity and higher durability are required, mass percentage Z is more preferably in a range of $0.5 \leq Z \leq 9.5$, and is furthermore preferably in a range of $2 \leq Z \leq 8$ if further higher durability is required. Contents (mass) of the metal components $M_1$ and $M_2$ in the metallic layer may be determined, for example, by electron probe micro analysis (EPMA).

When firing is continued long enough to bring diffusion into equivalence, palladium is also enabled to diffuse so that composition of the lump containing layer 11 and composition of the metallic layer 13 become proximate to each other. In the ceramic member that has been fired until composition of the lump containing layer 11 and composition of the metallic layer 13 become proximate to each other, ion migration of the metal component is suppressed from occurring even when operated at a high temperature, and the electrodes function with stable performance.

Silver has a tendency to be bound with palladium. The oxide (silver oxide) is generated when silver is heated at a temperature fairly lower than the melting point of silver, and can form liquid phase together with the component of ceramics. Thus diffusion can be made more likely to occur at a low temperature by adding a silver powder to the high-content metallic paste layer 11a and a silver-palladium alloy powder to the metallic paste layer 13a, which also makes it possible to selectively cause silver to diffuse.

Molten silver has low wettability with the ceramic layer, and therefore molten silver droplets tend to aggregate. Therefore, a silver or silver-palladium alloy that has decreased in volume through diffusion does not spread in the form of thin film over the surface of the ceramic layer. Instead, metal components containing the aggregated silver is scattered, and therefore metallic lumps formed as the metal component aggregates to certain sizes tend to be scattered on the ceramic layer (or between two ceramic layers). Thus the metallic layer having high void ratio can be formed.

It is preferable that the high-content metallic paste layer 11a includes silver and platinum and the metallic paste layer 13a includes palladium and platinum. When fired, silver reacts selectively with palladium to form an alloy. Presence of platinum that has slower diffusion rate than palladium at the same temperature causes a part of silver to form an alloy with platinum. As a result, silver can be prevented from excessively diffusing even when fired in such a manner as a sharp temperature gradient is generated in the stacked compact 17a or the temperature rises quickly. Thus the metallic layer can be prevented from completely disappearing due to the diffusion of entire silver and palladium include in the metallic paste. This makes it possible to greatly expand the permissible ranges of firing conditions that allow diffusion to occur and, at the same time, prevent the metal layer from disappearing. It is particularly preferable to mix platinum in both the metallic paste layer 11a and the metallic paste layer 13a.

A case where the metal component $M_1$ is silver (Ag) and the metal component $M_2$ is palladium (Pd) will be taken in the detailed description that follows. The high-content metallic paste layer ha has at least one of an alloy powder containing Ag in such forms as an Ag—Pd alloy or Ag—Pt alloy and a metal powder made of Ag. The metallic paste layer 13a has at least one of an alloy powder containing Ag and Pd such as an Ag—Pd alloy or and a mixed powder containing an Ag powder and a Pd powder.

The Pd powder has higher tendency to be oxidized at a low temperature than Pd contained in an Af-Pd alloy. Thus use of the Pd powder may cause the metal layer to increase in volume due to oxidization during firing, in comparison to a case where an Ag—Pd alloy is used in preparation of the metallic paste. Therefore, in case the metal component $M_2$ is palladium, it is preferable to use Ag—Pd alloy when preparing the metallic paste. It is particularly preferable to use a mixed powder of an Ag powder and an Ag—Pd alloy powder, that achieves the fastest and stable diffusion because Ag that has low melting point begins to diffuse earlier so as to increase the Ag concentration in the Ag—Pd alloy and induces the diffusion.

The ceramic green sheet 15a that is not yet fired consists of a powder of the ceramic material of which particles are bound by the binder. In a stage during sintering shown in FIG. 4(b), the binder is evaporated by heating to leave tiny voids between the ceramic particles. As the firing temperature rises further, the ceramic particles begin to sinter with each other and the metal powder contained in the metallic paste layer that has been printed also begins to sinter.

Then liquid phase is formed between the ceramic particles and between the metal particles, while the rate of diffusion among the particles increases so as to proceed the sintering process. In this process, presence of the tiny voids between the ceramic particles and presence of the liquid phase between the ceramic particles and between the metal particles make mutual diffusion possible for the metallic components through the ceramic layer 15b between the lump containing layer 11b and the metal layer 13b in the course of sintering.

In this embodiment, the mass percentage X of the lump containing layer 11b is set to be higher than the mass percentage of the metal layer 13b. By making the metal layers to include the same metal with different mass percentages, it is supposed that silver contained in the lump containing layer 11b is caused to diffuse through the ceramic layer 15b into the metal layer 13b during the sintering process.

As the firing temperature rises further, voids between the ceramic particles diminish or disappear, so that diffusion of silver through the ceramic layer 15 completes as shown in FIG. 4(c). As sintering of the ceramic particles completes, sintering of the lump containing layer 11 and the metal layer 13 also completes.

In the lump containing layer 11, a silver or silver-palladium alloy aggregates due to high fluidity in the state of liquid phase in the course of sintering, in addition to the decrease in volume-due to the diffusion of silver into the metal layer 13. As a result, the lump containing layer 11 is formed in such a constitution as, rather than the metal component evenly covering the surface of the ceramic layer 15, porous structure with a plurality of separate bubbles are included inside and a plurality of ceramic lumps are disposed therein (FIG. 2(a)), a plurality of ceramic lumps separated from each other by voids and a plurality of metallic lumps separated from each other by voids form the structure (FIG. 2(b)), or a structure consisting of a plurality of ceramic lumps separated from each other by voids (FIG. 2(c)).

The metal layer 13, on the other hand, has relatively high density since silver diffuses from the lump containing layer 11 thereto. It is preferable to add a sintering assisting agent to the ceramic green sheet 15a and the metallic paste, so as to make liquid phase easier to form during the sintering process.

Among the forms shown in FIG. 2(a) to FIG. 2(c), the forms shown in FIG. 2(a) and FIG. 2(b) where the lump containing layer 11 includes metal components (metallic region 3c or metallic lumps 3c) satisfy the following conditions: mass percentage Y of the metal component $M_1$ in proportion to the total metal content included in the metal layer 13 or the lump containing layer 11 is set higher in the lump containing layer 11 than in the metal layer 13 that adjoins therewith in the stacking direction.

When the ceramic member is placed for use in an environment subjected to high temperature, migration may occur when there is a difference in concentration between the metal layer 13 and the lump containing layer 11. When mass percentage Y in the lump containing layer 11 is higher than in the metal layer 13, the metal component $M_1$ can be suppressed from moving from the metal layer 13 toward the lump containing layer 11. As a result, high void ratio in the lump containing layer 11 can be maintained. Thus sensor function and stress relieving function that are achieved by high void ratio are maintained so as to make the ceramic member having high durability.

Figure 5:
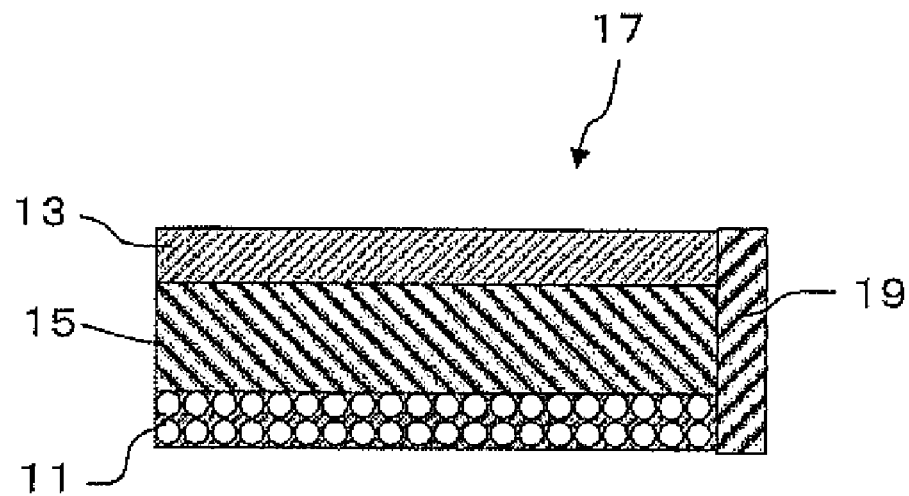
FIG. 5 is a sectional view showing a ceramic member having external electrodes formed on the side faces thereof.

FIG. 5 is a sectional view of the ceramic member having external electrode 19 formed on the side face thereof. The external electrode may be formed, for example, as follows. A metallic paste is prepared by mixing the metal powder, a binder, a plasticizer and the like. The metallic paste is printed at a predetermined position, dried and fired. The metallic paste may be printed on the surface of the ceramic member as it is, although it is preferable to make the surface smooth by grinding or the like before printing thereon. Other portions will be identified by the same reference numerals as those of FIG. 3, and description thereof will be omitted.

In this embodiment, the expression that "there are many voids" means that the voids occupy a large portion of the sectional area of the metal layer. Void ratio can be compared between the lump containing layer 11 and the metal layer 13 that adjoins therewith, as follows. A section of the lump containing layer 11 and a section of the metal layer 13 (a section parallel to the stacking direction, or a section perpendicular to the stacking direction) are observed under a scanning electron microscope (SEM), metallurgical microscope, optical microscope or the like to obtain images of the sections and the images are compared. When an apparent difference in the number of voids can be seen in the images of the sections between the lump containing layer 11 and the metal layer 13, comparison may be made by observation with naked eyes. When difference in the number of voids cannot be recognized between the lump containing layer 11 and the metal layer 13, comparison may be made by measuring the void ratio by the method described below.

Void ratio in the metal layer (or the lump containing layer) of the ceramic member can be measured as follows. First, the ceramic member is polished along the stacking direction by a known polishing machine so as to reveal a section the metal layer or the lump containing layer (a section parallel to the stacking direction, or a section perpendicular to the stacking direction). Polishing operation may be done, for example, by using a desktop polishing machine KEMET-V-300 manufactured by KEMET Japan Inc. and a diamond paste.

Void ratio may be measured by observing the section exposed by this polishing operation, under a scanning electron microscope (SEM), metallurgical microscope, optical microscope or the like and processing an image of the section taken in this observation. Power of magnification of the SEM or the like in this observation is preferably about 1,000 to 10,000.

When a section of the metal layer or the lump containing layer is to be observed, it is preferable to polish the metal layer (or the lump containing layer) to a depth of about one half of the thickness thereof, and observe the section exposed thereby. In case the metal layer (or the lump containing layer) is thin and has significantly varying thickness, it may be impossible to expose the entire section of the metal layer by polishing. In such a case, the metal layer or the lump containing layer may be polished to expose a part thereof with an image of that part taken, and may be polished further to expose other part, with this operation repeated several times. The images obtained by these repetitive polishing and observing operations may be combined so as to obtain the overall sectional view of the metal layer (or the lump containing layer).

The image processing may be carried out as follows. For example, on an image of the section obtained by using an optical microscope, the portions representing the voids are painted in black and the rest is painted in white, then the void ratio can be calculated as (Area of black portions)/(Area of black portions+area of white portions) in percentage.

Figure 6:
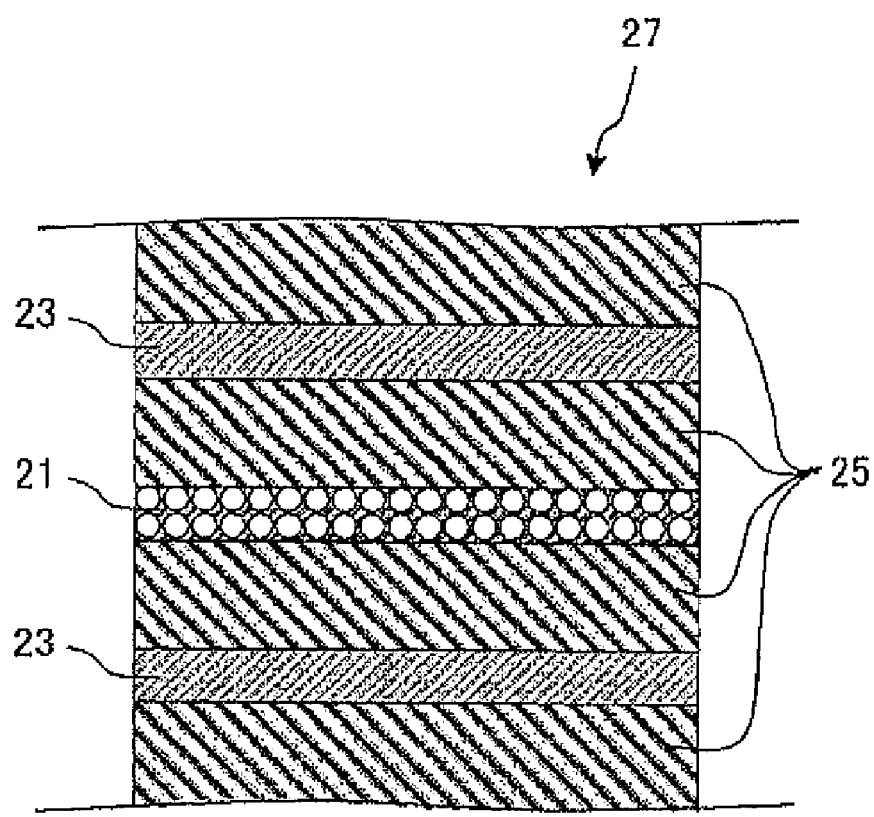
FIG. 6 is a sectional view showing a ceramic member according to another embodiment of the present invention.

The image data may also be input to a computer, so as to determine the void ratio by means of image processing software. In case the image of the section is a colored picture, the image may be converted to gray scale and divided into black portions and white portions. If it is required to set a threshold that separates two tones of black and white, the threshold may be set by means of image processing software or by visual inspection FIG. 6 is a sectional view of a ceramic member 27 according to another embodiment of the present invention. As shown in FIG. 6, the ceramic member 27 is constituted from lump containing layer 21 and metal layer 23 that are stacked one on another via a ceramic layer 25.

In the case of the forms shown in FIG. 2(a) and FIG. 2(b) where the lump containing layer 11 includes metal components, it is preferable that mass percentage Y of the metal component $M_1$ in proportion to the total metal content included in the metal layer is higher in the lump containing layer 21 than in the metal layers 23, 23 that adjoin therewith in the stacking direction.

The ceramic member 27 includes two three-layer structures where the metal layer 23 (first metal layer 23) containing the metal component $M_1$ and the lump containing layer 21 (second metal layer 21) that has more voids than the metal layer 23 sandwich the ceramic layer 25. The ceramic member 27 also has five-layer structure comprising two three-layer structures that share the lump containing layer 21 (second metal layer 21).

Figure 7A:
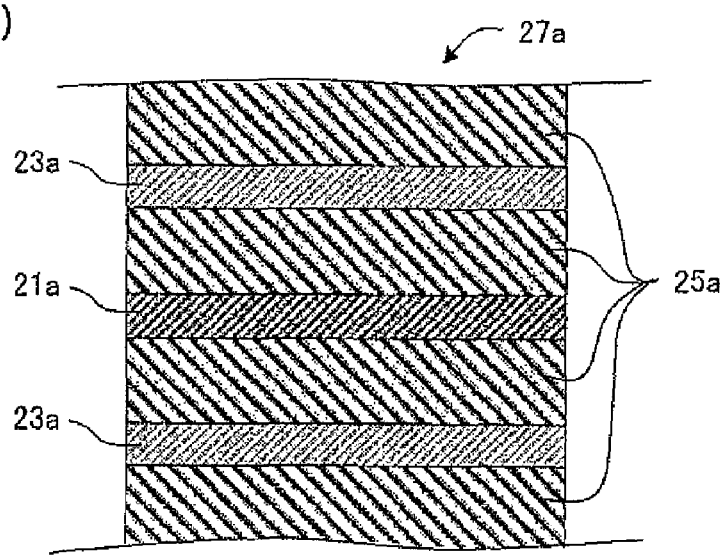
FIG. 7(a) to FIG. 7(c) are schematic diagrams showing the method of manufacturing the ceramic member according to the embodiment shown in FIG. 6.
Figure 7B:
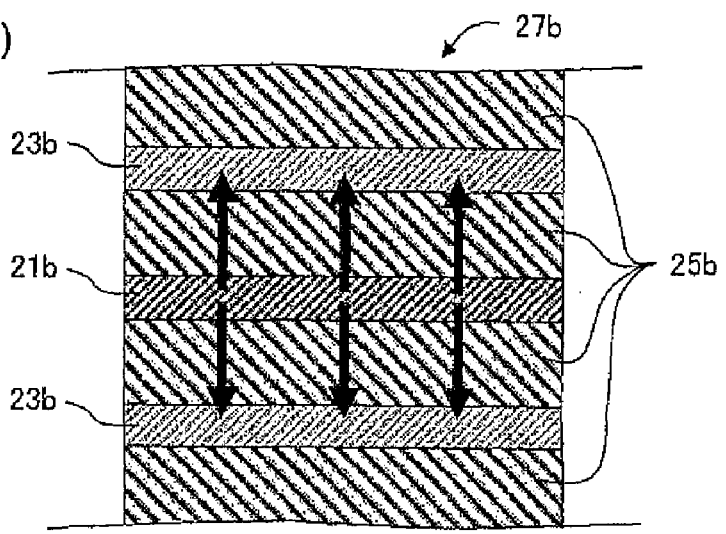
Figure 7C:
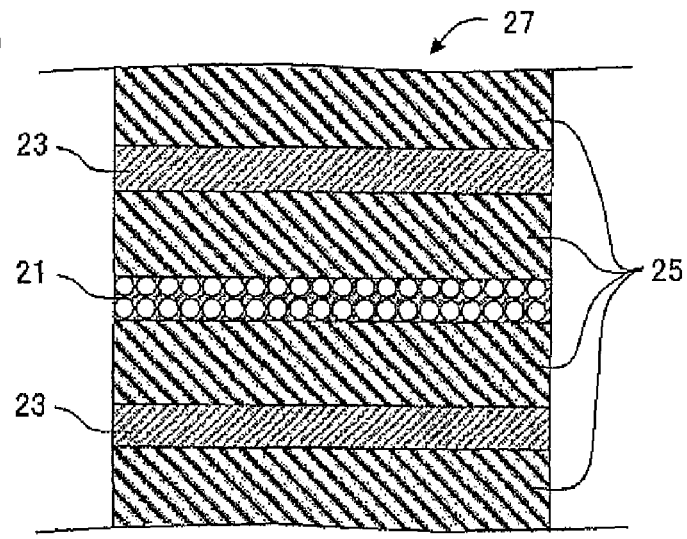

A method according to the present invention for manufacturing the ceramic member 27 that has the lump containing layer 21 will be describes below. FIG. 7(a) to FIG. 7(c) are schematic diagrams showing the method of manufacturing the ceramic member according to this embodiment. This manufacturing method comprises a step of forming a stacked compact 27a from metallic paste layers 21a/23a that are stacked one on another via the ceramic green sheet 25a, and a step of firing the stacked compact 27a.

Two ceramic green sheet and the metallic paste are prepared similarly as described previously. The metallic paste layer 21a or 23a is formed on one of the principal surfaces of plural ceramic green sheets 25a by screen printing method or the like, and the ceramic green sheets 25a are stacked one on another so that the metallic paste layer 23a are disposed on both sides of the metallic paste layer 21a in the stacking direction, thereby forming the stacked compact 27a (FIG. 7(a)).

The metallic paste layer 21a and the metallic paste layer 23a contain the metal component $M_1$ as the main component. The metallic paste layer 21a is prepared to have higher the mass percentage X than that of the metallic paste layers 23a, 23a that are disposed on both sides of the metallic paste layer 21a in the stacking direction. Hereafter the metallic paste layer 21a will be called the high-content metallic paste layer 21a.

This embodiment is different from the basic structure described previously in that the metallic paste layer 23a are disposed on both sides of the high-content metallic paste layer 21a in the stacking direction. In case the metallic paste layer 23a are disposed on both sides of the metallic paste layer 23a, the metal component $M_1$ contained in the high-content metallic paste layer 21a diffuses into the metallic paste layers 23a that are disposed on both sides thereof by firing the stacked compact 27a.

The stacked compact 27a shown in FIG. 7(a) is turned into the ceramic member 27 shown in FIG. 7(c) to a stage during sintering shown in FIG. 7(b). The metal layers 23, 23 have relatively high density as the metal component diffuses from the lump containing layer 21 thereto.

Figure 8:
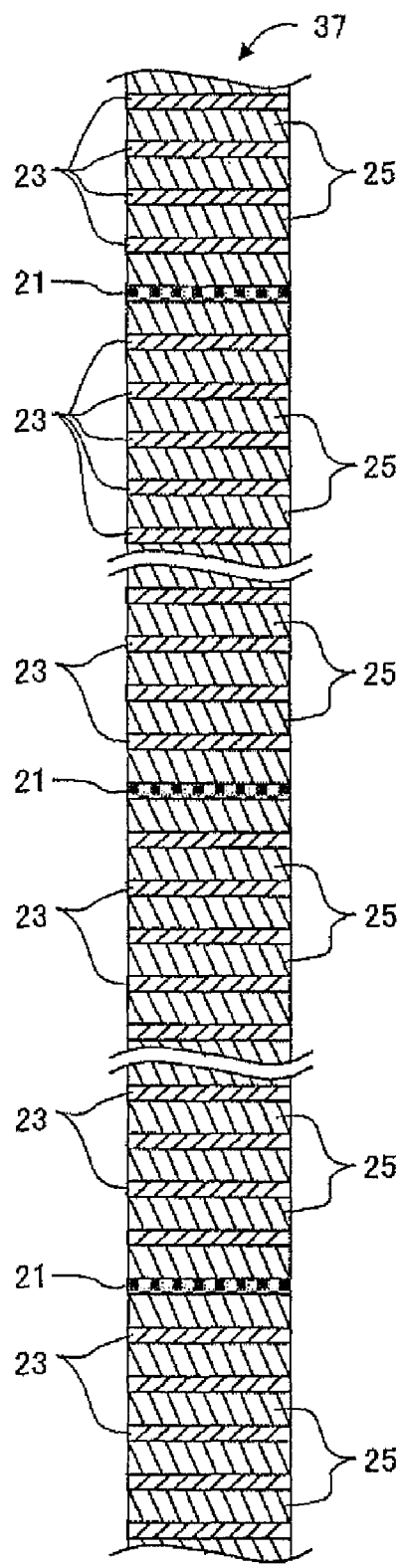
FIG. 8 is a sectional view showing a ceramic member according to further another embodiment of the present invention.

FIG. 8 is a sectional view showing a ceramic member according to further another embodiment of the present invention. As shown in FIG. 8, the ceramic member 37 constituted by stacking the lump containing layer 21 and the metal layer 23 one on another via the ceramic layer 25. In this ceramic member 37, a plurality of lump containing layers 21 are disposed in the stacking direction. These lump containing layers 21 are disposed with a plurality of the metal layers 23 interposed therebetween. The lump containing layers 21 are disposed regularly (at predetermined intervals) in the stacking direction. Specifically, a predetermined number of metal layers 23 are disposed between the lump containing layers 21.

A method according to the present invention for manufacturing the ceramic member 37 that has the above-mentioned plurality of lump containing layers 21 will be describe below. The ceramic green sheet 25a, the metallic paste layer 23a and the high-content metallic paste layer 21a are prepared similarly as described previously. The metallic paste layer 23a or the high-content metallic paste layer 21a is formed on the principal surface of the ceramic green sheets 25a by printing.

The ceramic green sheets 25a are stacked one on another so that the high-content metallic paste layer 21a sandwich a plurality of metallic paste layers 23a, and the high-content metallic paste layers 21a are disposed regularly in the stacking direction. This stacked compact is fired to obtain the ceramic member 37.

Figure 9:
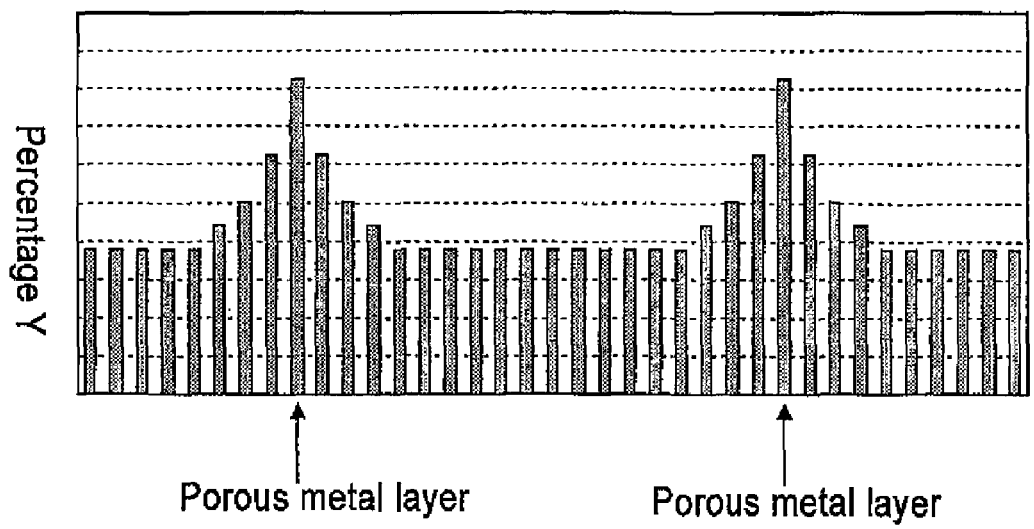
FIG. 9 is a graph schematically showing the characteristics of the embodiment shown in FIG. 8.

The ceramic member 37 having the characteristics shown in FIG. 9 is obtained by controlling the firing conditions and adjusting the amount of metal component $M_1$ that diffuses from the high-content metallic paste layer 21a into the metallic paste layer 23a. In the ceramic member 37 having the characteristics shown in FIG. 9, mass percentage Y peaks in the lump containing layer 21 and gradually decreases from the lump containing layer 21 over at least two metal layers 23 toward both ends in the stacking direction (in the cases shown in FIG. 2(a), 2(b) where the lump containing layer 11 includes the metal component). The mass percentage Y shows the profile shown in FIG. 9, for the following reason.

The lump containing layer 21b is formed so as to have the mass percentage X higher than the mass percentage in the metal layer 23b, as mentioned previously. As the mass percentage of the same metal is differentiated among the metal layers 23b, the metal component of the lump containing layer 21b diffuses through the ceramic layer 25b depending on the mass percentage of the metal component. Since this metal layer 23b has higher mass percentage Y of the metal component $M_1$ than that of the metal layer 23b that adjoins this metal layer 23b, gradient of concentration is generated also between these metal layers 23b, 23b.

As a result, the gradient of concentration drives the metal component to diffuse from the metal layer 23b to the other metal layer 23b. This diffusion proceeds from the lump containing layer 21b over two or more metal layers 23b toward both ends in the stacking direction. Thus the ceramic member 37 having such a structure as the mass percentage Y peaks in the lump containing layer 21 and gradually decreases from the lump containing layer 21 over at least two metal layers 23 toward both ends in the stacking direction can be obtained. As the firing time is elongated, the difference in mass percentage Y among the metal layers decreases, eventually becoming zero.

The ceramic member 37 having such a structure has an advantage of high strength to endure thermal shock since concentration of the metal component decreases gradually without abrupt change. This is due to the fact that the metal has higher heat conductivity than the ceramics, and that heat conductivity changes with the composition of the metal component. That is, as concentration of the metal component decreases gradually without abrupt change heat conductivity in the ceramic member can be suppressed from changing.

Figure 10:
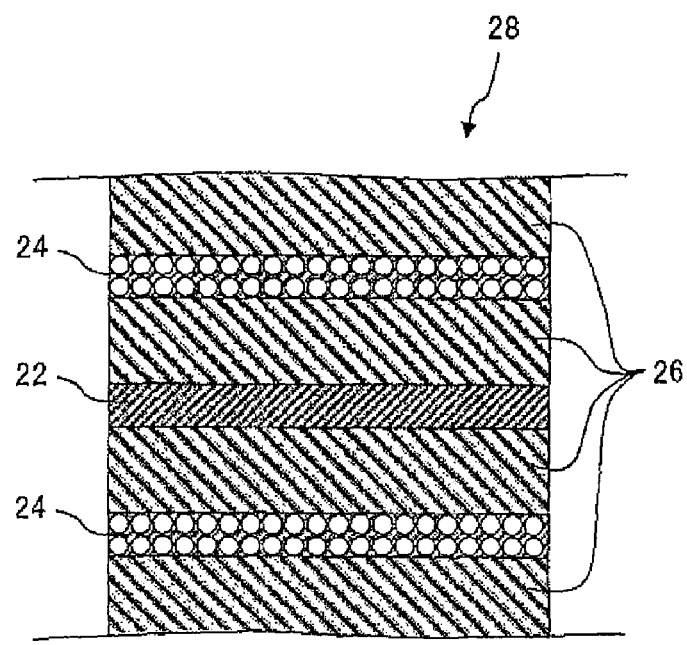
FIG. 10 is a sectional view showing a ceramic member according to further another embodiment of the present invention.

FIG. 10 is a sectional view showing a ceramic member according to further another embodiment of the present invention. As shown in FIG. 10, the ceramic member 28 is constituted by stacking metal layers 22 and lump containing layer 24 one on another via a ceramic layer 26.

In the case of the forms shown in FIG. 2(a) and FIG. 2(b) where the lump containing layer 11 includes metal components, it is preferable that mass percentage Y of the metal layers 24 that sandwich the metal layer 22 is lower than that of the metal layer 22, and has higher void ratio.

The ceramic member 28 includes two three-layer structures where the metal layer 22 (first metal layer 22) containing the metal component $M_1$ and the lump containing layer 24 (second metal layer 24) that has more voids than the metal layer 22 sandwich the ceramic layer 26. The ceramic member 28 also has five-layer structure comprising two three-layer structures that share the metal layer 22 (first metal layer 22).

Figure 11A:
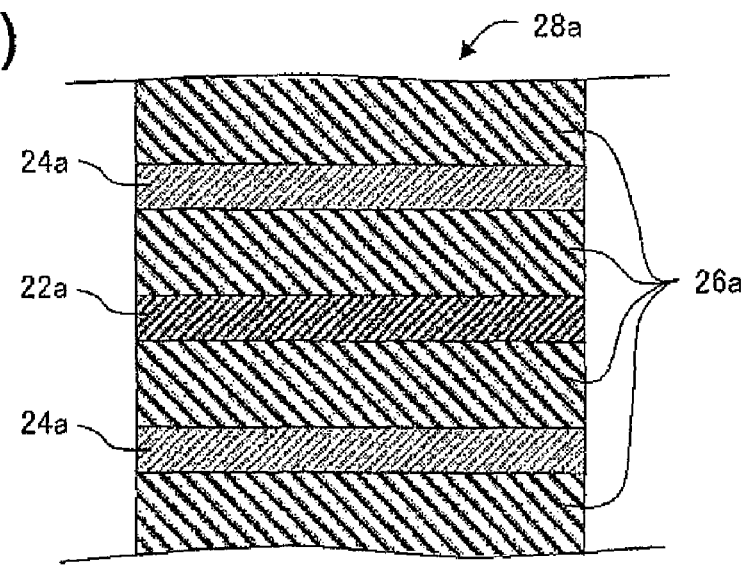
FIG. 11(a) to FIG. 11(c) are schematic diagrams showing a method of manufacturing the ceramic member according to the embodiment shown in FIG. 10.
Figure 11B:
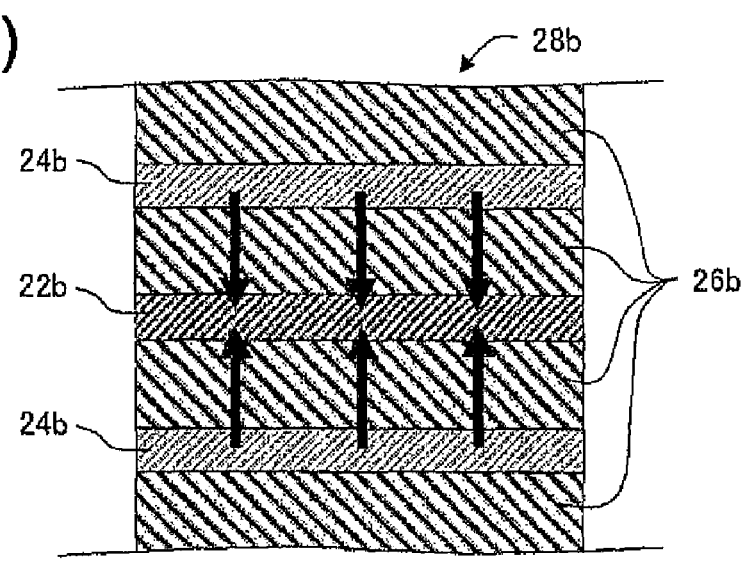
Figure 11C:
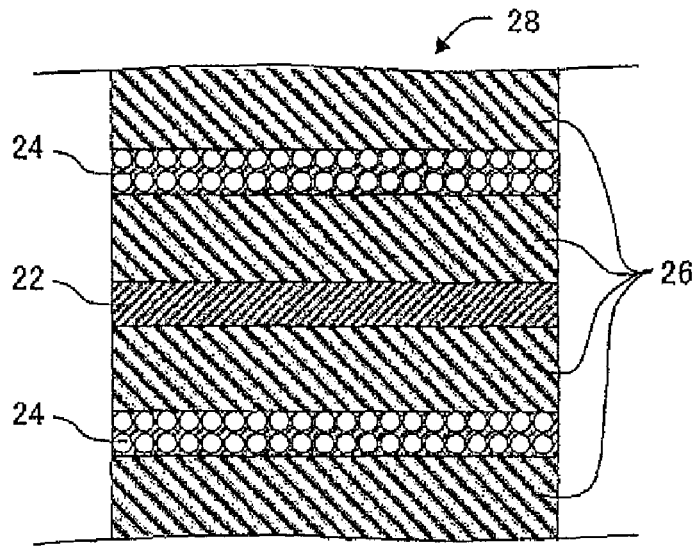

A method according to the present invention for manufacturing the ceramic member 28 that has the lump containing layer 24 will be describe below. FIG. 11(a) to FIG. 11(c) are schematic diagrams showing the method of manufacturing the ceramic member according to the embodiment shown in FIG. 10. This manufacturing method comprises a step of forming a stacked compact 28a from metallic paste layers 22a, 24a that are stacked one on another via ceramic green sheet 26a, and a step of firing the stacked compact 28a.

The ceramic green sheet and the metallic paste are prepared similarly as described previously. First, a plurality of the ceramic green sheets 26a are formed, and the metallic paste layer 22a or 24a is formed on one principal surface of each ceramic green sheet 26a by screen printing method or the like, and the ceramic green sheets are stacked one on another so that the metallic paste layers 24a are disposed on both sides of the metallic paste layer 22a in the stacking direction, thereby forming the stacked compact 28a (FIG. 11(a)).

The metallic paste layer 22a and the metallic paste layer 24a include the metal component $M_1$ as the main component. The metallic paste layer 22a is prepared to have lower the mass percentage X than that of the metallic paste layer 24a, 24a disposed on both sides of the metallic paste layer 22a in the stacking direction. Hereafter the metallic paste layer 22a will be called the low-content metallic paste layer 22a.

This embodiment is different from the basic structure described previously in that the metallic paste layers 24a are disposed on both sides of the low-content metallic paste layer 22a. In case the metallic paste layers 24a are disposed on both sides of the metallic paste layer 22a, the metal component $M_1$ contained in the metallic paste layers 24a that are disposed on both sides diffuses into the low-content metallic paste layer 22a when the stacked compact 28a is fired.

In this embodiment, the metal layer 22b sandwiched by the lump containing layers 24b is formed so as to have the mass percentage X that is lower than the mass percentage in the metal layers 24b, 24b. As the mass percentage of the same metal is differentiated among the metal layers, the metal component of the lump containing layers 24b disposed on both sides diffuses through the ceramic layer 26b that is in the course of sintering from both sides of the metal layer 22b depending on the mass percentage of the metal component (FIG. 11(b)). Thus the ceramic member 28 as shown in FIG. 11(c) is obtained (FIG. 11(c)). The metal layers 22 have relatively high density as the metal component diffuses from the lump containing layer 24 thereto.

The mass percentage X in the low-content metallic paste layer 22a may be set lower than that in the metallic paste layers 24a that adjoin therewith on both sides thereof in the stacking direction. There is no restriction on the difference in mass percentage between these layers (the mass percentage XH in metallic paste layer 24a minus the mass percentage XL in low-content metallic paste layer 22a).

In a case where the metal component $M_1$ is silver and the metal component $M_2$ is palladium or platinum, the difference in the mass percentage X is preferably in a range described below. In order to promote diffusion of the metal component $M_1$, the difference in mass percentage is preferably 0.1 or larger. On the other hand, the difference in mass percentage is preferably not larger than 30, in order to suppress the metal component $M_1$ from excessively diffusing into the metallic paste layer 22a and causing adjacent ceramic layers to join with each other. Thus the difference in mass percentage is preferably in a range from 0.1 to 30.

In order to increase the diffusion rate of the metal component $M_1$, the difference in mass percentage is preferably 1 or larger. For the purpose of causing the mutual diffusion more vigorously, the difference in mass percentage is preferably 2 or larger.

In the case of this embodiment, silver diffuses from the metallic paste layers 24a that are disposed on both sides of the low-content metallic paste layer 22a in the stacking direction into the low-content metallic paste layer 22a. In the case of this form, the difference in mass percentage is more preferably 25 or less in order to suppress the diffusion rate of the metal component $M_1$ and increase the density of the ceramics after sintering.

Since the temperature at which sintering begins varies depending on the difference in mass percentage difference in mass percentage is preferably 10 or larger in order to stabilize the timing at which diffusion of the metal component $M_1$ from the two metallic paste layers 24a into the low-content metallic paste layer 22a begins, even when the temperature distribution of the ceramic member becomes uneven while the temperature is raised in the furnace. Accordingly, the difference in mass percentage is preferably in a range from 10 to 25.

Figure 12:
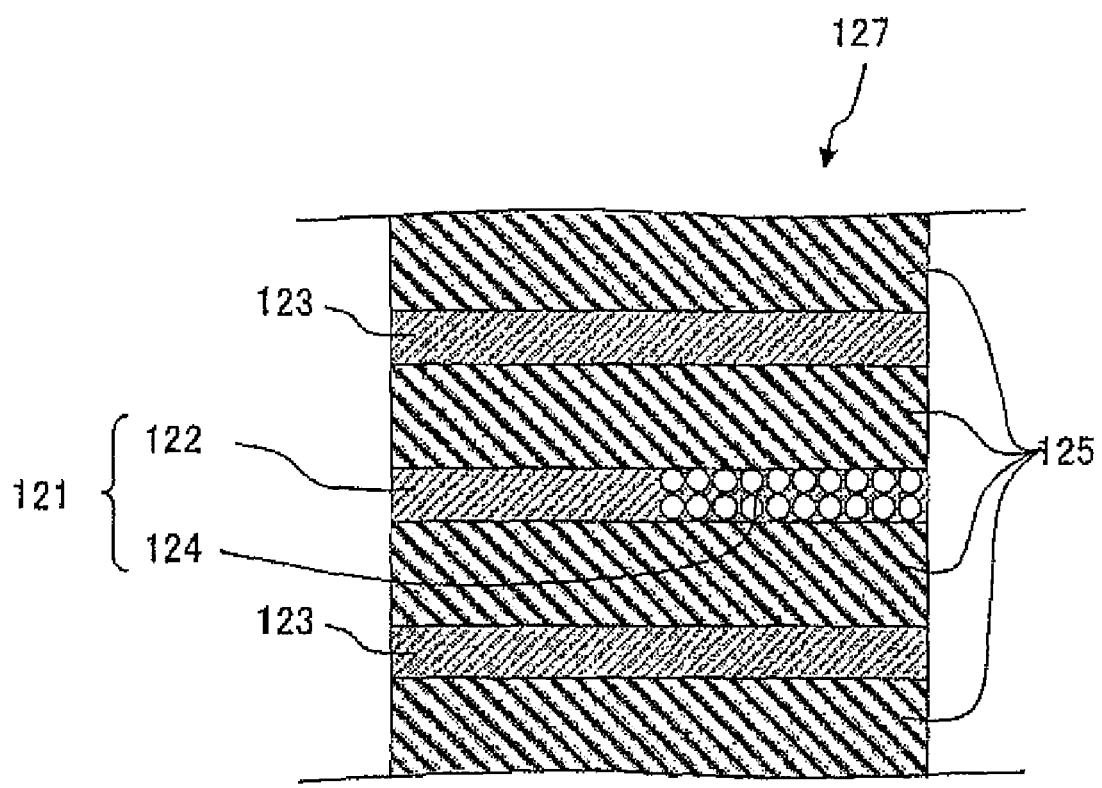
FIG. 12 is a sectional view showing a ceramic member according to further another embodiment of the present invention.

FIG. 12 is a sectional view showing a ceramic member 127 according to further another embodiment of the present invention. As shown in FIG. 12, the ceramic member 127 is constituted by stacking lump containing layer 121 and metal layers 123 one on another via a ceramic layer 125.

The lump containing layer 121 has an area 124 formed in a part of the metal layer 121 where more voids are included than in other area 122. It is preferable that the area 124 has higher mass percentage Y and higher void ratio than those in the other area 122 and in the metal layer 123. Hereafter the area 124 will be referred to as porous area 124.

Figure 13A:
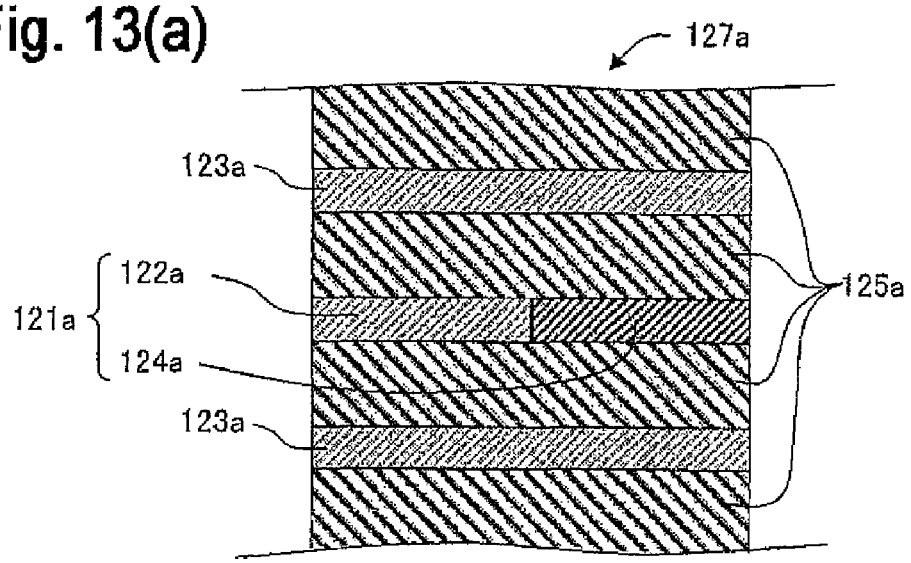
FIG. 13(a) to FIG. 13(c) are schematic diagrams showing the method of manufacturing the ceramic member according to the embodiment shown in FIG. 12.
Figure 13B:
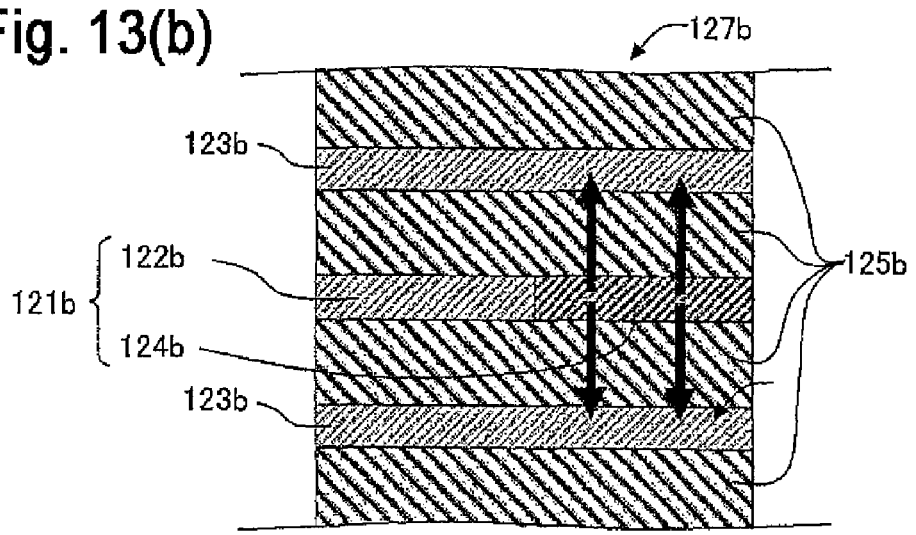
Figure 13C:
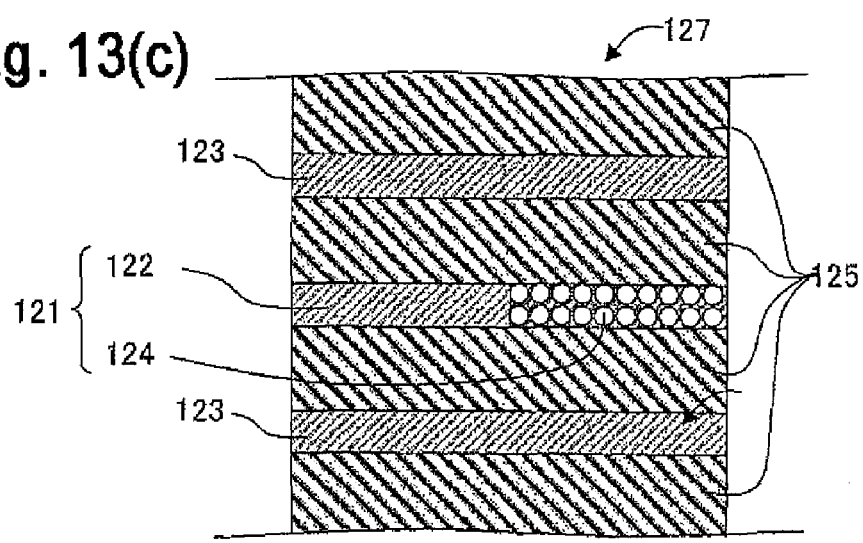

A method according to the present invention for manufacturing the ceramic member 127 that has the porous area 124 in the metal layer 121 will be described below. FIG. 13(a) to FIG. 13(c) are schematic diagrams showing the method of manufacturing the ceramic member according to this embodiment.

This manufacturing method comprises a step of forming a stacked compact 127a from metallic paste layers 121a, 123a that are stacked one on another via a ceramic green sheet 125a, and a step of firing the stacked compact 127a.

The ceramic green sheet and the metallic paste are prepared similarly as described previously. First, a plurality of the ceramic green sheets 125a are formed, and the metallic paste layer 121a or 123a is formed on one principal surface of each ceramic green sheet 125a by screen printing method or the like, and the ceramic green sheets are stacked one on another so that the metallic paste layer 123a are disposed on both sides of the metallic paste layer 121a in the stacking direction, thereby forming the stacked compact 127a (FIG. 13(a)). The metallic paste layer 121a comprises the metallic paste layer 122a for the metal layer 122 and the metallic paste layer 124a for the metal layer 124.

The metallic paste layer 121a (122a, 124a) and the metallic paste layer 123a include the metal component $M_1$ as the main component. The metallic paste layer 124a is prepared to have higher the mass percentage X than that of the metallic paste layer 122a and higher the mass percentage X than that of the metallic paste layer 123a, 123a that adjoin therewith on both sides thereof in the stacking direction. Hereafter the metallic paste layer 124a will be called the high-content metallic paste layer 121a.

In case the metallic paste layers 123a are disposed on both sides of the high-content metallic paste layer 124a, the metal component $M_1$ contained in the high-content metallic paste layer 124a is caused to diffuse preferentially into the metallic paste layers 123a disposed on both sides thereof, rather than diffuse within the plane, when the stacked compact 127a is fired.

The stacked compact 127a shown in FIG. 13(a) is turned into the ceramic member 127 shown in FIG. 13(c) through a stage during sintering shown in FIG. 13(b). The areas (porous area 124 and the other area 122) having different void ratios can be formed within the same layer in this way.

Figure 14:
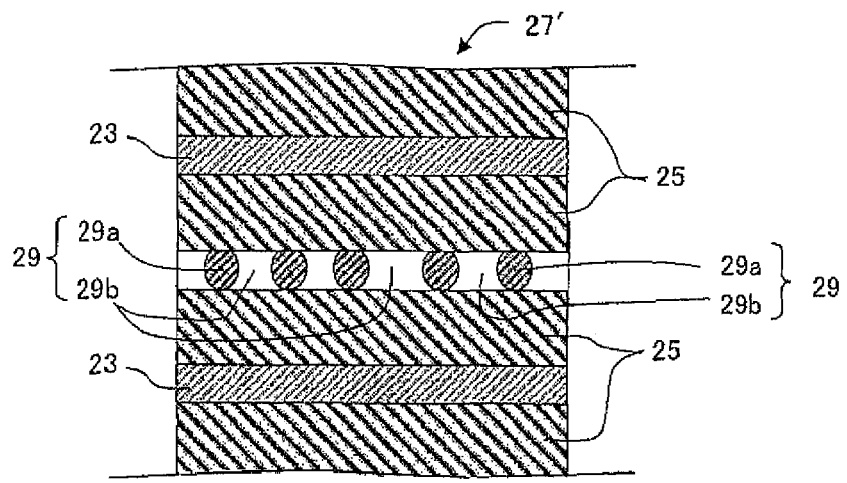
FIG. 14 is a sectional view showing a ceramic member according to further another embodiment of the present invention.

FIG. 14 is a sectional view showing a ceramic member according to further another embodiment of the present invention. As shown in FIG. 14, the ceramic member 27' comprises the lump containing layer 29 that is constituted from a plurality pf ceramic lumps (or metallic lumps (partial metal layers)) 29a, 29a, . . . dispersed between the ceramic layers 25, 25 that adjoin the lump containing layer 29 in the stacking direction, and these lumps 29a are disposed separately from each other.

The plurality of lumps 29a are electrically isolated from each other by the voids 29b. That is, the lump containing layer 29 includes the lumps 29a dispersed on the ceramic layer 25 in plan view of the lump containing layer 29. Since the lumps 29a are disposed while being separated from each other by the voids, the lump containing layer 29 functions as a good stress relieving layer and also as a good insulator.

The ceramic member as described above can be used as a gas sensor by forming the ceramic layer from a ceramic material such as Zno, $SnO_2$, $TiO_2$ or $ZrO_2$ and measuring the electrical resistance of the ceramic layer while flowing electrical current through the metal layer and the lump containing layer. In a filter, the lump containing layer can be formed from a ceramic material such as cordierite, alumina, $ZrO_2$ or the like, so as to make a filter that removes toxic substances from an exhaust gas by means of the lump containing layer. By using a ceramic material that functions has a solid electrolyte such as $ZrO_2$ to form the ceramic layer, a fuel cell can be made that generates electromotive force from the metal layer and the lump containing layer exposed to a predetermined atmosphere. When the ceramic layer is formed from $BaTiO_3$, lead titanate zirconate (PZT) or ZnO, a piezoelectric device can be made that is driven by flowing electrical current through the metal layer and the lump containing layer or generates electromotive force.

There is no restriction on the void ratio of the lump containing layer of the ceramic member of the present invention, which may be determined in accordance to the application. The void ratio may be varied by controlling the mass percentage X, firing time, firing temperature and/or other factors.

Gas Sensor Device

The ceramic member 17 shown in FIG. 3 can be used as a gas sensor device. When the ceramic member 17 is applied to a gas sensor device, the ceramic layer 15 may be formed from a ceramic material that shows the property of oxide semiconductor such as ZnO, $SnO_2$ or $TiO_2$. The device formed from the ceramic of oxide semiconductor as described above functions as a gas sensor by measuring the electrical resistance of the ceramic layer 15 while flowing electrical current through the metal layer 13 and the lump containing layer 11.

The ceramic layer 15 may also be formed a solid electrolyte such as $ZrO_2$. When two gases having different oxygen concentrations are separated by the ceramic layer 15, motions of oxygen ions and free electrons are caused in the ceramic layer 15 due to the difference in the oxygen concentration.

When used in an atmosphere of high temperature, there has been such a problem in the prior art as the electrode component moves by diffusion. According to the present invention, since the metal layer 13 and the metal layer 11 that has high void ratio has the metal component $M_1$ as the main component, difference in the ionization tendency and difference in the electronegativity can be suppressed to low levels. As a result, a device of high durability that can be used stably can be made since movement of the metal ions and diffusion of metal can be suppressed when the device is used as a cell.

The oxygen sensor can be made by disposing the ceramic layer 15 always in contact with the atmosphere and bringing a gas to be measured into contact with the other side opposite to the ceramic layer 15. At this time, the gas to be detected may be put into contact with the lump containing layer 11 that has higher void ratio and atmosphere may be put into contact with the metal layer 13 as a reference gas.

Figure 15:
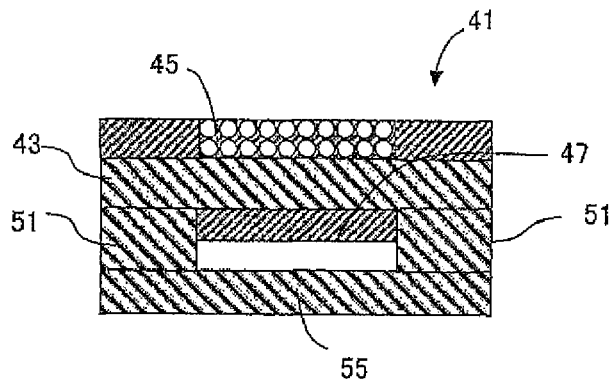
FIG. 15 is a sectional view showing a gas sensor device according to one embodiment of the present invention.

FIG. 15 is a sectional view of a gas sensor device having high characteristics according to another embodiment of the present invention. The gas sensor device 41 uses a solid electrolyte represented by $ZrO_2$ in the ceramic layer 43. The gas to be detected is put into contact with the metal layer 45 that has high void ratio and the atmospheric air is put into contact with the lump containing layer 47 that has high void ratio. The lump containing layer 47 is sealed on the circumference by external electrode 49 and a ceramics layer 51, to prevent the gas that is in contact with the metal layer 45 from making contact with the metal layer 47. This makes it possible for gases having difference oxygen concentrations to make contact with the principal surface on either side of the ceramic layer 43 made of the solid electrolyte material. The gas sensor device has a gas inlet formed therein.

Detected signal can be transmitted at a high speed through dense electrode (metal layer 53) by connecting the relatively dense metal layer 53 to the external electrode 49. This means that the external electrode 49 functions as a guide for introducing the atmosphere air as the reference gas, and also functions as the medium for high speed transmission of the signal.

When the metal layer 53 is embedded between the ceramic layer 51 and the ceramic layer 55, a device of high durability can be made since oxidation of the metal layer 53 can be suppressed even when the gas sensor device is exposed to a high temperature atmosphere.

When the ceramic layers 51, 55 are formed from alumina ceramics that has high heat resistance and high heat conductivity, such an oxygen sensor can be made that is capable of quick heating and quick startup by heating the gas sensor device.

When the ceramic layers 43, 51, 55 are formed from a solid electrolyte represented by $ZrO_2$, shrinkage of ceramic during firing can be made almost the same. As a result, it is made easier to fire and possible to decrease the stress generated by the difference in thermal expansion during firing. This makes the device highly durable.

Figure 16:
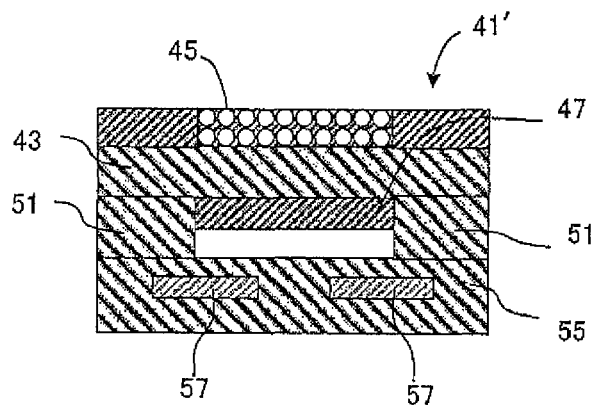
FIG. 16 is a sectional view showing a gas sensor device according to another embodiment of the present invention.

FIG. 16 is a sectional view of another embodiment of the gas sensor device. Such a heater-integrated oxygen sensor can be made that has a heater 57 incorporated in the ceramic layer 55.

A method for manufacturing the sensor device shown in FIG. 15 will be described. First, a $ZrO_2$ ceramic (stabilized zirconia) powder having Ca and Y added thereto, the binder described above and the plasticizer described above are mixed to prepare a slurry. The slurry is then formed into ceramic green sheet as described previously.

Then a metallic paste to be used to form the metal layer 53 is prepared. The metallic paste is prepared by mixing a metal powder consisting mainly of silver palladium, a binder and a plasticizer. The metallic paste is printed on one side of the ceramic green sheet by screen printing or the like.

Then a metallic paste (high-content metallic paste) to be used to form the lump containing layer 47 having high void ratio is prepared. The metallic paste is prepared by mixing a metal powder consisting mainly of silver, a binder and a plasticizer. The metallic paste is printed on the ceramic green sheet by screen printing or the like.

The stacked compact is formed by stacking the ceramic green sheets having the metallic paste layers formed thereon and placing another green sheet on the high-content metallic paste layer, then drying the stack. The thickness of the metallic paste layer is preferably from about 1 to 40 μm.

After heating the stacked compact to a predetermined temperature to remove the binder, the stacked compact is fired at a temperature from 800 to 1,000° C. This causes silver to diffuse from the metal layer 47 that has high silver concentration to the metal layer 53, thus resulting in the metal layer 47 having high void ratio and the metal layer 53 having relatively higher density.

Then a metallic paste is prepared by mixing a metal powder consisting mainly of platinum, a binder and a plasticizer. The metallic paste is printed on the sintered stack at a position where the metal layer 45 is to be formed by screen printing or the like. As the stack is fired at a temperature from 800 to 1,000° C., the ceramic layer is sintered with high density, although platinum that has liquid phase point higher than that of the ceramic layer is not turned into sintered material of high density, but instead makes the metal layer 45 of high void ratio. Even higher void ratio can be obtained by using a metallic paste prepared by mixing a platinum powder having a mean particle size of about 1 μm and acrylic beads having a mean particle size of about 5 μm in proportion of about 50:50, which produces a more porous electrode.

After machining the sintered stack into desired dimensions, the external electrodes 49 are formed thereon. The external electrodes 49 are formed by preparing a metallic paste by mixing a metal powder consisting mainly of silver, a binder, a plasticizer and a glass powder, and printing the metallic paste on the side faces of the sintered stack by screen printing or the like, then firing the stack at a temperature from 600 to 800° C.

The manufacturing process may be other than that described above and follow a known method of the prior art, except for the step in which silver diffuses from the metal layer that has high silver concentration to the metal layer that has low silver concentration, thus resulting in the metal layer 47 having high void ratio and the metal layer 53 having relatively higher density.

The gas sensor device shown in FIG. 16 may be manufactured by adding such a step to the process described above, as a metallic paste prepared by mixing a metal powder consisting mainly of platinum, a binder, a plasticizer and a glass powder is printed in the form of a heater in the ceramic green sheet that form the ceramic layer 55.

Void ratio of the lump containing layer (the metal layer having high void ratio) is preferably in a range from 30 to 90%, in order to ensure stable supply of gas and durability of the metal layer. In order to mitigate the stress generated by the difference in thermal expansion between the electrode and the ceramics by utilizing the cushion effect of air, void ratio is more preferably in a range from 50 to 90%. Furthermore, in order to form a turbulent flow of supplied gas for stirring and form a laminar flow in the interface between the metal and the ceramics in the voids so as to improve the performance of gas detection, void ratio is more preferably in a range from 70 to 90%.

Void ratio of the metal layers other than the lump containing layer is preferably in a range from 0.1 to 40%, because higher density leads to high electric conductivity that enables high speed transmission of signals. Since a metal has higher heat conductivity than ceramics, a metal layer having higher density transmits heat to the ceramics at the start of sensor operation, thus making the sensor quicker in startup. With this regard, void ratio is more preferably in a range from 0.1 to 20%.

Fuel Cell Device

Figure 17:
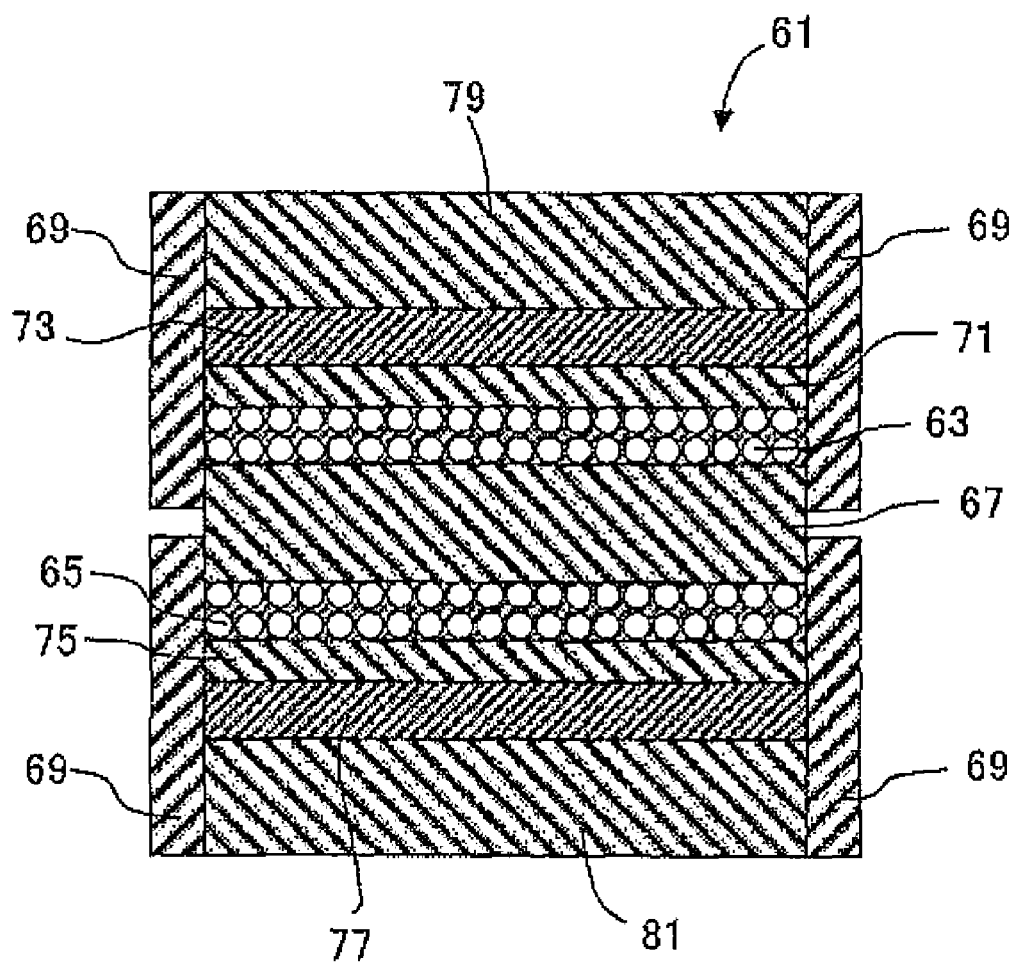
FIG. 17 is a sectional view showing a fuel cell device according to one embodiment of the present invention.

FIG. 17 is a sectional view of a fuel cell device according to one embodiment of the present invention. The fuel cell device can be made by utilizing the electromotive force generated by bringing gases having different oxygen concentrations into contact with a solid electrolyte, as described previously. To produce a large current, it is important to efficiently collect the electromotive force by packing many fuel cell devices in a limited volume.

As shown in FIG. 17, the fuel cell device 61 employs an electrode layer 63 that has high void ratio for the layer through which oxygen flows (the so-called air electrode), and an electrode layer 65 that has high void ratio also for the layer where oxygen concentration is very low (the so-called fuel electrode). A solid electrolyte represented by $ZrO_2$ is incorporated in the ceramic layer 67 disposed between the electrode layers. This constitutes a basic portion of the fuel cell.

As the electrode layer 63 that serves as the air electrode can be sealed on the circumference thereof by the external electrode 69 and the ceramics layers 67, 71, a large The amount of oxygen can be caused to flow through the electrode layer 63 that has high void ratio. Also because the electrode layer 73 that has high density is connected via the external electrode 69 to the electrode layer 63 that has high void ratio, electromotive force can be efficiently transmitted.

As the electrode layer 65 that serves as the fuel electrode can be sealed on the circumference thereof by the external electrode 69 and the ceramics layers 67, 75, a large The amount of gas (for example, natural gas) having extremely low oxygen concentration can be caused to flow through the electrode layer 65 that has high void ratio. Also because the electrode layer 77 that has high density is connected via the external electrode 69 to the electrode layer 65 that has high void ratio, electromotive force can be efficiently transmitted.

Efficiency of power generation by a fuel cell is improved when the cell is heated. In this regard, there has been such a problem that electrode component diffuses during operation at a high temperature. In contrast, the metal layers 73, 77 and the metal layers 63, 65 that have high void ratio include the metal component $M_1$ as the main component, and therefore can suppress the difference in the ionization tendency and difference in the electronegativity to low levels.

Figure 18:
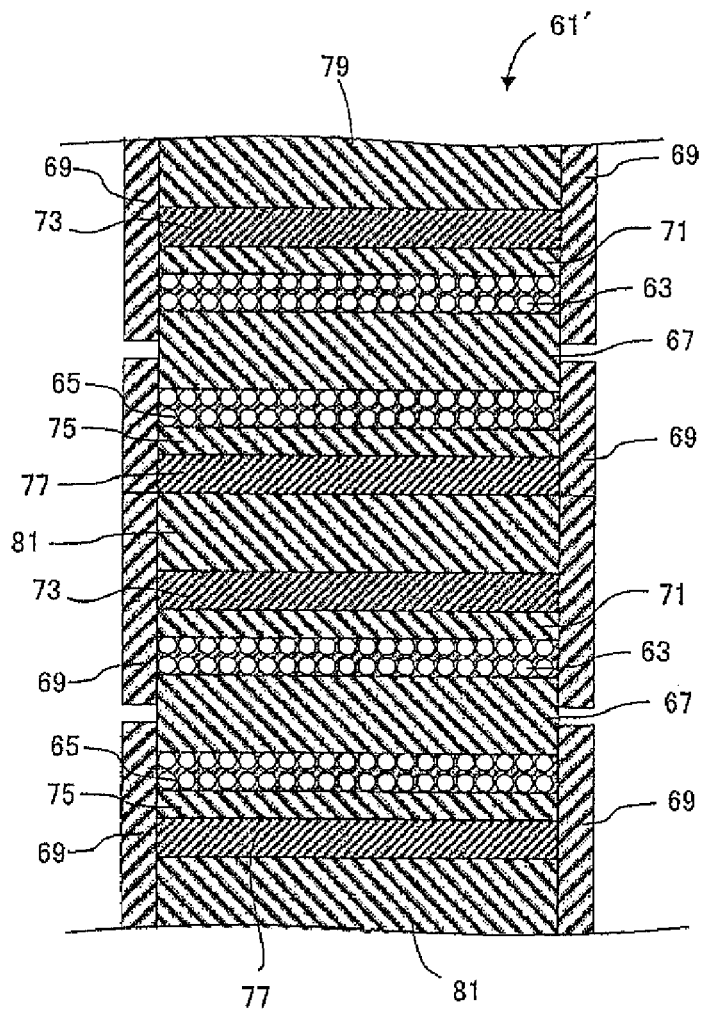
FIG. 18 is a sectional view showing a fuel cell device according to another embodiment of the present invention.

As a result, a device of high durability that can be used stably can be made since movement of the metal ions and diffusion of metal can be suppressed when the device is used as a cell. Moreover, a compact and high-density fuel cell device can be made by stacking the fuel cell devices and connecting the external electrodes of the same polarity together as shown in FIG. 18.

A method for manufacturing the fuel cell device shown in FIG. 17 will be described. First, a $ZrO_2$ ceramic (stabilized zirconia) powder having Ca and Y added thereto, the binder described above and the plasticizer described above are mixed to prepare a slurry. Then ceramic green sheets for the ceramic layers 67, 71, 75, 79, 81 are made as described previously.

Then a metallic paste to be used to form the metal layers 73, 77 is prepared. The metallic paste is prepared by mixing a metal powder consisting mainly of silver palladium, a binder and a plasticizer. The metallic paste is printed on one side of the ceramic green sheet by screen printing or the like.

Then a metallic paste used to form the metal layers 63, 65 having high void ratio is prepared. The metallic paste is prepared by mixing a metal powder consisting mainly of silver, a binder and a plasticizer. The metallic paste is printed on one side of the ceramic green sheet by screen printing or the like.

The green sheets having the metallic pastes printed thereon are stacked in such a structure as shown in FIG. 17 and dried, to make the stacked compact. The thickness of the metallic paste layer may be in a range from 1 to 40 µm in the case of screen printing.

After heating the stacked compact to a predetermined temperature to remove the binder, the stacked compact is fired at a temperature from 800 to 1,000° C. This causes silver to diffuse from the metal layer that has high silver concentration to the alloy layer, thus resulting in the metal layers 63, 65 having high void ratio and the metal layers 73, 77 having relatively higher density.

After machining the sintered stack into desired dimensions, the external electrodes 69 are formed thereon. The external electrodes 69 are formed by preparing a metallic paste by mixing a metal powder consisting mainly of silver, a binder, a plasticizer and a glass powder, and printing the metallic paste on the side faces of the sintered stack by screen printing or the like, then firing the stack at a temperature from 600 to 800° C.

The manufacturing process may be other than that described above and follow a known method of the prior art, except for the step in which silver diffuses from the metallic paste layer that has high silver concentration to the metallic paste layer that has low silver concentration, thus resulting in the metal layer 47 having high void ratio and the metal layer 53 having relatively higher density. In the case of the form shown in FIG. 18, a necessary step among the steps described above may be added.

Void ratio of the lump containing layer is preferably in a range from 30 to 90%, in order to ensure stable supply of gas and durability of the metal layer. In order to mitigate the stress generated by the difference in thermal expansion between the electrode and the ceramics by utilizing the cushion effect of air, void ratio is more preferably in a range from 50 to 90%.

Furthermore, in order to form a turbulent flow of supplied gas for stirring and form a laminar flow in the interface between the metal and the ceramics in the voids so as to improve the accuracy of the solid electrolyte to measure oxygen concentration, void ratio is more preferably in a range from 70 to 90%, where such a space can be produced that combines a portion of turbulent flow and a portion of laminar flow.

Void ratio of the metal layers other than the lump containing layer is preferably in a range from 0.1 to 40%, because higher density leads to high electric conductivity that enables high speed transmission of signals. Since a metal has higher heat conductivity than ceramics, a metal layer having higher density transmits heat to the ceramics at the start of operation of the fuel cell, thus making the fuel cell device quicker in startup. With this regard, void ratio is more preferably in a range from 0.1 to 20%.

Filter Device

Figure 19:
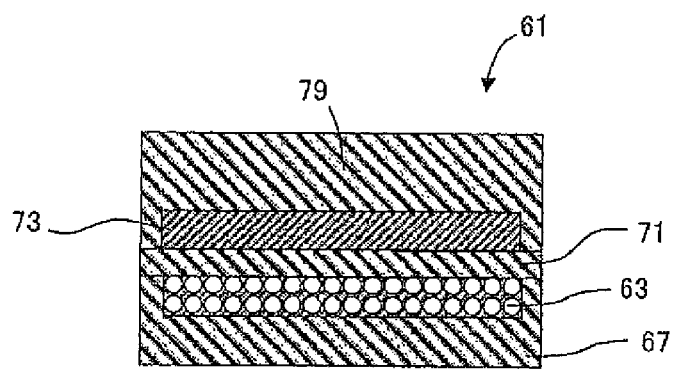
FIG. 19 is a sectional view showing a filter device according to one embodiment of the present invention.

FIG. 19 is a sectional view of a filter device according to one embodiment of the present invention. As shown in FIG. 19, the filter device 61 employs an electrode layer 63 that has high void ratio for the layer through which the gas flows, and an electrode layer 73 is used for heating or heat transmission, while a ceramic layer 71 formed from ceramics such as cordierite or alumina is interposed between these layers. This constitutes a basic portion of the filter. As the electrode layer 63 that has high void ratio can be sealed on the circumference by the ceramics layers 67, 79, a large The amount of gas can be caused to flow through the electrode layer 63 that has high void ratio.

The metallic component of the electrode layer 63 that has high void ratio serves as a catalyst for local combustion and selective adsorption, and therefore particular substance can be removed selectively.

Figure 20:
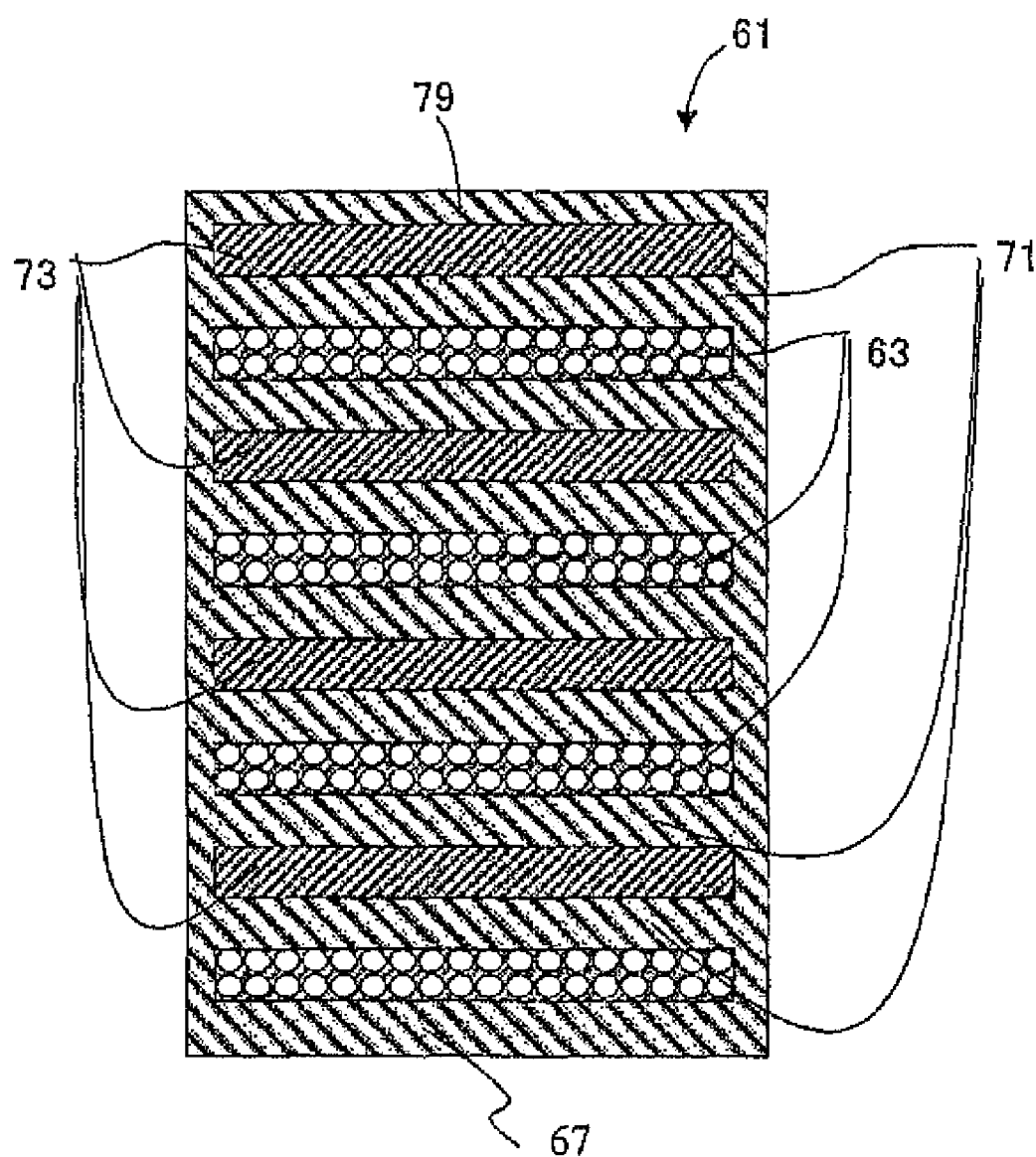
FIG. 20 is a sectional view showing a filter device according to another embodiment of the present invention.

Efficiency of the filter to remove toxic substance is improved when the filter is heated. In this regard, there has been such a problem that electrode component diffuses during operation at a high temperature. In contrast, the metal layers 73 and the metal layers 63 that have high void ratio include the metal component $M_1$ as the main component, and therefore can suppress the difference in the ionization tendency and the difference in the electronegativity to low levels. As a result, a device of high durability that can be used stably can be made since movement of the metal ions and diffusion of metal can be suppressed. Moreover, a compact and high-density filter device can be made by stacking the filter devices and connecting the external electrodes of the same polarity together as shown in FIG. 20.

A method for manufacturing the filter device shown in FIG. 19 will now be described. First, a powder of cordierite ceramics ($2MgO-2Al_2O_3-5SiO_2$) having oxide of Y or rare earth element added thereto, the binder described above and the plasticizer described above are mixed to prepare a slurry. Then ceramic green sheets for the ceramic layers 67, 71, 79 are made from this slurry by the tape molding method. Then the metallic paste for the metal layer 73 is prepared as described above.

The green sheets having the metallic pastes printed thereon are stacked in such a structure as shown in FIG. 19 and dried, to make the stacked compact. The stacked compact may be cut to a desired shape. The thickness of the metallic paste layer may be in a range from 1 to 40 μm in the case of screen printing.

After heating the stacked compact to a predetermined temperature to remove the binder, the stacked compact is fired at a temperature from 800 to 1,000° C. This causes silver to diffuse from the metal layer that has high silver concentration to the alloy layer, thus resulting in the metal layers 63 having high void ratio and the metal layer 73 having relatively higher density.

Figure 21:
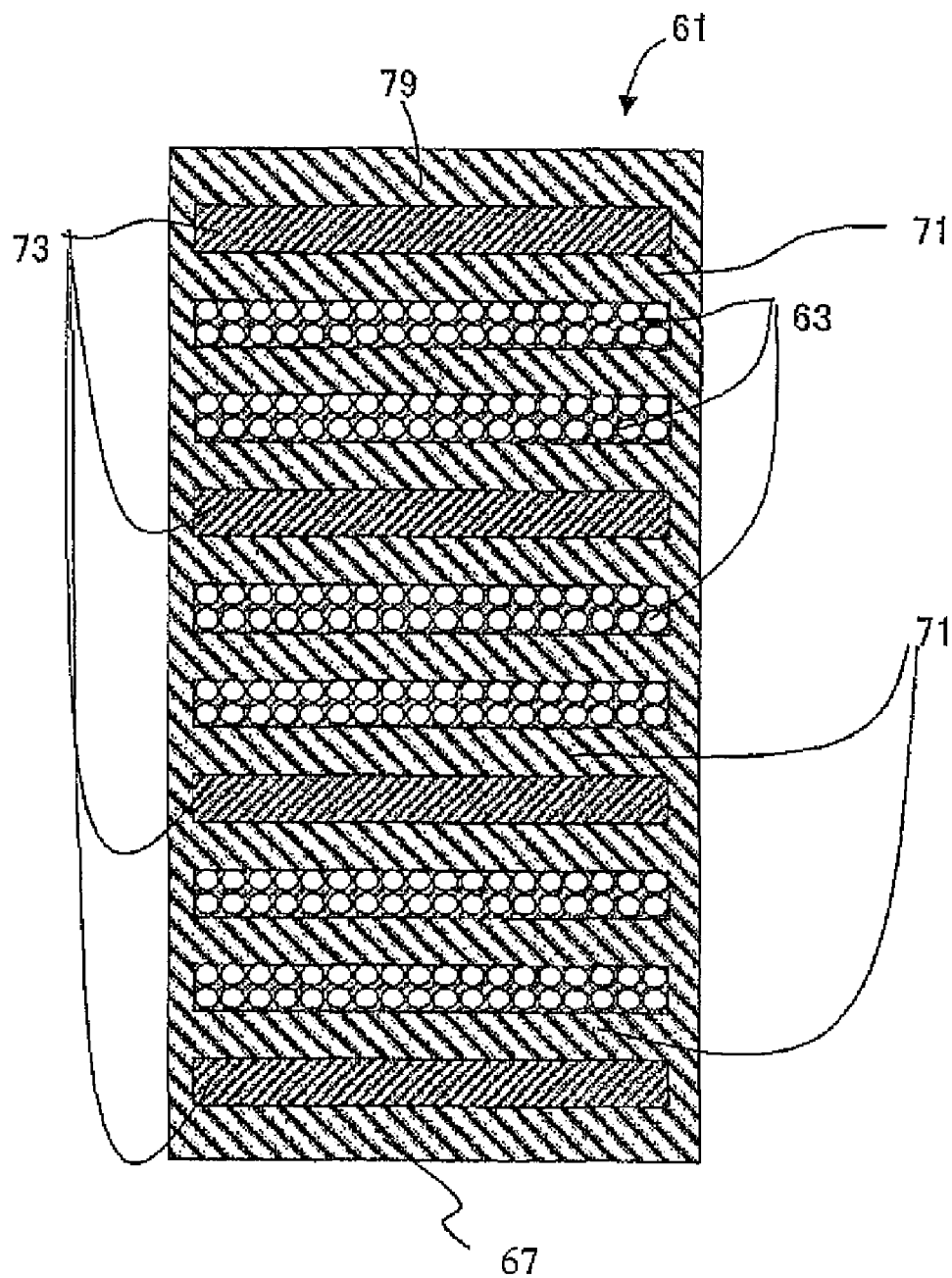
FIG. 21 is a sectional view showing a filter device according to further another embodiment of the present invention.
Figure 22:
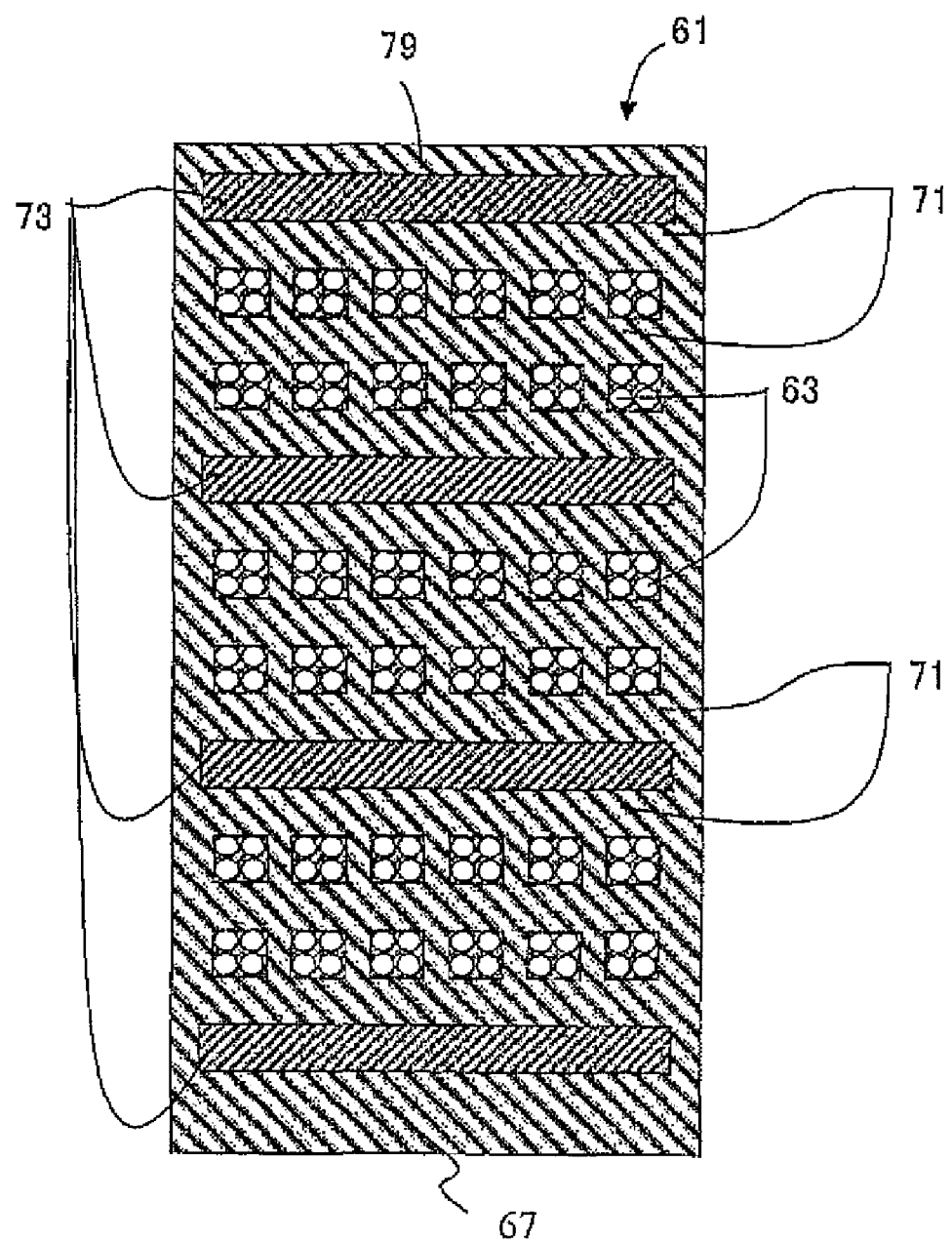
FIG. 22 is a sectional view showing a filter device according to further another embodiment of the present invention.

In the case of the forms shown in FIGS. 20, 21 and 22, necessary step among the steps described above may be added. In the case of FIG. 22, the metal layer 63 having relatively higher void ratio may be printed.

As the same cordierite ceramics as the material that constitutes the ceramic layer 71 is used for the ceramic powder contained in the lump containing layer 63, the material forms a strong bond with the surrounding metal particles at the same time the liquid phase is formed during firing at the time it precipitates from the liquid phase.

Void ratio of the lump containing layer (the metal layer having high void ratio) is preferably in a range from 30 to 90%, in order to ensure stable supply of gas and durability of the metal layer. In order to mitigate the stress generated by the difference in thermal expansion between the electrode and the ceramics by utilizing the cushion effect of air, void ratio is more preferably in a range from 50 to 90%. The function of the metal particles carried by the filter as catalyst can be improved when a turbulent flow of supplied gas is formed for stirring and a laminar flow is formed in the interface between the metal and the ceramics in the voids. With this regard, void ratio is more preferably in a range from 70 to 90%, in which such a space can be produced that combines a portion of turbulent flow and a portion of laminar flow.

Void ratio of the metal layers (metal layers having relatively high density) other than the lump containing layer is preferably in a range from 0.1 to 40%, because higher density of the metal layer leads to high heat conductivity that enables quick heating of the filter to a desired temperature. Also because a metal has higher heat conductivity than ceramics, a metal layer having higher density transmits heat to the ceramics at the start of operation of the filter, thus making the filter device quicker in startup. With this regard, void ratio is more preferably in a range from 0.1 to 20%.

Multi-Layer Piezoelectric Device

Figure 23:
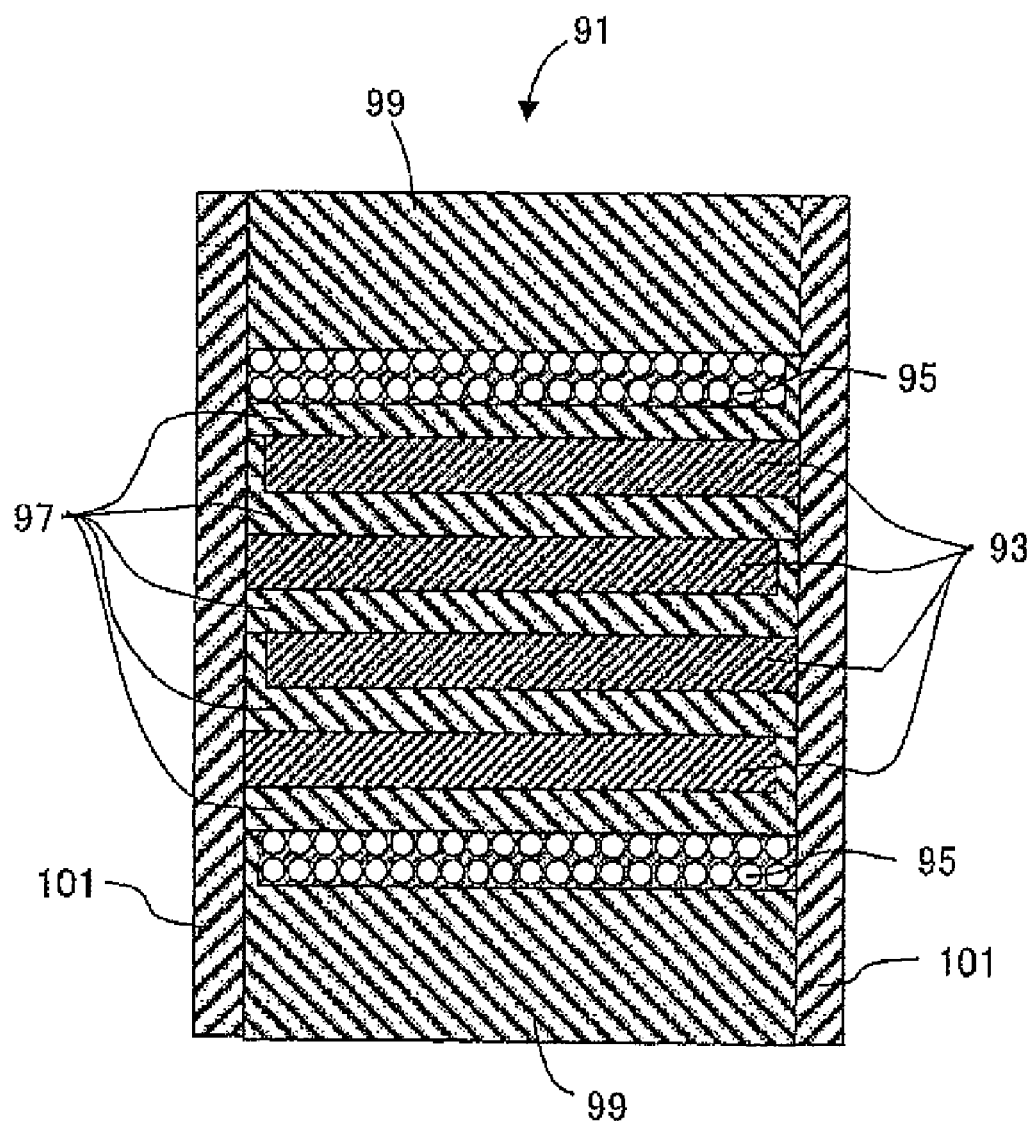
FIG. 23 is a sectional view showing a multi-layer piezoelectric device according to one embodiment of the present invention.

FIG. 23 is a sectional view of a multi-layer piezoelectric device according to one embodiment of the present invention. The multi-layer piezoelectric device 91 is constituted from a stack of a plurality of metal layers 93 that function as internal electrodes and lump containing layer 95 which are stacked via the ceramic layer 97, with a pair of external electrodes 101, 101 formed on the side faces of the stack. The ceramic layers (inactive layers) 99 that do not contribute to the piezoelectric effect may be disposed on both ends of the stack in the stacking direction.

The lump containing layer 95 has more voids than the first metal layer 93 that adjoins therewith in the stacking direction. The lump containing layer 95 may have any of the forms shown in FIG. 2(a) to FIG. 2(c).

The ceramic layer 97 is formed from a piezoelectric material such as PZT (lead titanate zirconate). The metal layer 93 and the lump containing layer 95 are disposed so as to be exposed alternately on the opposing side faces of the stack. This constitution allows it to apply a voltage via the external electrodes 101 to the ceramic layers 97 that are disposed between the metal layers 93. Application of the voltage causes the device to contract and expand so as to function as a piezoelectric actuator.

In the multi-layer piezoelectric device 91, the lump containing layer 95 has high void ratio and the metal layer 93 has relatively high density, and therefore voltage concentrates in the metal layer 93 that is dense and has high signal transmission speed. The lump containing layer 95 that has high void ratio and high resistance receives relatively low voltage.

Since the lump containing layer 95 has high void ratio, the area of the electrode through which the lump containing layer 95 contacts the adjacent ceramic layer 97 becomes smaller, and therefore the area of the ceramic layer 97 that deforms due to the reverse piezoelectric effect when voltage is applied thereto becomes smaller than the ceramic layer 97 that adjoins the dense metal layer 93. As a result, the amount of piezoelectric displacement of the ceramic layer 97 sandwiched by the metal layers 93 becomes larger, and the amount of piezoelectric displacement of the ceramic layer 97 sandwiched by the metal layers of which at least one is the lump containing layer 95 having high voids ratio becomes smaller.

In this embodiment, the lump containing layer 95 having high voids ratio is disposed to adjoin the ceramic layer 99 that is the inactive layer disposed in the border between a portion that is displaced and a portion that is not displaced, and therefore the lump containing layer 95 functions as a stress relieving layer. Since at least one of the internal electrodes that sandwich the ceramic layer 97 is the lump containing layer 95 that has high void ratio and high resistance, the amount of piezoelectric displacement of the ceramic layer 97 that adjoins therewith becomes smaller, thus achieving the stress relieving effect. As a result, the multi-layer piezoelectric device having high durability can be made.

Figure 24:
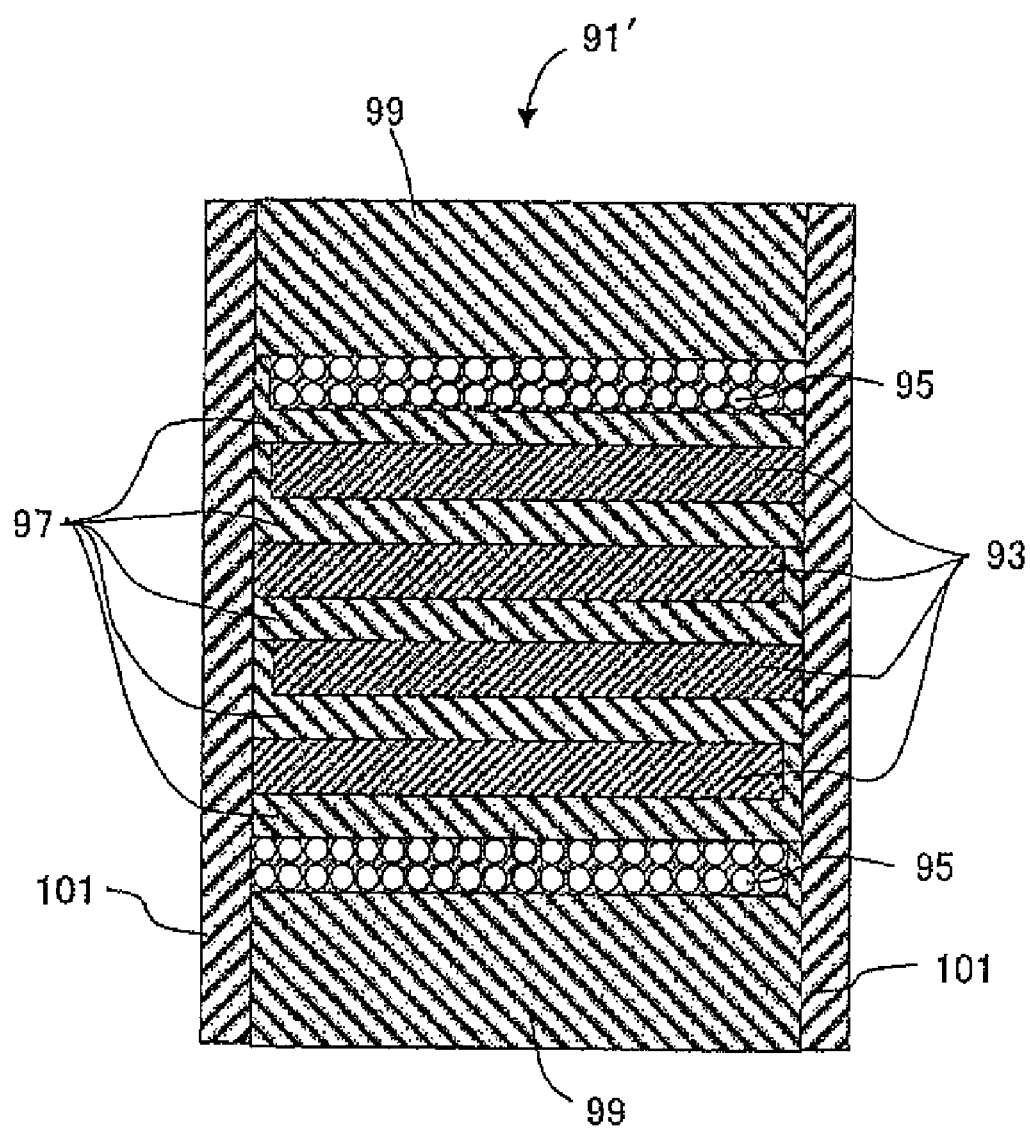
FIG. 24 is a sectional view showing a multi-layer piezoelectric device according to another embodiment of the present invention.

FIG. 24 is a sectional view of a multi-layer piezoelectric device 91' according to another embodiment of the present invention. The multi-layer piezoelectric device 91' is different from the multi-layer piezoelectric device 91 in that the lump containing layer 95 having high void ratio is connected to the external electrode 101 of the same polarity as the metal layer 93 that adjoins the lump containing layer 95 having high void ratio. With this constitution, since voltage is not applied to the lump containing layer 95 and to the ceramic layer 97 that is sandwiched by the metal layers 93 that adjoin the lump containing layer 95, the ceramic layer 97 does not make piezoelectric displacement. In case there are a portion that is displaced and a portion that is not displaced in the device, stress would be concentrated in the border between these portions. However, presence of the ceramic layer 97 formed from a piezoelectric material in the border relieves the stress as the piezoelectric material deforms in accordance to the stress.

If the adjoining dense metal layers are connected to the external electrodes of the same polarity and a ceramic layer is disposed therebetween, the ceramic layer is subjected to strong restriction by the metal layers and exerts less stress relieving effect and allows stress concentration to occur. When at least one of the metal layers that sandwich the ceramic layer 97 is the lump containing layer 95 that has high void ratio, as in this embodiment, on the other hand, the force of restriction becomes smaller because the contact area between the ceramic layer 97 is the lump containing layer 95 that has high void ratio is small. Even when the stress cannot be absorbed by only the ceramic layer 97 that is sandwiched by the external electrodes of the same polarity, stress relieving effect can be improved by the cushion effect of the lump containing layer 95 that has high void ratio.

Even when a high stress beyond expectation is generated resulting in cracks of the metal layer 93 or cracks in the ceramic layer 97 sandwiched by the external electrodes of the same polarity, troubles such as short circuiting can be suppressed from occurring because the ceramic layer 97 is sandwiched by the external electrodes of the same polarity.

In the case of the form shown in FIG. 2(a), the lump containing layer 95 having high void ratio functions as the electrode and two ceramic layers 97 are sandwiched by different electrodes, so that the stress relieving effect is enhanced in accordance to the decrease in the amount of piezoelectric displacement due to the decrease of the applied voltage per thickness to one half. As a result, the multi-layer piezoelectric device having stable performance can be made.

A method for manufacturing the multi-layer piezoelectric device 91 shown in FIG. 23 will now be described. First, a powder of lead titanate zirconate (PZT), the binder described above and the plasticizer described above are mixed to prepare a slurry. The slurry is formed into ceramic green sheets for the ceramic layers 97, 99 by a known method such as doctor blade method, calender roll process or other tape molding method.

Then a metallic paste for the metal layer 93 is prepared. The metallic paste is prepared by mixing a metal powder consisting mainly of silver palladium, a binder and a plasticizer. The metallic paste is printed on one side of the ceramic green sheet by screen printing or the like. A metallic paste for the lump containing layer 95 having high void ratio is also prepared. This metallic paste is prepared by mixing a metal powder consisting mainly of silver, a binder and a plasticizer. The metallic paste is printed on one side of the ceramic green sheet by screen printing or the like.

The green sheets having the metallic pastes printed thereon are stacked in such a structure as shown in FIG. 19 and dried, to make the stacked compact. The thickness of the metallic paste layer may be in a range from 1 to 40 μm in the case of screen printing.

After heating the stacked compact to a predetermined temperature to remove the binder, the stacked compact is fired at a temperature from 800 to 1,000° C. This causes silver to diffuse from the metal layer that has high silver concentration to the alloy layer, thus resulting in the lump containing layer 95 having high void ratio and the metal layer 93 having relatively higher density.

After machining the sintered stack into desired dimensions, the external electrodes 101 are formed thereon. The external electrodes 101 are formed by preparing a metallic paste by mixing a metal powder consisting mainly of silver, a binder, a plasticizer and a glass powder, and printing the metallic paste on the side faces of the sintered stack by screen printing or the like, then firing the stack at a temperature from 600 to 800° C.

The manufacturing process may be other than that described above and may follow a known method of the prior art, except for the step in which silver diffuses from the metal paste layer that has high silver concentration to the metal paste layer that has low silver concentration, thus resulting in the metal layer 95 having high void ratio and the metal layer 93 having relatively higher density.

Figure 25:
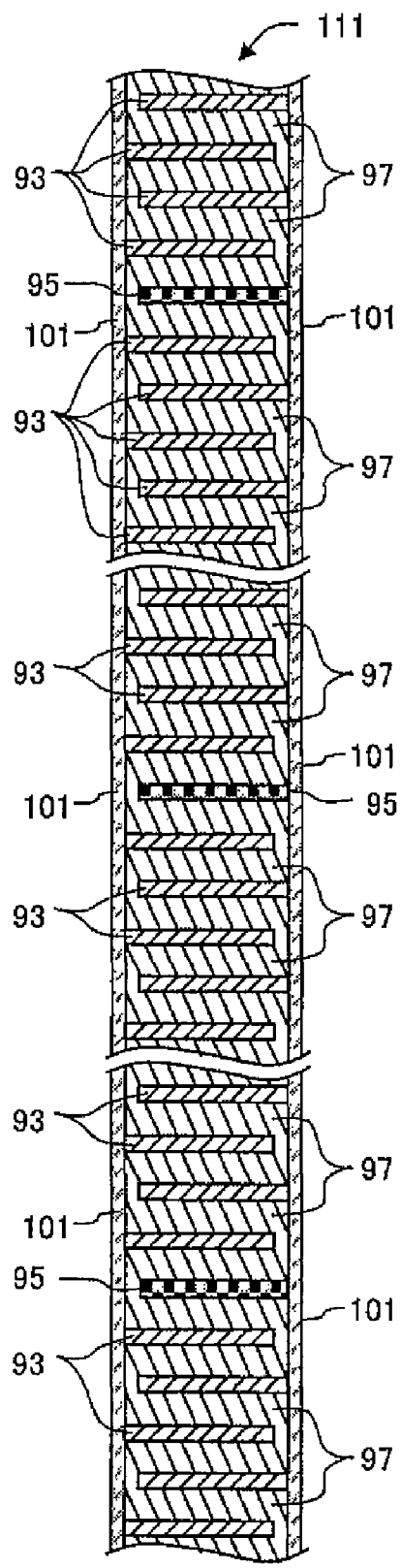
FIG. 25 is a sectional view showing a multi-layer piezoelectric device according to further another embodiment of the present invention.

FIG. 25 is a sectional view of a multi-layer piezoelectric device 111 according to further another embodiment of the present invention. As shown in FIG. 25, the multi-layer piezoelectric device 111 of this embodiment is constituted from a stack of a plurality of metal layers 93 and a plurality of lump containing layers 95 which are stacked via the ceramic layer 97, with a pair of external electrodes 101, 101 formed on the side faces of the stack.

In the multi-layer piezoelectric device 111, the lump containing layers 95 having void ratio higher than that of the metal layers 93 that adjoin on both sides thereof in the stacking direction are disposed via a plurality of metal layers 93. The plurality of lump containing layers 95 are disposed regularly in the stacking direction of the stack. As the lump containing layers 95 having high void ratio are disposed via plural metal layers 93, strength in the stacking direction is suppressed from decreasing. As plural lump containing layers 95 are disposed regularly (in accordance to a predetermined rule) in the stacking direction, the stress relieving effect can be achieved evenly throughout the length in the stacking direction.

The expression that the lump containing layer 95 are disposed regularly means, not only a case where plural lump containing layer are dispose all at the same intervals, but also a case in which the intervals between the lump containing layer are near to each other to such an extent that stress generated in the stack can be effectively distributed in the stacking direction. Specifically, the intervals between the lump containing layer is preferably within ±20%, more preferably ±15% of the mean intervals between the lump containing layer, and further more preferably the same.

In case the lump containing layers 95 are constituted from a plurality of ceramic lumps (and metallic lumps) that are scattered between two piezoelectric material layers 97, 97 which adjoin the lump containing layer 95 in the stacking direction as in the form shown in FIG. 2(b) or FIG. 2(c), the stress relieving effect is improved significantly in comparison to the case where the metal layer has a sponge-like configuration that includes a number of separate voids as shown in FIG. 2(a).

The lump containing layer 95 of the multi-layer piezoelectric device 111 preferably has a thickness less than those of the metal layers 93, 93 that adjoin the lump containing layer 95 on both sides thereof in the stacking direction. The lump containing layer 95 that is thinner deforms more easily than the metal 93 that is thicker, and is able to absorb the stress generated by the displacement of the piezoelectric layer 97 when the metal layer deforms. As a result, the structure having the lump containing layers 95 disposed regularly as shown in FIG. 21 can absorb the stress generated by the displacement of the multi-layer piezoelectric device 111.

Preparation of the metallic paste for the lump containing layer to have the mass percentage X higher than the mass percentage X of the metallic paste for the other metal layers makes it possible to utilize the diffusion of the metal component of the lump containing layer through the ceramic layer into the adjacent metal layer in accordance to the difference in the mass percentage X. Even when the metallic paste layers are comparable in thickness before sintering, the lump containing layer becomes thinner than the other metal layers after the metal component has diffused.

The lump containing layer 95 can be made thinner by other methods, such as forming the metallic paste layer for the lump containing layer with smaller thickness than the thickness of the metallic paste layer for the other metal layer, when printing the metallic paste layer on the ceramic green sheet.

It is preferable that the lump containing layer 95 of the multi-layer piezoelectric device 111 has higher electrical resistance than those of the metal layers 93, 93 that adjoin the lump containing layer 95 on both sides thereof in the stacking direction. The piezoelectric layer 97 that adjoins the lump containing layer 95 that has high electrical resistance undergoes less displacement than the piezoelectric layer 97 that adjoins the metal layer 93 that has low electrical resistance. This constitution having a plurality of the piezoelectric layers 97 that undergo smaller displacement and are disposed in the multi-layer piezoelectric device 111 makes it possible to distribute the stress generated by the displacement, thereby suppressing troubles such as cracks from occurring.

Electrical resistance of the lump containing layer 95 can be made higher than those of the other metal layers 93 by several methods. For example, cross sectional area of the lump containing layer 95 may be made smaller than those of the other metal layers 93. Specifically, the cross sectional area can be made smaller by making the layer thinner or making the void ratio higher. Alternatively, a material having higher resistivity may be used to form the lump containing layer 95.

It is also preferable that the lump containing layer 95 of the multi-layer piezoelectric device 111 has higher mass percentage Y than that of the metal layers 93 that adjoin therewith on both sides in the stacking direction. It is particularly preferable that mass percentage Y peaks in the lump containing layer 95 and gradually decreases from the lump containing layer 95 over at least two metal layers 93 on both sides in the stacking direction.

The multi-layer piezoelectric device 111 having such a structure has an advantage of high strength to endure thermal shock since concentration of the metal component decreases gradually through a plurality of metal layers without abrupt change. This is due to the fact that the metal has higher heat conductivity than the ceramics, and that heat conductivity changes with the composition of the metal component. That is, as concentration of the metal component decreases gradually without abrupt change through a plurality of metal layers, heat conductivity in the ceramic member can be suppressed from changing abruptly.

Figure 26:
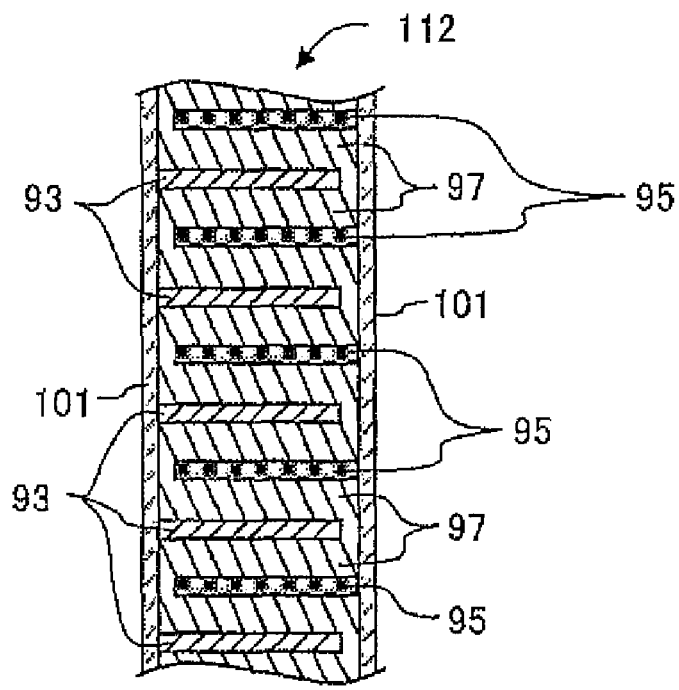
FIG. 26 is a sectional view showing a multi-layer piezoelectric device according to further another embodiment of the present invention.

FIG. 26 is a sectional view of a multi-layer piezoelectric device 112 according to further another embodiment of the present invention. As shown in FIG. 26, the multi-layer piezoelectric device 112 is constituted from the lump containing layers 95 and the metal layers 93 other than the lump containing layer 95 that are stacked alternately one on another. Thus each of the piezoelectric layers 97 is sandwiched by the lump containing layer 95 and the metal layer 93. As every piezoelectric layer 97 that undergoes piezoelectric displacement is in contact with the lump containing layer 95 that has high stress relieving effect, the stress relieving effect can be enhanced further. Presence of the porous metal layers and the dense metal layers that are disposed alternately makes it possible to apply voltage via the metal layer 93 to the piezoelectric layer 97 so as to undergo piezoelectric displacement.

The lump containing layer 95 disposed on the opposite side of the piezoelectric layer 97 is porous and is therefore weak in the force of clamping the piezoelectric layer 97, thus generating less stress. As a result, the piezoelectric layer 97 is virtually free of clamping force, and is capable of generating a large displacement while relieving the stress generated between the metal layer 93 and the piezoelectric layer 97.

In the multi-layer piezoelectric device 112 where the lump containing layer 95 is used as the internal electrode, void ratio in the lump containing layer 95 is preferably in a range from 7% to 70%. By controlling the void ratio to 70% or lower, electrical conductivity of the lump containing layer 95 can be suppressed from decreasing, so as to put the adjacent piezoelectric layer in electric field of sufficient intensity and cause it to undergo a large amount of displacement. By controlling the void ratio to 7% or higher, on the other hand, it is made possible to suppress the bonding strength of the piezoelectric layer that adjoins the lump containing layer 95 from becoming too strong. As a result, cracks are likely to occur in the interface between the lump containing layer 95 and the piezoelectric layer 97 during operation, thereby suppressing the cracks from occurring in the piezoelectric layer.

In order to increase the insulation property of the lump containing layer 95, void ratio in the lump containing layer 95 is preferably in a range from 24% to 98%, more preferably from 24 to 90%. This enables it to achieve higher insulation property, less clamping force of the metal layer exerted on the piezoelectric layer and less stress during operation.

In order to increase the amount of displacement of the piezoelectric layer, void ratio is preferably in a range from 50% to 90%. In order to utilize thermal insulation effect and of air in the voids and improve the resistance to thermal shock of the multi-layer piezoelectric device, void ratio is more preferably in a range from 70% to 90%. To achieve a higher insulation, void ratio is more preferably 70% or higher.

The void ratio of the metal layers other than the lump containing layer is preferably in a range from 0.1% to 40% in order to achieve high electrical conductivity and efficiently apply voltage to the piezoelectric layer. In order to increase the electrical conductivity further and cause the piezoelectric layer to undergo larger displacement, void ratio is preferably in a range from 0.1% to 20%.

In the multi-layer piezoelectric device 112, it is preferable that the lump containing layers 95 are disposed in the stacking direction on both ends of plural metal layers. In the multi-layer piezoelectric device 112, high stress is likely to be generated in the interface with the ceramic layer (inactive layer) 99. Therefore, it is preferable to use the lump containing layer 95 for the metal layer that adjoins the ceramic layer 99. Furthermore it is preferable to make the void ratio in the lump containing layer 95 that adjoins the ceramic layer 99 higher, among plural lump containing layers 95.

In the multi-layer piezoelectric device 112 where the lump containing layer 95 is used as the internal electrode, the lump containing layer 95 is preferably used as the positive electrode. The interface between the piezoelectric layer and the metal layer where stress is concentrated is subject to localized deformation caused by local concentration of electric field due to the edge effect. At the same time, phase transition in the crystal structure of the piezoelectric layer may occur due to the stress, resulting in local heating. When the partial pressure of oxygen associated with the oxygen ions of the piezoelectric layer due to this heat is higher than the partial pressure of oxygen around the multi-layer piezoelectric device, oxygen holes that transmit the ions may be generated locally in the piezoelectric layer, thus causing the characteristics of the multi-layer piezoelectric device to change.

Moreover, since the ionized oxygen hole has negative charge, migration of the ionized oxygen hole is more likely to occur in the metal layer on the positive electrode side than in the metal layer on the negative electrode side. Accordingly, supply of oxygen to around the piezoelectric layer can be enhanced by increasing the void ratio in the metal layer on the positive electrode side, so that the generation of oxygen holes is suppressed and durability can be suppressed from decreasing.

Figure 27:
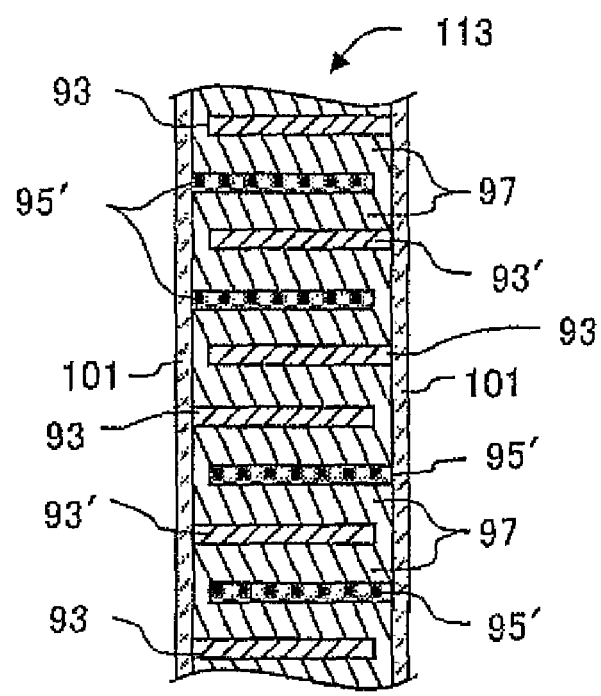
FIG. 27 is a sectional view showing a multi-layer piezoelectric device according to further another embodiment of the present invention.

FIG. 27 is a sectional view of a multi-layer piezoelectric device 113 according to further another embodiment of the present invention. As shown in FIG. 27, the multi-layer piezoelectric device 113 is constituted from the metal layers 93 that include metal component $M_1$ and the lump containing layers 95' that are stacked one on another via the piezoelectric layer 97. The plurality of metal layers include a plurality of dense metal layers 93' that have less voids than the lump containing layers 95' that adjoin therewith on both sides in the stacking direction. The metal layers 95' are lump containing layers.

When the device has only one lump containing layer 95' that has high stress relieving effect, stress generated in the device tends to concentrate around the lump containing layer 95'. Since the piezoelectric layer 97 that contacts the metal layer 93 adjacent to the lump containing layer 95' undergoes displacement, stress is likely to concentrate in the piezoelectric layer that is disposed between the metal layer 93 adjacent to the lump containing layer 95' and the device surface.

This stress concentration can be mitigated by sandwiching the piezoelectric layer that is disposed between the metal layer 93 and the device surface with the lump containing layer 95' that have high stress relieving effect. Moreover, very high stress relieving effect can be achieved since two stress relieving layers (lump containing layer 95') disposed near to each other cooperate to achieve the effect.

In addition, in such a constitution as shown in FIG. 27 where polarity of the external electrodes connected to the dense metal layer 93' that is sandwiched by the lump containing layers 95' is changed alternately, the stress generated by the clamping force of the external electrodes exerted on the dense metal layer 93' can be uniformly distributed. This constitution further improves the stress relieving effect.

In the multi-layer piezoelectric device of the present invention, it is preferable that the two metal layers that adjoin the lump containing layer on both sides thereof in the stacking direction are connected to the external electrodes of different polarities, so that the stress generated in the stack can be effectively absorbed by the lump containing layer during operation of the device. In case the lump containing layer is disposed between two piezoelectric layer that are sandwiched by the adjoining internal electrodes of the same polarity, the piezoelectric layer that adjoins the lump containing layer does not undergo displacement when voltage is applied to the internal electrode. In case the lump containing layer is disposed between two internal electrodes of the same polarity, stress tends to concentrate in the border between a portion that undergoes displacement and a portion that does not undergo displacement. Such a stress concentration does not occur when the lump containing layer is sandwiched by the external electrodes of different polarities.

Figure 28A:
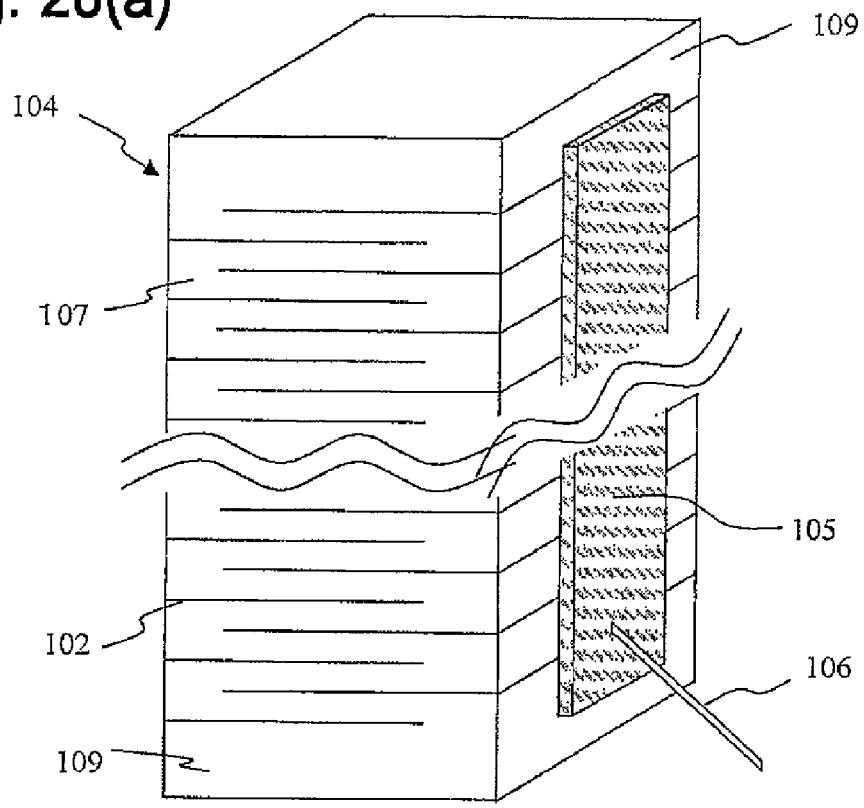
FIG. 28(a) is a perspective view showing a multi-layer piezoelectric device according to further another embodiment of the present invention.
Figure 28B:
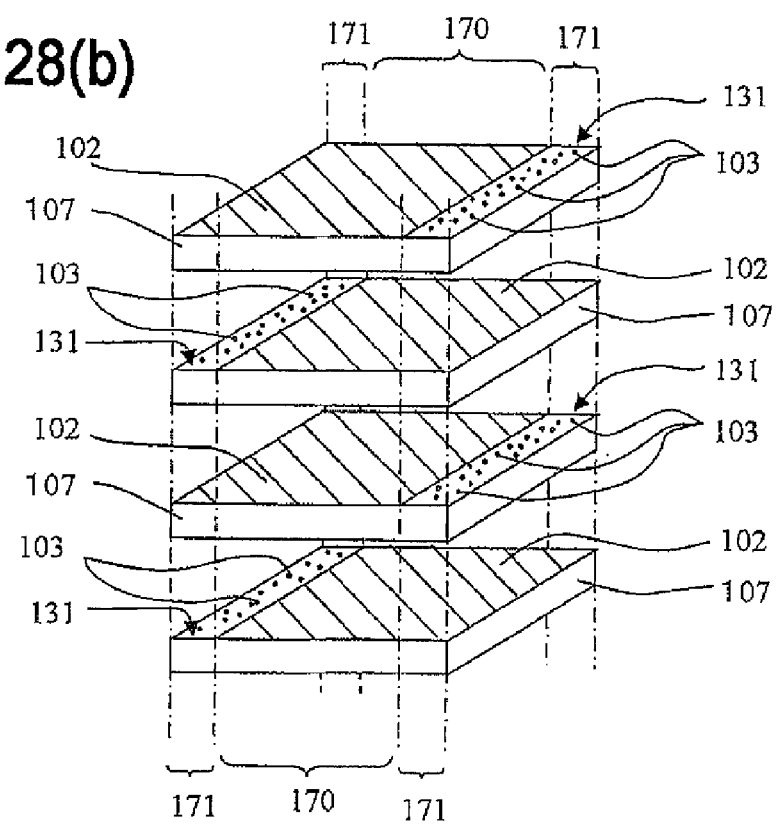
FIG. 28(b) is an exploded view explanatory of the state of piezoelectric layers and internal electrode layers being stacked in the multi-layer piezoelectric device.

FIG. 28(a) is a perspective view showing the multi-layer piezoelectric device according to this device. FIG. 28(b) is a partial sectional view showing the state of the piezoelectric layers and the internal electrode layers (metal layers) being stacked in the multi-layer piezoelectric device.

As shown in FIG. 28(a) and FIG. 28(b), the multi-layer piezoelectric device has a stack 104 formed by stacking a plurality of piezoelectric layers 107 via internal electrode layers 102. The stack 104 has, formed on the side face thereof, a pair of external electrodes 105 connected to plural internal electrode layers 102 in every other layer. The plurality of internal electrode layers 102 are not formed over the entire principal surface of the piezoelectric layer 107, so that the so-called partial electrode structure is formed where the internal electrode layer 102 has a surface area smaller than the area of the principal surface of the piezoelectric layer 107. The internal electrode layers 102 are exposed alternately on either of the opposing side faces of the stack 104.

In this multi-layer piezoelectric device, since the internal electrode layers 102 are formed in the partial electrode structure as described above, when a voltage is applied across the external electrodes 105, 105, only the portion of the piezoelectric layer 107 that is interposed between two internal electrode layers 102 from above and below, namely the region where one of the internal electrode layers 102 overlaps the other internal electrode layer 102 in the stacking direction (displacement portion 170), undergoes displacement. The piezoelectric layer 107 does not undergo displacement in the portion thereof where the internal electrode layer 102 is not formed (peripheral area 131) as shown in FIG. 28(b) (undisplaceable portion 171).

In case the multi-layer piezoelectric device of the present invention is used as a piezoelectric actuator, lead wires 106 are connected to the external electrodes 105 by soldering, with the lead wires 106 being connected to an external voltage source. When a predetermined voltage is applied across the pair of external electrodes 105, 105 from the external voltage source via the lead wires 106, the piezoelectric layers 107 undergo displacement due to reverse piezoelectric effect.

As shown in FIG. 28(b), the multi-layer piezoelectric device has a plurality of peripheral areas 131 located between the two piezoelectric layers 107, 107 that are disposed consecutively in the stacking direction and are located between the edge 102a of the internal electrode layer 102 and the side face 104a of the stack 104. In the multi-layer piezoelectric device of this embodiment, an area where a plurality of ceramic lumps 103 and/or metallic lumps (partial metallic layer) 103 are dispersed is formed in at least one of the peripheral areas 131.

As shown in FIG. 28(b), the lumps 103 are scattered over almost the entire peripheral areas 131. Instead of the lumps 103, other material that can deform more easily than the piezoelectric ceramics may be scattered. The word "deformation" here covers any type of deformation such as elastic deformation, plastic deformation and brittle deformation.

Figure 29:
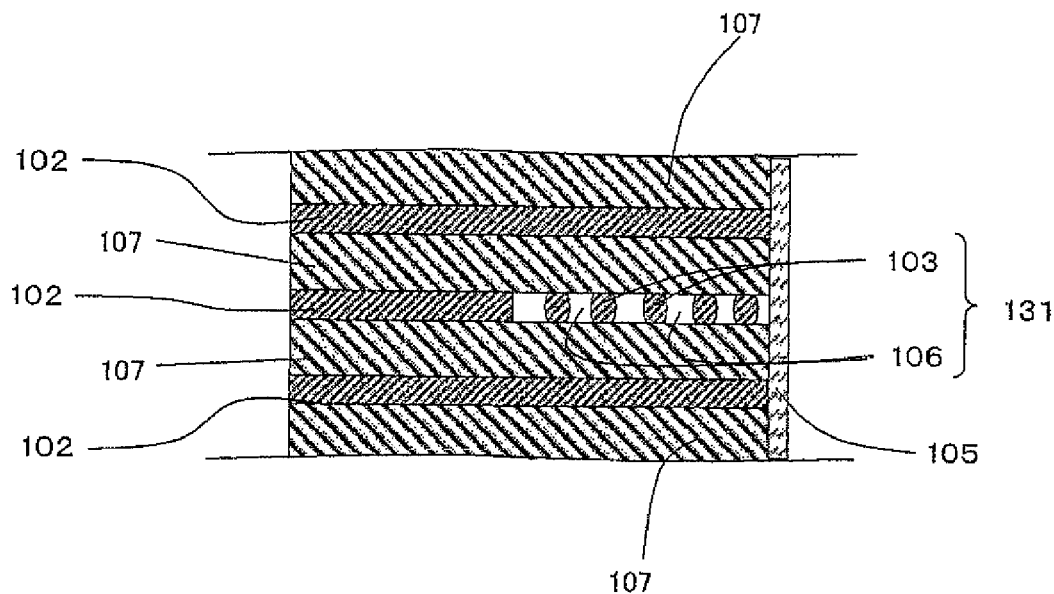
FIG. 29 is a sectional view showing a peripheral portion of the device shown in FIG. 28.

The lumps 103 are scattered in the peripheral areas 131 while being isolated from the internal electrode 102. The phrase "scattered while being isolated from the internal electrode 102" means that plural lumps 103 are not in electrical continuity with the internal electrodes 102 and the lumps 103 are isolated from each other so as not in electrical continuity with each other (FIG. 29).

There is no restriction on the position of the stack 104 where the lumps 103 are to be dispersed, among plural peripheral areas 131 included in the stack 104. For example, the lumps 103 may be scattered in all of the peripheral areas 131 (the peripheral areas 131 that adjoin all of the internal electrode layers 102), or the lumps 103 may be scattered in arbitrarily selected peripheral areas 131. In the first embodiment, there are a plurality of the peripheral areas 131 wherein the lumps 103 are scattered, and the lumps 103 are disposed at intervals of two or more piezoelectric layers 107 in the stacking direction of the stack 104.

The lumps 103 may be formed from the same material as that used to form the piezoelectric layer or the internal electrode layer 102, and are preferably formed from PZT or a silver-palladium alloy. The silver-palladium alloy is a pliable metal that deforms relatively easily, and therefore even a low content thereof can reduce the restrictive force of the undisplaceable portion. The silver-palladium alloy is also resistant to fatigue and has high resistance against oxidization, and is therefore capable of suppressing the durability of the multi-layer piezoelectric device from deteriorating. There are no restrictions on the shape and size of the lumps 103 and on the number of the lumps 103 formed in the peripheral area 131. Minimum requirement is that the lumps 103 are scattered as described above.

Specifically, the proportion of the total area of the lumps 103 to the area of the peripheral area 131, when the peripheral area 131 having the lumps 103 formed therein is viewed in the stacking direction of the stack 104, is preferably from 0.1 to 50%, more preferably from 5 to 30%.

When the proportion of the area occupied by the lumps 103 is not less than 0.1%, the effect of reducing the restrictive force of the undisplaceable portion that restricts the displacement of the displacement portion is obtained. When the proportion of the lumps 103 is not more than 50%, the strength against breakage and the insulation capability can be suppressed from decreasing.

There is no restriction on the maximum size r of the lumps 103 viewed in the stacking direction of the stack 104. Maximum size r of the lumps 103 is preferably not larger than one half and more preferably not larger than one tenth of the minimum distance L between the internal electrode layer 102 and the external electrode 105 in the peripheral area 131. For example, in case the minimum distance L is about 1 mm, maximum size r of the region 3 is preferably 500 µm or less, more preferably 100 µm or less, which enables it to maintain the strength against breakage and the insulation capability at appropriate levels.

In this embodiment, the peripheral area 131 where the lumps 103 are scattered includes insulating ceramics regions in part or the entire area between adjoining lumps 103, so that the insulating ceramics regions connect the adjoining piezoelectric layers 107, 107 together. While there is no restriction on the kind of ceramic material that is disposed between the adjoining lumps 103 and connects the adjoining piezoelectric layers 107 together, it is preferably the same material as that of the piezoelectric layers 107.

In case lead titanate zirconate is used as the material to form the piezoelectric layers 107, it is preferable to use lead titanate zirconate as the insulating ceramic material that connects the piezoelectric layers 107 together in the peripheral area 131. This constitution prevents troubles arising from the difference in thermal expansion and achieves higher bonding strength between the piezoelectric layers 107.

The peripheral areas 131 where the lumps 103 are scattered are preferably disposed at equal intervals in the stacking direction of the stack 104. Specifically, it is preferable that a plurality of the lumps 103 are scattered in plural peripheral areas 131, that are located between the edges 102a of plural internal electrode layers 102 located at equal intervals via two or more piezoelectric layers 107, which are selected from among plural piezoelectric layers 102, and the side face 104a of the stack 104. As the lumps 103 are scattered in plural peripheral areas 131 that are selected so as to be located at equal intervals, displacement performance and strength against breakage can be set in a more well-balanced manner.

There is no restriction on the kind of material of the piezoelectric layer 107, for which various piezoelectric ceramics may be used. For example, a compound having Bi layer lattice (perovskite type compound having layered lattice), tungsten bronze type compound, Nb-based perovskite type compound (niobate alkaline compound (NAC) such as sodium niobate), niobate alkaline earth compound (NAEC) such as barium niobate, lead magnesium niobate (PMN), lead nickel niobate (PNN), lead titanate zirconate (PZT) containing Pb, lead titanate or other perovskite type compound may be used.

Among these, a perovskite type compound containing at least lead is preferably used. For example, it is preferable to use a material containing lead magnesium niobate (PMN), lead nickel niobate (PNN), lead titanate zirconate (PZT) containing Pb or lead titanate. Among these, lead titanate zirconate or lead titanate is preferably used in particular, in order to achieve a large amount of displacement. The piezoelectric ceramic material preferably has a high value of piezoelectric strain constant $d_{33}$ which represents the piezoelectric characteristic.

The internal electrode layer 102 may be formed from such materials as gold, silver, palladium, platinum, copper, aluminum or an alloy thereof. As an alloy, for example, silver-palladium alloy may be used. The thickness of the internal electrode layer 102 should be such that ensures electrical conductivity and does not impede displacement, and is generally in a range from about 0.5 to 7 µm, and preferably from about 1 to 5 µm.

The thickness of the piezoelectric layer 1, namely the distance between the internal electrode layers 2 is preferably in a range from about 50 to 200 µm. When the piezoelectric layer 107 has a thickness in the range described above, the actuator can be made in compact and low-profile construction, and insulation breakdown can be suppressed from occurring. The external electrodes 105 may be formed from such materials as gold, silver, palladium, platinum, copper, aluminum, nickel or an alloy thereof.

Then a silver powder, a glass powder and a binder are mixed to prepare an electrically conductive silver-glass paste in order to make the multi-layer piezoelectric device from the ceramic member of this embodiment. The electrically conductive paste is printed on the opposing side faces 104a, 104a of the stack 104 by a method such as screen printing or the like and is, after being dried, baked at a temperature in a range from 500 to 800° C. thereby forming the external electrodes 105. Instead of printing, a sheet with thickness of 5 µm or less formed by drying the silver-glass paste may be attached by baking.

Then the stack 4 having the external electrodes 105 formed thereon is dipped in a silicone rubber solution. After deaerating the silicone rubber solution in vacuum, the stack 104 is pulled out of the silicone rubber solution with the side faces of the stack 104 being coated with the silicone rubber. Then the silicone rubber coating on the side faces of the stack 104 is cured thereby to complete the multi-layer piezoelectric device of this embodiment.

Last, lead wires are connected to the external electrodes 105, and DC voltage of 3 kV/mm is applied across the pair of external electrodes 105 via the lead wires so as to apply polarization treatment to the stack 104, thereby to complete the piezoelectric actuator that employs the multi-layer piezoelectric device of the present invention. The lead wires are connected to an external voltage source that supplies the voltage via the lead wires and the external electrodes 105 to the metal layers 102, so that the piezoelectric layers 107 undergo significant displacement due to reverse piezoelectric effect. Thus the device functions as, for example, an automobile fuel injection valve that injects fuel to an engine.

Injection Apparatus

Figure 30:
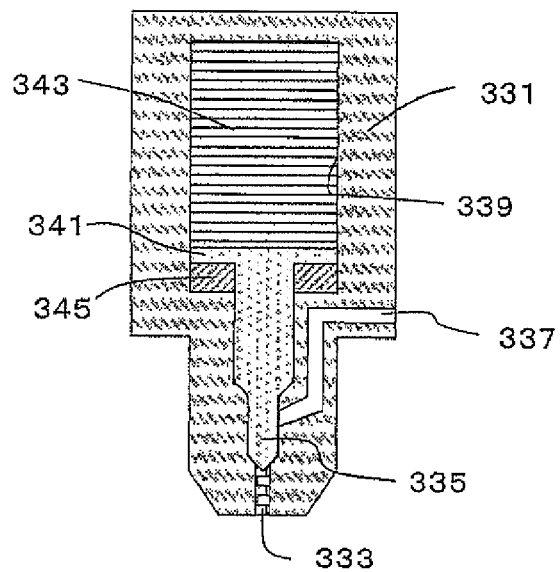
FIG. 30 is a sectional view showing an injection device according to one embodiment of the present invention.

FIG. 30 is a schematic sectional view of an injection apparatus according one embodiment of the present invention. As shown in FIG. 30, the injection apparatus of this embodiment has the multi-layer piezoelectric device of the present invention represented by the embodiments described above in a container 331 that has an injection hole 333 formed at one end thereof. The container 331 includes a needle valve 335 capable of opening and closing the injection hole 333 disposed therein.

The injection hole 333 is connected to a fuel passage 337 that is capable of communicating therewith in response to the motion of the needle valve 335. The fuel passage 337 is connected to a fuel source provided outside, so that a fuel is supplied through the fuel passage 337 at a constant pressure that is always high. Accordingly, when the needle valve 335 opens the injection hole 333, the fuel supplied to the fuel passage 337 is injected at a high constant pressure into a fuel chamber of an internal engine which is not shown.

The needle valve 335 has a top portion that has a larger inner diameter, and a piston 341 is disposed so as to be capable of sliding in a cylinder 339 that is formed in the container 331. The piezoelectric actuator 343 having the multi-layer piezoelectric device described above is housed in the container 331.

With the injection apparatus as described above, when the piezoelectric actuator 343 is caused to expand by applying a voltage thereto, the piston 341 is pressed so that the needle valve 335 plugs the injection hole 333 and shuts off the fuel supply. When the voltage is removed, the piezoelectric actuator 343 contracts and a Belleville spring 345 presses back the piston 341 so that the injection hole 333 communicates with the fuel passage 337 thereby allowing the fuel to be ejected.

The injection apparatus of the present invention may also be constituted from the container having the injection hole and the multi-layer piezoelectric device, so that the liquid that fills the container is discharged through the injection hole by the operation of the multi-layer piezoelectric component. That is, the device may not necessarily be disposed in the container. The only requirement is that pressure is applied to the inside of the container by the operation of the multi-layer piezoelectric device. In the present invention, the liquid includes fuel, ink and various other liquids such as electrically conductive paste.

Fuel Injection System

Figure 31:
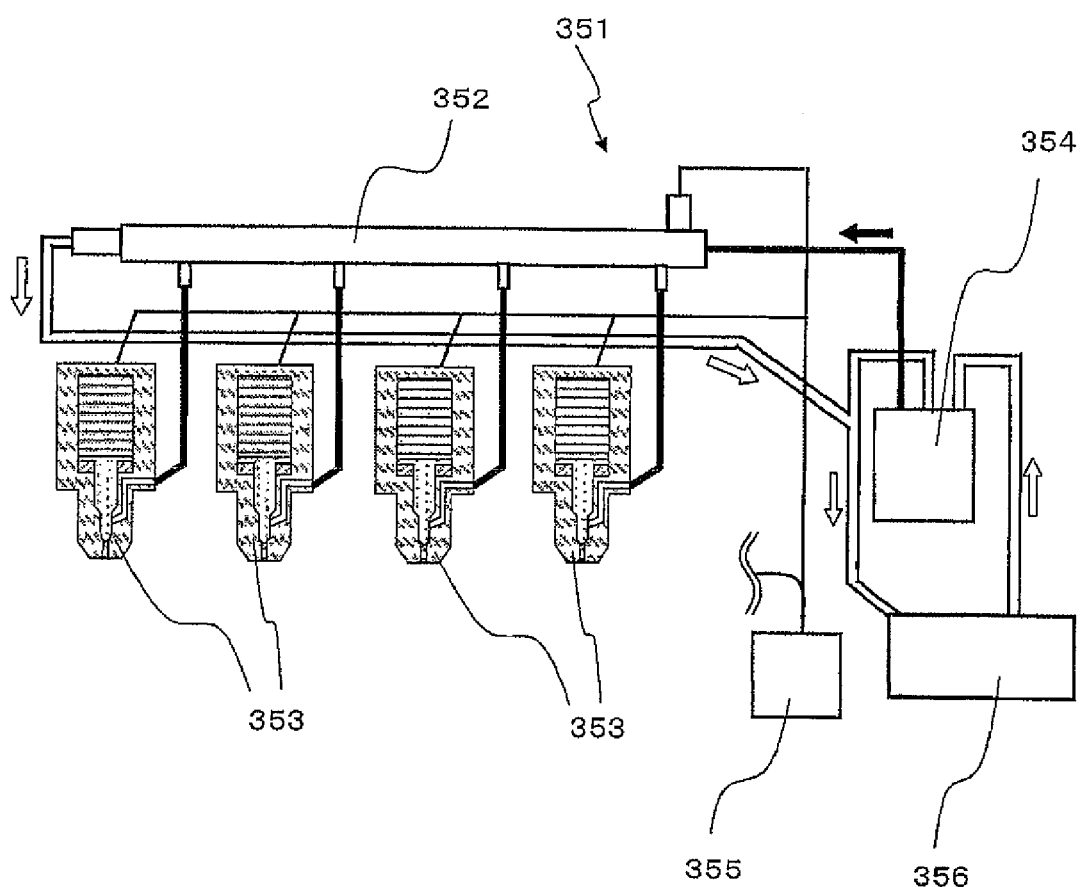
FIG. 31 is a schematic diagram showing a fuel injection system according to one embodiment of the present invention.

FIG. 31 is a schematic diagram showing a fuel injection system according to one embodiment of the present invention. As shown in FIG. 31, the fuel injection system 351 of this embodiment comprises a common rail 352 that stores a high-pressure fuel, a plurality of the injection apparatuses 353 that eject the fuel stored in the common rail 352, a pump 354 that supplies the high-pressure fuel to the common rail 352 and an injection control unit 355 that sends a drive signal to the injection apparatus 353.

The injection control unit 355 controls the amount of fuel to be injected and the timing of injection while monitoring the condition inside of the engine combustion chamber by means of sensor or the like. The pump 354 boosts the pressure of the fuel to a level from 1,000 to 2,000 atm, preferably from 1,500 to 1,700 atm from a fuel tank 356, and supplies the fuel to the common rail 352.

The common rail 354 stores the fuel that is supplied from the pump 354, and sends it to the injection apparatus 353 as required. The injection apparatus 353 injects a small amount of fuel through the injection hole 333 in the form of mist into the combustion chamber.

OTHER EMBODIMENTS

Other First Embodiment

Figure 32:
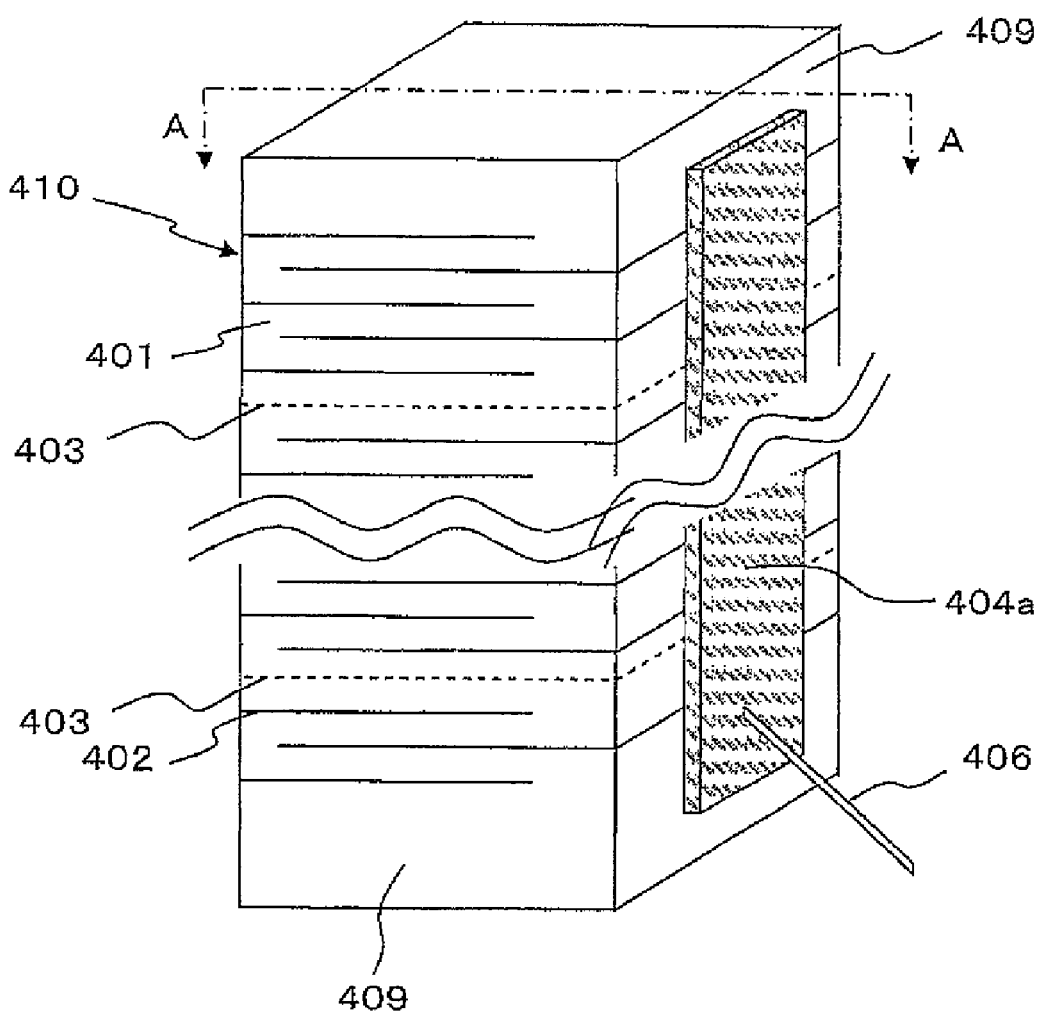
FIG. 32 is a perspective view showing a multi-layer piezoelectric device according to further another embodiment of the present invention.
Figure 33:
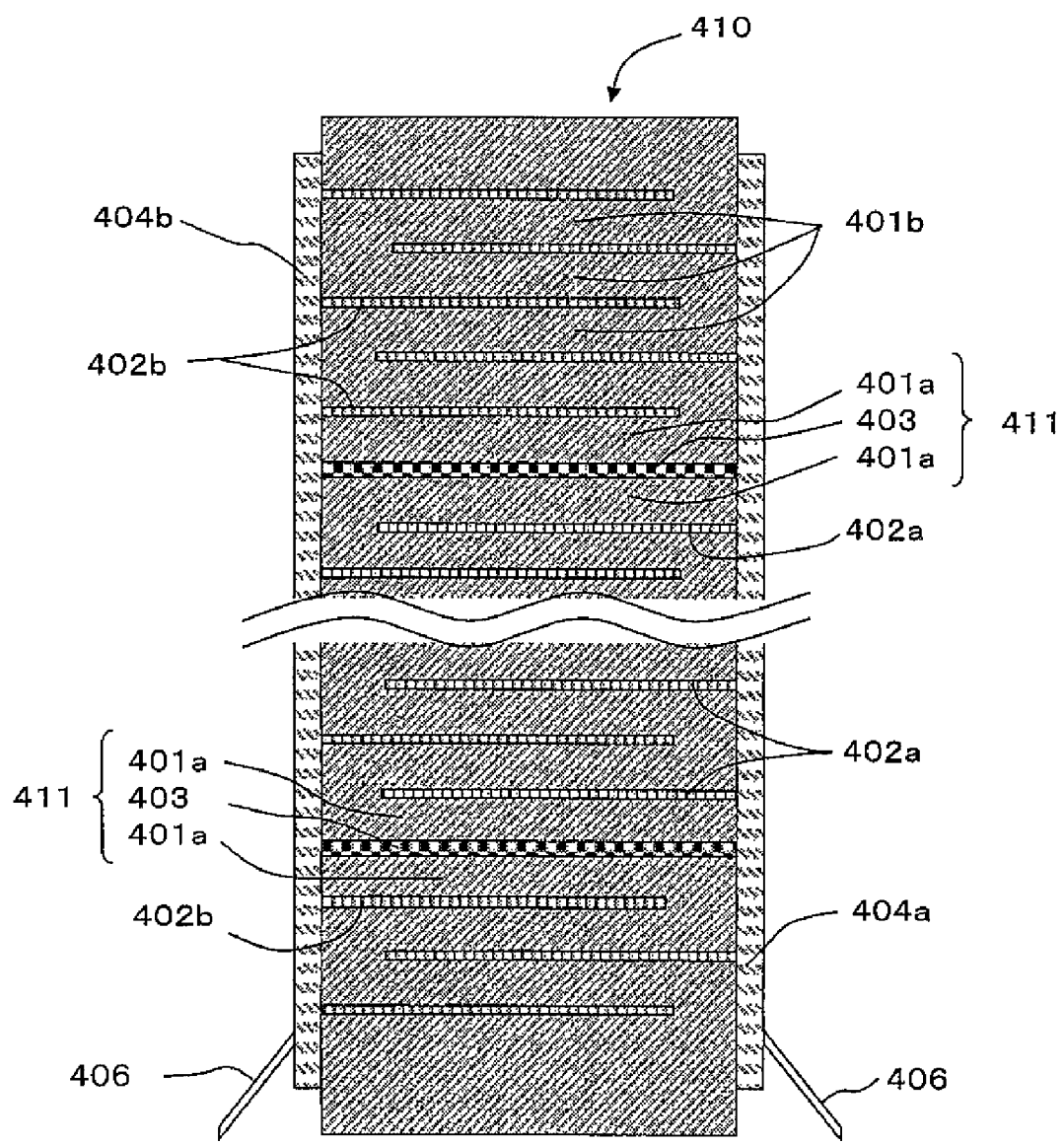
FIG. 33 is a sectional view taken along lines A-A in FIG. 32.
Figure 34:
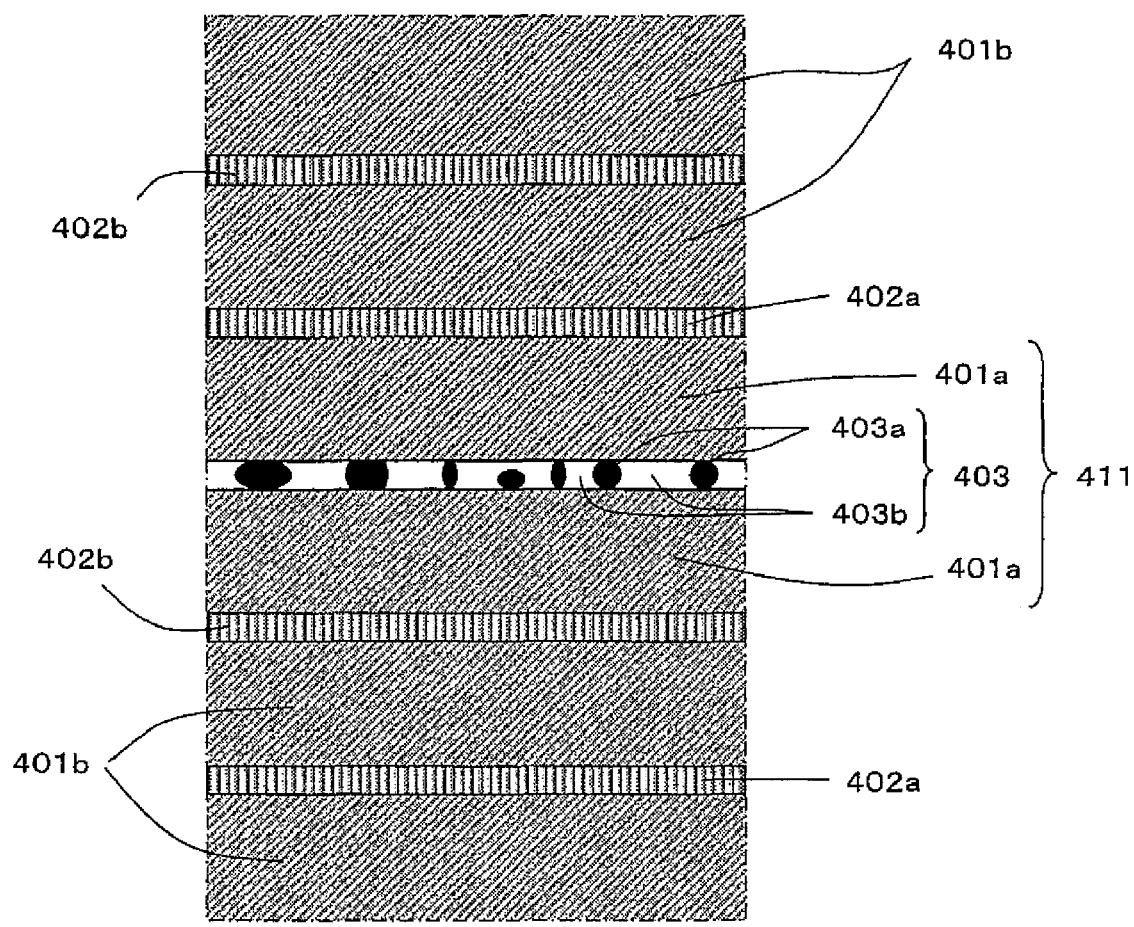
FIG. 34 is an enlarged sectional view of a portion around a composite layer of a device according to further another embodiment of the present invention.

FIG. 32 is a perspective view of a multi-layer piezoelectric device according to other first embodiment of the present invention. FIG. 33 is a sectional view taken along lines A-A in FIG. 32. FIG. 34 is an enlarged sectional view including a composite layer of the present invention.

As shown in FIG. 32 and FIG. 33, the multi-layer piezoelectric device of this embodiment has the stack 410 formed by stacking a plurality of piezoelectric layers 1 via internal electrode layers 402, with a pair of external electrodes 404a, 404b bonded on opposing side faces of the stack for electrically connecting the internal electrode layers 402 on the end thereof in every other layer. Lead wires 406 are connected to the external electrodes 404a, 404b by soldering or the like. The internal electrode layers 402 comprise a first internal electrode layer 402a that is connected to the positive external electrode 404a and a second internal electrode layer 402b that is connected to the negative external electrode 404b.

As shown in FIG. 33 and FIG. 34, the multi-layer piezoelectric device of this embodiment has such a constitution as composite layer 411 consisting of two piezoelectric layers 401a, 401a and lump containing layer (inorganic layer) 403 that is disposed between the piezoelectric layers 401a, 401a and consists of a plurality of lumps (inorganic composite material) 403a disposed separately, the composite layer 411 being disposed between the adjacent internal electrode layers 402a, 402b of different polarities.

The composite layer 411 has the lump containing layer 403 that has lumps 403a dispersed between the piezoelectric layers 401a, 401a sandwiched by the internal electrode layers 402a, 402b of different polarities, and therefore when a voltage is applied across the internal electrode layers 402a, 402b, the piezoelectric layer 401a that adjoins the lump containing layer 403 is subjected to lower electric field than the other piezoelectric layer 401b is. As a result, the piezoelectric layer 401a that adjoins the lump containing layer 403 undergoes less strain than the other piezoelectric layer 401b does. Thus the composite layer 411 that comprises the piezoelectric layers 401a, 401a and lump containing layer 403 can effectively absorb the stress generated by the strain of the stack 411 as a whole. As a result, the multi-layer piezoelectric device of high durability can be made where the piezoelectric layer is prevented from being subjected to excessive stress even when the device is operated over a long period of time under a high electric field and high pressure.

As the composite layer is provided, beat sound can be suppressed from being generated by the resonance caused by synchronized displacing movements of the piezoelectric layer. Generation of noise can also be suppressed by suppressing the generation of harmonic components having frequencies integer times the frequency of the drive voltage. Also because the composite layer improves the durability of the device, displacement characteristic can be suppressed from changing with time, thus maintaining stable amount of displacement over a long period of continuous operation.

The size of the lump 403a is preferably such that length in the direction perpendicular to the stacking direction of the stack 410 is in a range from 0.1 to 100 μm. By setting the length of the lumps that constitute the lump containing layer 403 in a range from 0.1 to 100 μm, it is made possible to decrease the electric field that is imposed on the piezoelectric layer 401a disposed on both sides of the lump containing layer 403, decrease the strain of the piezoelectric layer 401a and distributing the stress generated by the expansion and contract of the stack 410 so as to absorb the stress. Length of the lumps 403a is more preferably in a range from 1 to 10 μm. The lumps 403a may have spherical or any other shape. The lump containing layer 403 may be formed in part or the entire area between the piezoelectric layer.

It is preferable that the lump containing layer 403 has more voids 403b (low dielectric material) than the internal electrode 402 has. Number of the voids can be compared by measuring the void ratio. With the proportion (void ratio) of the voids 403b in the lump containing layer 403 set to be larger than that in the internal electrode 402, the piezoelectric layer 401a that adjoins the lump containing layer 403 is subjected to lower electric field in comparison to the other piezoelectric layer 1b, and it is made possible to further decrease the stress.

Void ratio in the lump containing layer 403 is preferably from 10 to 95%, more preferably from 40 to 90%, in order to effectively reduce the electric field that is imposed on the piezoelectric layer 401a that adjoins the piezoelectric layer 401a by scattering the lumps 403a.

Moreover, it is preferable that the composite layer 411, consisting of two piezoelectric layer 401a that are stacked between the adjacent internal electrode layers 402a, 402b of different polarities and the lump containing layer 403 that is disposed between these piezoelectric layer and consists of a plurality of lumps 403a disposed separately, is disposed on one end or on both ends of the stack 410 in the stacking direction. That is, while the inactive layers 409 that do not undergo piezoelectric displacement when voltage is applied is disposed on both ends of the stack 410 in the stacking direction, significant stress is generated in the interface between the piezoelectric layer 1 that undergoes piezoelectric displacement and the inactive layers 409 that do not undergo piezoelectric displacement. By disposing the composite layer 411 on the side of the end of the stack 410 in the stacking direction, it is made possible to significantly reduce the stress generated between the inactive layer 409 and the piezoelectric layer 1, and suppress cracks from occurring in the piezoelectric layer 1 due to the stress generated near the inactive layer 409 during operation.

The expression "on the side of the end of the stack 410 in the stacking direction" means the vicinity of the inactive layer 409 disposed on the end of the stack 410 in the stacking direction. It is preferable that the composite layer 411 is disposed within a range from the inactive layer 409 to the 25$^{th}$ piezoelectric layer 1, more preferably from the inactive layer 409 to the tenth piezoelectric layer 1. When there are a plurality of lump containing layers 403, it is preferable that the composite layer 411 is formed on the end of plural lump containing layers 403 in the stacking direction.

It is preferable that the stack 410 has stress relieving regions, that include a plurality of piezoelectric layers which are thicker than the piezoelectric layer 1 disposed at the center, on one or both ends thereof in the stacking direction, and the stress relieving region has the composite layer. In this constitution, since the stress relieving regions disposed on the end in the stacking direction has a plurality of piezoelectric layers which are thicker than the piezoelectric layer 1 disposed at the center, strain generated when voltage is applied is smaller than that generated in the piezoelectric layer 1 disposed at the center. As a result, it is made possible to decrease the stress generated near the interface between the inactive layer 409 that is not subject to strain as no voltage is applied thereto and the active layer that is subject to strain as voltage is applied thereto. Also because the composite layer 411 is provided in the stress relieving region, it is made possible to decrease the stress generated near the inactive layer 409 during operation more effectively than in the case where only the stress relieving region is provided. As a result, the multi-layer piezoelectric device that maintains high durability even when the device is operated over a long period of time under a high electric field and high pressure can be provided.

When the lumps 403a that constitute the lump containing layer 403 are formed from a metallic material that has low Young's modulus, the metallic material can deform when the stack 410 deforms and stress is generated in the lump containing layer 403. Therefore, a large amount of displacement can be achieved as the lump containing layer 403 does not restrict the displacement.

It is preferable that the metal element that constitutes the lumps 403a is an alloy consisting of at least one kind selected from among Ni, Pt, Pd, Rh, Ir, Ru and Os which are metals of Group 8 to Group 10 of the Periodic Table, and at least one kind selected from among Cu, Ag and Au which are metals of Group 11 of the Periodic Table. This is because such a metal composition is advantageous in volume production when the alloy powder synthesizing technology available today is employed. The metal element that constitutes the lumps 403a may also be a metal element of Group 11 of the Periodic Table. Metal Ag or an alloy containing Ag as the main component is particularly preferable.

In case the lumps 403a that constitute the lump containing layer 403 are formed from a piezoelectric material, the piezoelectric material that constitutes the lumps 403a can deform under a compressive force, when the device is used under a high pressure and a high compressive force is applied to the lump containing layer 403. As a result, stress does not concentrate and cracks can be suppressed from occurring in the piezoelectric layer 1.

The lumps 403a that constitute the lump containing layer 403 are preferably formed from a metallic material and a piezoelectric material, because the metallic material has a low Young's modulus and therefore does not restrict the displacement so that the piezoelectric material can deform under a high compressive force.

It is preferable that the metallic material that constitutes the lump containing layer 403 is the same as the main component of the internal electrode 402. By making the metallic material the same as the main component of the internal electrode 402, it is made possible to fire the piezoelectric layer 1, the metallic material and the main component of the internal electrode 402 at the same time, so that the multi-layer piezoelectric device can be manufactured at a low cost. In addition, it is made possible to suppress the occurrence of delamination due to mismatch of shrinkage between the internal electrode 402 and the metallic material by making the main component of the metallic material to the same as that of the internal electrode 402 during firing.

It is preferable that the piezoelectric material that constitutes the lump containing layer 403 is the same as the main component of the piezoelectric material layer 1. By making the piezoelectric material that constitutes the lump containing layer 403 the same as the main component of piezoelectric material layer 1, it is made possible to fire the piezoelectric layer 1, the internal electrode 402 and the lump containing layer 403 at the same time, so that the multi-layer piezoelectric device can be manufactured at a low cost. In addition, it is made possible to suppress the occurrence of delamination due to mismatch of shrinkage between the piezoelectric material layer 1 and the lump containing layer 403.

An inorganic paste used to form the lump containing layer 403 is prepared as follows. In case the lumps 403a are formed from a metallic material, the inorganic paste is prepared by mixing a metal powder consisting mainly of silver or an alloy such a silver-palladium containing silver as the main component, a binder and a plasticizer. In case the lumps 403a are formed from a piezoelectric material, the inorganic paste is prepared by mixing a calcined powder such as PZT, a binder and a plasticizer. In case the lumps 403a are formed from a metallic material and a piezoelectric material, the inorganic paste is prepared by mixing a metal powder consisting mainly of silver or an alloy such a silver-palladium containing silver as the main component and a calcined powder such as PZT, a binder and a plasticizer.

The lump containing layer 403 having any desired void ratio can be formed by having an inorganic material such as acrylic beads contained in the inorganic paste. This makes it possible to form the lump containing layer 403 that has the desired void ratio.

Figure 35:
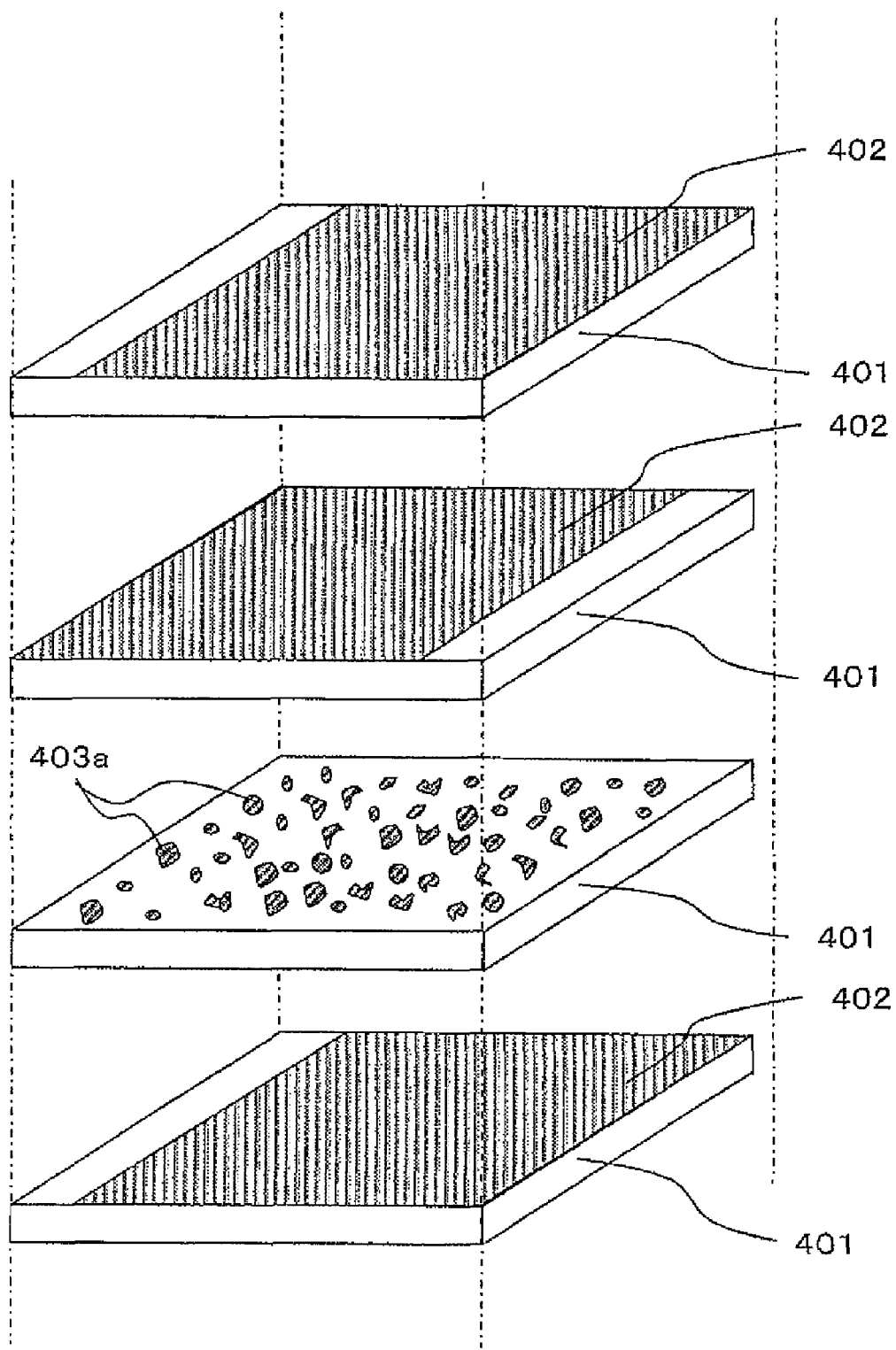
FIG. 35 is a partially cutaway perspective view showing the structure of internal electrode and composite layer according to further another embodiment of the present invention.

As shown in FIG. 35, the green sheets having the electrically conductive paste that would form the internal electrode 402 printed thereon are stacked on both sides of the green sheets having the inorganic paste that would form the lump containing layer 403 printed thereon, so that the polarities become opposite. This makes it possible to form the composite layer 411 comprising two piezoelectric layers 401a disposed between adjacent internal electrodes 402 of different polarities, and lump containing layer 403 that is disposed between the piezoelectric layers 401a and consists of a plurality of lumps 403a scattered therein.

The stress relieving region that includes a plurality of piezoelectric layers which are thicker than the piezoelectric layer disposed at the center can be formed by stacking a plurality of green sheets, which are thicker than the green sheets that would form the piezoelectric layer 1 disposed at the center, on one end or both ends in the stacking direction. To this stress relieving layer, as described previously, the green sheets having the electrically conductive paste that would form the internal electrode 402 printed thereon are stacked on both sides of the green sheets having the inorganic paste that would form the lump containing layer 403 printed thereon, so that the polarities become opposite. Thus the stack 410 having the composite layer 411 provided in the stress relieving region can be made.

Other Second Embodiment

Figure 36:
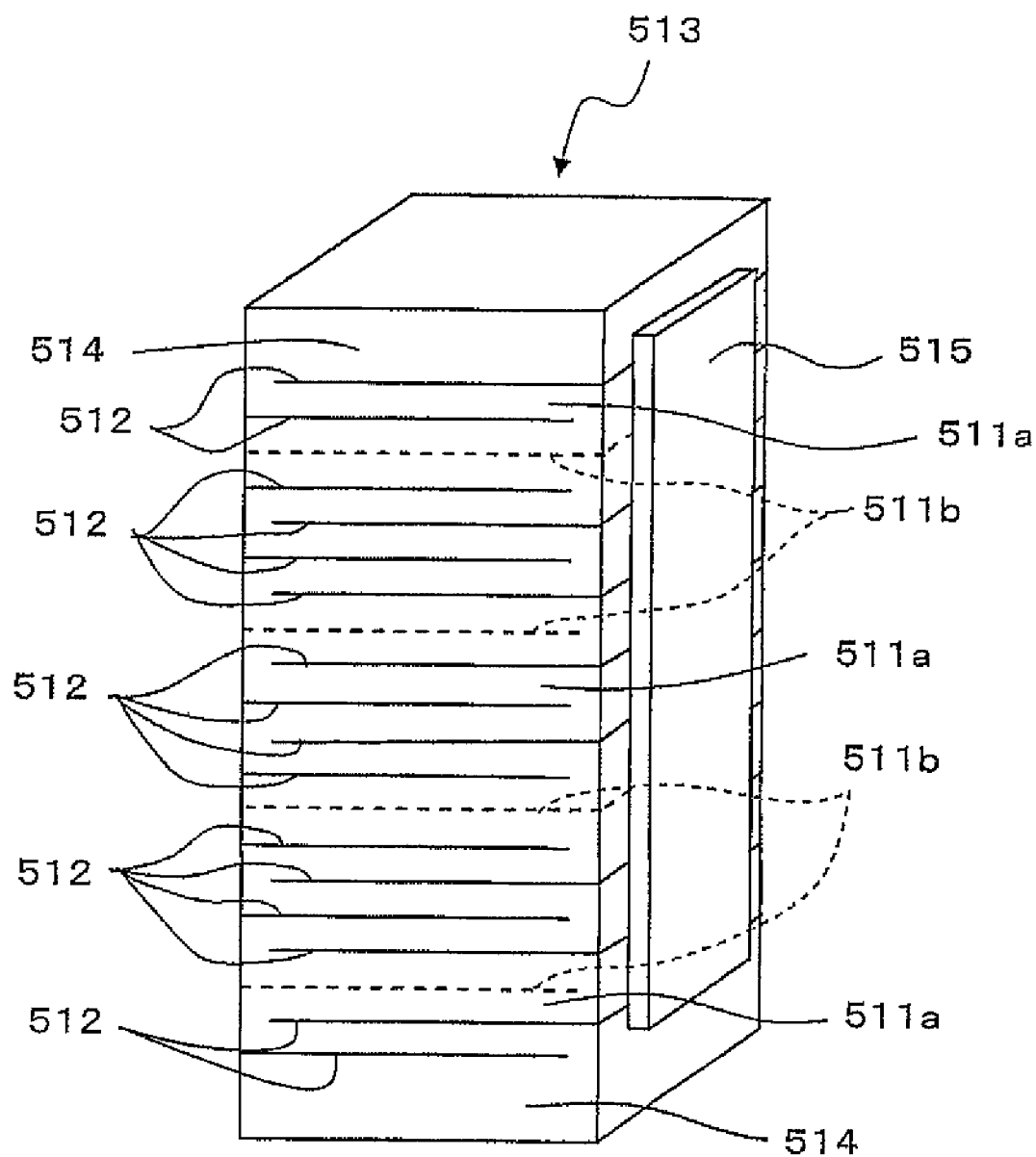
FIG. 36 is a perspective view showing a multi-layer piezoelectric device according to further another embodiment of the present invention.
Figure 37:
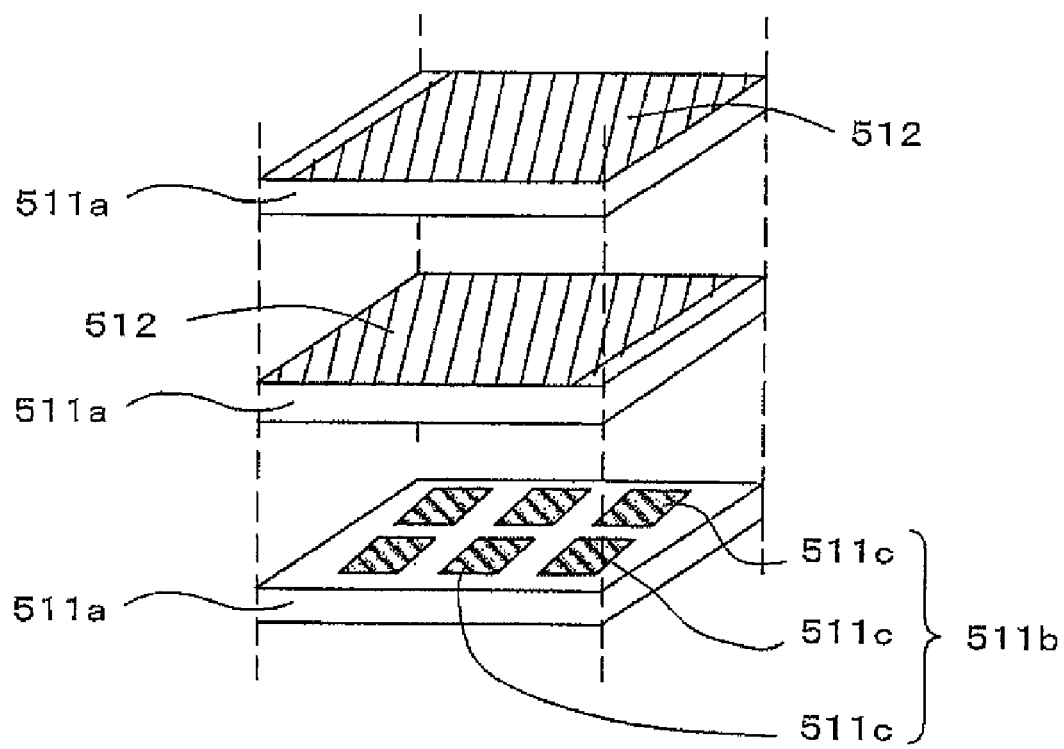
FIG. 37 is a partial perspective view showing the state of the piezoelectric layer and the internal electrode being stacked one on another in the multi-layer piezoelectric device shown in FIG. 36.

FIG. 36 is a perspective view of a multi-layer piezoelectric device according to other second embodiment of the present invention. FIG. 37 is a partial perspective view showing the piezoelectric layer and the internal electrode of FIG. 36 stacked one on another.

As shown in FIG. 36 and FIG. 37, the multi-layer piezoelectric device of this embodiment has the stack 513 formed by stacking a plurality of piezoelectric material layers 511a and a plurality of internal electrode layers 512 alternately, with a pair of the external electrodes 515 disposed on opposing side faces of the stack 513.

The multi-layer piezoelectric device of this embodiment has a plurality of lump containing layers (piezoelectric layers of small cross sectional area) 511b as shown in FIG. 36 and FIG. 37. The lump containing layers 511b are constituted from six lumps (partial piezoelectric layer) 511c scattered between two piezoelectric layers 511a, 511a that adjoin each other in the stacking direction.

Figure 38A:
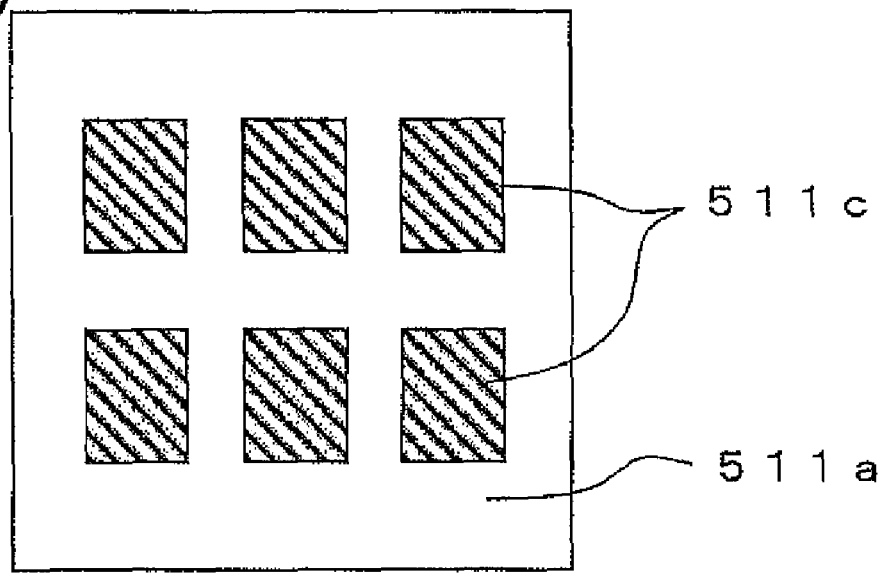
FIG. 38(a) is a sectional view along a plane that is perpendicular to the stacking direction of a stack and includes a lump containing layer.
Figure 38B:
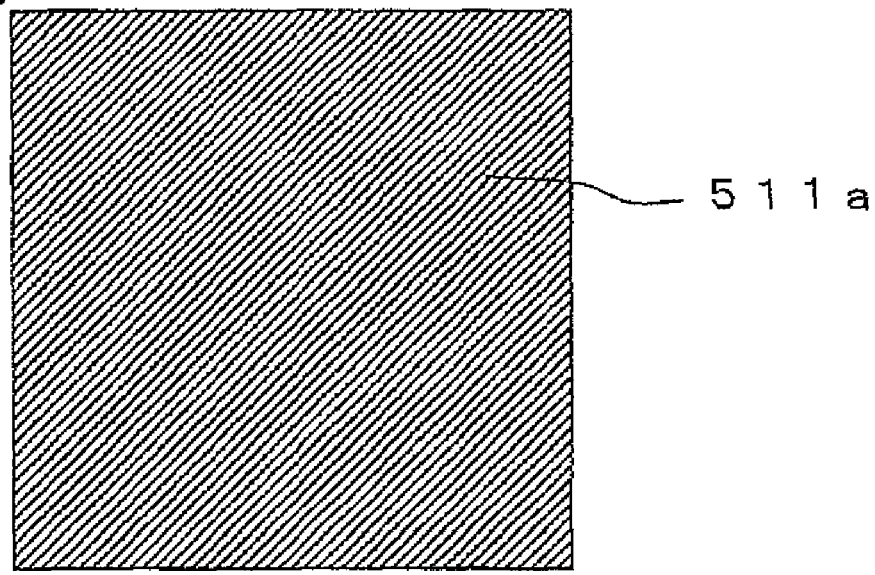
FIG. 38(b) is a sectional view along a plane that includes piezoelectric layers that adjoin the lump containing layer of FIG. 38(a) in the stacking direction and is perpendicular to the stacking direction.

FIG. 38(a) is a sectional view along a plane that is perpendicular to the stacking direction of the stack 513 and includes the lump containing layer 511b, and FIG. 38(b) is a sectional view along a plane containing the piezoelectric layer 511a which adjoins the lump containing layer 511b of FIG. 38(a) in the stacking direction and is perpendicular to the stacking direction.

Let Xb be the proportion of the area of the piezoelectric layer (hatched portion in FIG. 38(a)) to the area of a section of the stack 513 containing the lump containing layer 511b and is perpendicular to the stacking direction of the piezoelectric layer, the area of the piezoelectric layer being measured in this section, and let Xa be the proportion of the area of the piezoelectric layer (hatched portion in FIG. 38(b)) to the area of a section of the stack 513 that includes the piezoelectric layer 511a which adjoins the lump containing layer 511b and is perpendicular to the stacking direction of the piezoelectric layer, the area of the piezoelectric layer being measured in this section. Then the proportion Xb in the lump containing layer 511b is smaller than the proportion Xa in the piezoelectric layer 511a which adjoins on both sides in the stacking direction.

Proportions Xa and Xb may satisfy a relationship of $(Xb/Xa)<1$, and preferably satisfy a relationship of $(Xb/Xa)<0.8$, more preferably satisfy a relationship of $0.1<(Xb/Xa)<0.7$, and further more preferably satisfy a relationship of $0.2<(Xb/Xa)<0.5$. The proportion Xa is preferably in a range from 0.8 to 1.0, and more preferably in a range from 0.95 to 1.0. The proportion Xb is preferably in a range from 0.05 to 0.8, and more preferably in a range from 0.1 to 0.5. When the proportions satisfy these conditions, sufficient stress relieving effect of the lump containing layer 511b can be achieved, and strength of the device can be suppressed from decreasing due to the presence of the lump containing layer 511b. The proportion Xa in the piezoelectric layer 511a and the proportion Xb in the lump containing layer 511b can be measured similarly to the measurement of the void ratio described previously.

Figure 39:
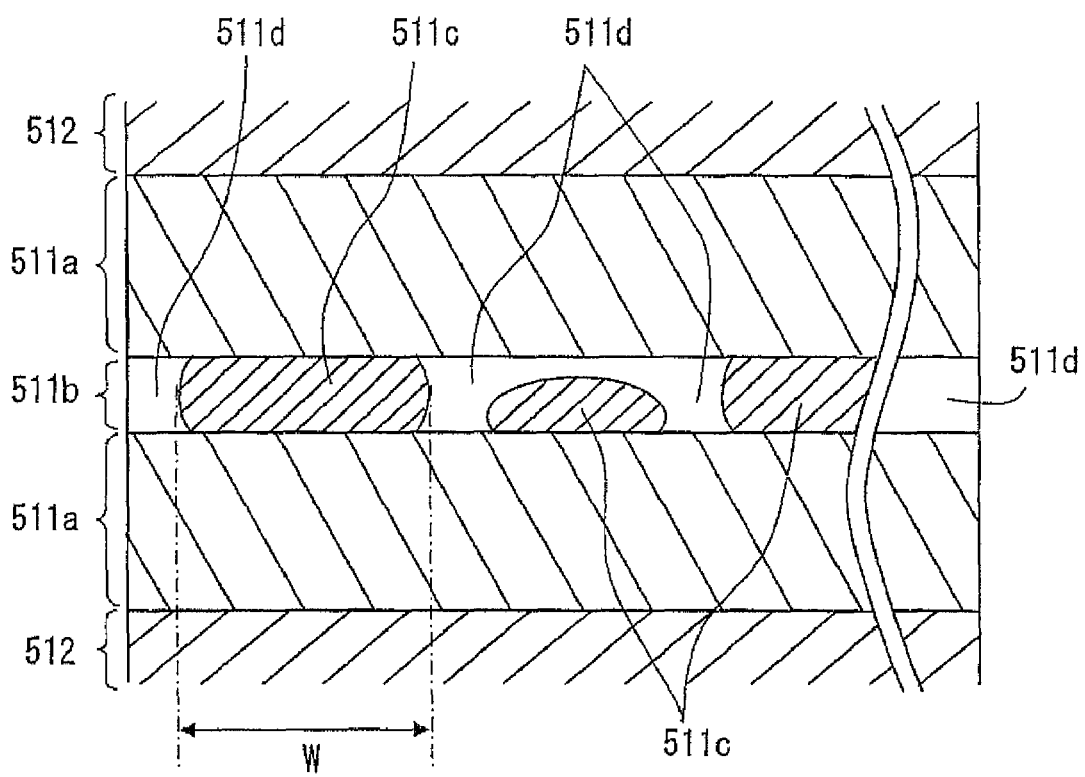
FIG. 39 is a sectional view of a stack along a plane that is parallel to the stacking direction of the stack.

The multi-layer piezoelectric device of this embodiment can be evaluated as follows. FIG. 39 is a sectional view of the stack 513 along a plane that is parallel to the stacking direction of the stack 513. Let Yb be the proportion of the area of the piezoelectric layer to the area of the lump containing layer 511b in a section of the stack 513 parallel to the stacking direction of the piezoelectric layer, and let Ya be the proportion of the area of the piezoelectric layer to the area of a section of the piezoelectric layer 511a that adjoins the lump containing layer 511b in a section of the stack 513 parallel to the stacking direction of the piezoelectric layer. Then the proportion Yb in the lump containing layer 511b is smaller than the proportion Ya in the piezoelectric layer 511a which adjoins on both sides in the stacking direction.

Proportions Ya and Yb may satisfy a relationship of $(Yb/Ya)<1$, and preferably satisfy a relationship of $(Yb/Ya)<0.8$, more preferably satisfy a relationship of $0.1<(Yb/Ya)<0.7$, and further more preferably satisfy a relationship of $0.2<(Yb/Ya)<0.5$. Proportion Ya is preferably in a range from 0.8 to 1.0, and more preferably in a range from 0.95 to 1.0. Proportion Yb is preferably in a range from 0.05 to 0.8, and more preferably in a range from 0.1 to 0.5. When the proportions satisfy these conditions, sufficient stress relieving effect of the lump containing layer 511b can be achieved, and strength of the device can be suppressed from decreasing due to the presence of the lump containing layer 511b. The proportion Ya in the piezoelectric layer 511a and the proportion Yb in the lump containing layer 511b can be measured similarly to the measurement of the void ratio described previously.

In the multi-layer piezoelectric device of this embodiment, presence of the lump containing layer 511b decreases the displacement of the piezoelectric layer 511a around the lump containing layer 511b while increasing the displacement around the piezoelectric layer 511a located away from the lump containing layer 511b, so that portions of large displacement and portions of small displacement are distributed within the device. Disposing the lump containing layer 511b in the device makes it possible to distribute the stress generated in the device. As a result, not only the amount of displacement of the entire device can be increased as the restriction on the displacement of the device by the stress concentration is mitigated, but also stress can be suppressed from concentrating due to the deformation of the device, so as to achieve high durability even when the device is operated continuously over a long period of time under a high electric field and high pressure.

It is preferable that plural lumps 511c that constitute the lump containing layer 511b are disposed substantially uniformly between the piezoelectric layers 511a, 11a. When plural lumps 511c are disposed substantially uniformly between the piezoelectric layers 511a, 11a, stress generated by the deformation of the device does not concentrate and the lump containing layer 511b acts as the stress relieving layer for the piezoelectric layer over the entire section of the device.

As the lumps 511c are subjected to stress during deformation of the device, stress relieving function of the piezoelectric crystal works, in such a manner as the crystal structure changes in accordance to the direction of pressure acting thereon. Providing the lumps 511c in dispersed arrangement increases the number of points where stress relieving occurs, thus suppressing cracks from occurring in the lumps 511c.

The lump containing layer 511b is preferably disposed at substantially the center of the space between two internal electrodes that are disposed on both ends of the stack 513 in the stacking direction. Since significant stress tends to concentrate at substantially the center of the space between two internal electrodes that are disposed on both ends of the stack 513 in the stacking direction (namely at substantially the center of the active layer), durability of the device can be improved by disposing the lump containing layer 511b at least at this position.

A place to disposed the lump containing layer, that is important next to the position at substantially the center between the internal electrodes described above, is a position at substantially the center between the internal electrodes located on both ends in the stacking direction, and a position at substantially the center between the internal electrodes located on one end and on the other end in the stacking direction (namely a position away from the end of the active layer by a distance about one forth of the length of the active layer). It is preferable to dispose the lump containing layer 511b based on this consideration thereafter.

In case the multi-layer piezoelectric device is used in a fuel injection apparatus or the like, the device is housed in a container that has an ejection hole at one end thereof. In this case, one end of the device makes contact with the inner wall of the container and is fixed, the other end of the device (ejection hole side of the container) is free to expand and contract. In such a constitution, since the free end is subject to greater stress than the fixed end, more lump containing layer 511b may be disposed on the free end side.

Moreover, according to the present invention, it is preferable that a part of plural lumps 511c that constitute the lump containing layer 511b make contact with the piezoelectric layers 11a that are located on both sides with which both ends of the lumps 511c in the stacking direction adjoin, and the rest of plural lumps 511c that constitute the lump containing layer 511b make contact with the piezoelectric layer 511a only on one end of the limps 511c in the stacking direction as shown in FIG. 39.

The plurality of lumps 511c that constitute the lump containing layer 511b make contact, on one or both ends thereof in the direction of thickness, with the piezoelectric layers 11 that adjoin therewith on both sides thereof. Presence of the lumps 511c that make contact with the piezoelectric layer 511a only on one end thereof gives higher degree of freedom to the piezoelectric layer 511a that adjoins the lump containing layer 511b, and therefore the amount of displacement can be increased and the stress relieving effect can be improved.

It is preferable that width W of the lump 511c in a section of the stack 513 within a plane parallel to the stacking direction gradually decreases or increases toward the piezoelectric layer 511a that adjoin therewith in the stacking direction. In the case shown in FIG. 39, width W of the lump 511c peaks at a position around the center in the direction of thickness and gradually decreases toward the piezoelectric layer 511a on both ends in the stacking direction.

In order to achieve the stress relieving function that works during displacement of the multi-layer piezoelectric device, it is necessary to prevent the stress generated in the interface between the piezoelectric layer and the internal electrode 512 during displacement of the multi-layer piezoelectric device from concentrating locally. In order to further enhance the stress relieving function, width W of the lumps 511c that constitute the lump containing layer 511b is caused to gradually decrease or increase toward the piezoelectric layer 511a in the vicinity of the adjacent piezoelectric layer 511a, thereby suppressing the stress from concentrating locally.

It is also preferable that there are voids 11d between plural lumps 511c in the lump containing layer 511b as shown in FIG. 39. When there are voids 11d between plural lumps 511c, stress can be distributed by the lumps 511c that deform and absorb the stress by taking advantage of the presence of voids. Also during piezoelectric displacement of the piezoelectric layer 11a that makes contact with the lump containing layer 511b, presence of the voids causes partial clamping of the piezoelectric layer 11a that results in less restriction of the piezoelectric layer 11a than that of total clamping, thus making it easier for the piezoelectric layer 511a to undergo displacement and enabling it to increase the amount of displacement.

The multi-layer piezoelectric device of this embodiment is also characterized by the presence of plural voids 11d in the direction perpendicular to the stacking direction of the piezoelectric layer as shown in FIG. 39. It is preferable that plural voids 11d have substantially the same length in the stacking direction, which makes it possible to provide the stress relieving effect substantially uniformly over the entire width of the device (perpendicular to the stacking direction). While there is no restriction on the length (length in the stacking direction) of the voids 11d, the length is preferably in a range from 0.1 to 10 µm, and more preferably from 0.5 to 2.0 µm. When length of the voids 11d is in a range from 0.1 to 10 µm, stress relieving effect of the lumps 511c can be suppressed from decreasing during displacement of the device, and strength of the device can also be suppressed from decreasing. The preferable range of the lengths of the lumps 511c is similar to the preferable range of the lengths of the voids 11d.

In the lump containing layer 511b, glass or resin may be present instead of voids between plural lumps 511c. Such a constitution can suppress stress from concentrating in the piezoelectric layer 11a that makes contact with the lump containing layer 511b, so as to avoid concentration of stress when the amount of displacement increases. As a result, the multi-layer piezoelectric device having capability of greater amount of displacement and higher durability can be made.

For the glass component, for example, lead alkali silicate glass may be used. Use of lead alkali silicate glass provides the advantages of higher strength of the interface with the piezoelectric layer and reduction of breakage during the process of manufacturing the multi-layer piezoelectric device. Silica glass may also be used as the glass component. Use of silica glass, similarly to lead alkali silicate glass, also provides the advantages of higher strength of the interface with the piezoelectric layer and reduction of breakage during the process of manufacturing the multi-layer piezoelectric device. For the resin component, for example, epoxy resin may be used. Use of epoxy resin provides an advantage that stress concentration can be effectively mitigated. Polyimide resin may also be used as the resin. Use of polyimide resin provides an advantage of making it possible to operate the device at higher temperatures.

At least one of the glass component and the resin component may be disposed between plural lumps 511c as follows. In order to form a glass layer, a calcined powder of a piezoelectric material, a powder of the glass component, a binder and a plasticizer are mixed to prepare a mixed paste of a piezoelectric material and glass, which is then applied onto the top surface of a green sheet by screen printing or the like. Then a metal powder consisting mainly of silver-palladium that would constitute the internal electrode 512, a binder and a plasticizer are mixed to prepare an electrically conductive paste, that is applied onto the top surface of a green sheet by screen printing or the like The green sheets having the paste for the lump containing layer 511b printed thereon and the green sheets having the paste for the internal electrodes 512 printed thereon are stacked one on another in a predetermined order, After heating the stacked compact to a predetermined temperature to remove the binder, the stacked compact is fired at a temperature from 900 to 1,200° C. to make the stack 513.

In order to form a resin layer, a calcined powder of piezoelectric material, a binder and a plasticizer are mixed to prepare a mixed paste of piezoelectric material and glass, which is then applied onto the top surface of a green sheet by screen printing or the like. Then a metal powder consisting mainly of silver-palladium that would constitute the internal electrode 512, a binder and a plasticizer are mixed to prepare an electrically conductive paste, that is applied onto the top surface of a green sheet by screen printing or the like. The green sheets having the paste for the lump containing layer 511b printed thereon and the green sheets having the electrically conductive paste for the internal electrodes 512 printed thereon are stacked one on another in a predetermined order. After heating the stacked compact to a predetermined temperature to remove the binder, the stacked compact is fired at a temperature from 900 to 1,200° C. to make the stack 513. Then the voids of the lump containing layer 511b are filled with a paste of an epoxy resin or a polyimide resin, by using a brush impregnated with the resin paste so that the paste infiltrates through the side surface of the stack 513 into the voids by the capillary effect. Alternatively, the stack 513 may be immersed into a bath filled with the resin paste, then put into a vacuum vessel so that the paste infiltrates into the voids of the lump containing layer 511b under reduced pressure. Then the resin may be heated so as to cure.

A method of manufacturing the multi-layer piezoelectric device of the present invention will now be described. First, a calcined powder of a piezoelectric ceramic material) the binder and the plasticizer are mixed to prepare a slurry. The slurry is formed into ceramic green sheets by a known method.

Then to form the lump containing layer 511b, a calcined powder of piezoelectric material, a binder and a plasticizer are mixed to prepare a piezoelectric material paste which is then applied onto the top surfaces of green sheets to a thickness of 1 to 40 μm by screen printing or the like. The thickness of the lump containing layer 511b and void ratio in the lump containing layer 511b can be varied by changing the proportion of the binder or the plasticizer to the piezoelectric material powder, changing the mesh of the screen or changing the thickness of the resist used to form the screen. The piezoelectric ceramic powder used in the piezoelectric paste is preferably the same as the powder of the piezoelectric layer 511a, in order to prevent breakage from occurring due to the difference in shrinkage during the firing process. Required number of green sheets that have the paste for the lump containing layer 511b printed thereon are prepared.

Then a metal powder such as silver-palladium that would form the internal electrode 512, a binder and a plasticizer are mixed, to prepare an electrically conductive paste that is applied onto the top surfaces of the ceramic green sheets by screen printing method or the like to a thickness of 1 to 40 μm. The thickness of the internal electrode 512 and void ratio in the internal electrode can be varied similarly to that described above. The green sheets having the paste for the lump containing layer 511b printed thereon and the green sheets having the electrically conductive paste printed thereon are stacked one on another in a predetermined order. After heating the stacked compact to a predetermined temperature to remove the binder, the stacked compact is fired at a temperature from 900 to 1,200° C. to make the stack 513.

Then grooves are formed in the portion of piezoelectric material disposed between the internal electrode 512 and the external electrode 515 on the side face of the multi-layer piezoelectric device, and the grooves are filled with an insulating material having a Young's modulus lower than that of the piezoelectric material 511 such as resin or rubber. The grooves are formed on the side face of the stack 513 by means of a dicing apparatus or the like. Other portions may be formed similarly to that described above.

Figure 40A:
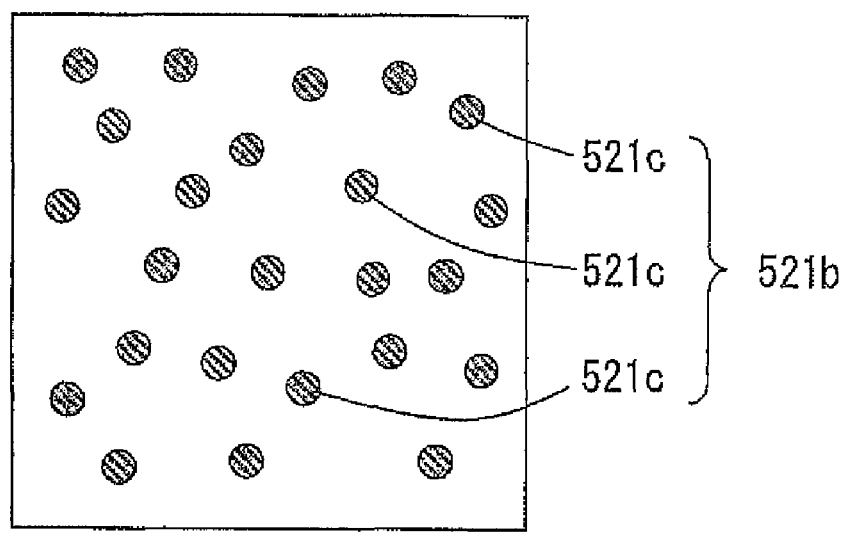
FIG. 40(a) is a sectional view of another example along a plane that is perpendicular to the stacking direction of a stack and includes a lump containing layer.
Figure 40B:
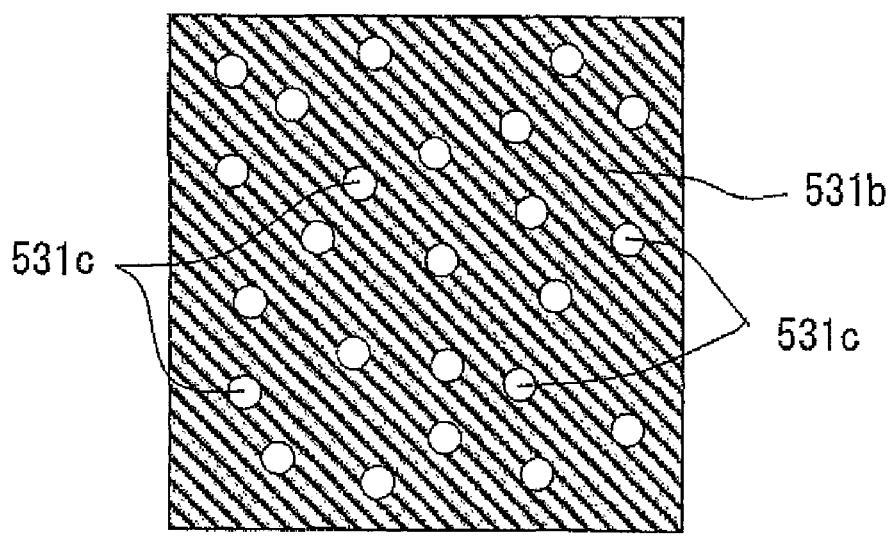
FIG. 40(b) is a sectional view of further another example along a plane that is perpendicular to the stacking direction of the stack and includes the lump containing layer.

The lump containing layer of this embodiment may have a form shown in FIG. 40(*a*) or FIG. 40(*b*). That is, the lump containing layer 21b may comprise a plurality of lumps 21c that are randomly disposed as shown in FIG. 40(*a*), or the lump containing layer 4031b may have a plurality of voids (or resin layer) 531c that are randomly disposed in the piezoelectric layer as shown in FIG. 40(*b*).

In the embodiment described above, the internal electrode 512b consists of six lumps as shown in FIG. 37. In this embodiment, however, there are no restrictions on the size, number and arrangement of the lumps. The internal electrode 512b may consist of a large number of lumps of various sizes randomly disposed therein. Also in the embodiment described above, the lump containing layer 511b adjoin the piezoelectric layer 511a on both sides thereof in the stacking direction without the internal electrode 512 intervening therein. However, the lump containing layer 511b may adjoin the piezoelectric layer 511a on both sides thereof in the stacking direction via the internal electrode 512a.

Other Third Embodiment

A multi-layer piezoelectric device according to this embodiment will now be described in detail. FIG. 41(*a*) is a perspective view showing the multi-layer piezoelectric device according to this embodiment. FIG. 41(*b*) is a partial perspective view showing the state of the piezoelectric material layers and the metal layers of FIG. 41(*a*) being stacked. FIG. 42 is an enlarged sectional view of a junction between external electrodes 615 and a stack 615 according to the embodiment of the present invention shown in FIG. 41(*a*).

As shown in FIG. 41(*a*) and FIG. 41(*b*), the multi-layer piezoelectric device of this embodiment has the stack 615 formed by stacking a plurality of piezoelectric layers 11 and metal layers 12 (12a, 12b) alternately, and has a pair of external electrodes 615 formed on the opposing side faces of the stack 615.

In the multi-layer piezoelectric device of this embodiment shown in FIG. 41(*a*) and FIG. 41(*b*), at least one of plural metal layers 612 is a lump containing layer 612b consisting of a plurality of ceramic lumps (piezoelectric region) 12c that are separated from each other by voids between the piezoelectric layers 11, and a plurality of metallic lumps (metal region) 12d that are separated from each other by the voids.

Presence of at least one such lump containing layer 612b makes it possible not only to increase the amount of displacement of the multi-layer piezoelectric device as a whole but also improve the durability of the multi-layer piezoelectric device. As at least one of plural metal layers 612 is a lump containing layer 612b, the piezoelectric layer around the lump containing layer 612b undergoes less displacement, and the piezoelectric layer 11 around the metal layer 612a undergoes greater displacement, so that portions that undergo large displacement and portions that undergo small displacement can be distributed within the device. Disposing the metal layers in the device makes it possible to distribute the stress generated by the displacement of the device.

In addition, since the lump containing layer 612b is constituted from a plurality of ceramic lumps that are separated from each other by the voids and a plurality of metallic lumps that are separated from each other by the voids, significant stress relieving effect can be achieved when the device is subjected to stress. This is because the ceramic lumps that are disposed separate from each other via the voids and have higher degree of freedom can, when subjected to stress, mitigate the stress as the ions in the piezoelectric crystal move and the crystal deforms in accordance to the direction of the stress.

Similarly the metallic lumps that are disposed separate from each other via the voids and have higher degree of freedom can, when subjected to stress, deform so as to mitigate the stress. While the stress relieving effect of the ceramic lumps that is based on the ion movement works quickly and the stress relieving effect of the metallic lumps based on the deformation of metal works more slowly than the ion movement speed, deformation of the metal reaches further than the ion movement can. As a result, the ceramic lumps mitigates stress that develops quickly while the metallic lumps shows high stress relieving effect for large stress or long standing stress, thus providing the device having high durability.

When a large stress that cannot absorbed by the ceramic lumps is generated, the metallic lumps play the major role of mitigating the stress, while the ceramic lumps mitigates quickly developing stresses.

It is preferable that plural ceramic lumps 612c and plural metallic lumps 612d that constitute the lump containing layer 612b are scattered substantially uniformly between the piezoelectric layers. When plural ceramic lumps 612c and plural metallic lumps 612d are scattered substantially uniformly between the piezoelectric layers, stress generated by the displacement of the device can be suppressed from concentrating locally.

The stress relieving effect is enhanced when there is a region where the metallic lumps and the ceramic lumps contact each other. In case the ceramic lumps enclose the metallic lumps, or conversely the metallic lumps encloses the ceramic lumps, the device has such a configuration as the ceramic lumps 612c and the metallic lumps 612d are connected in series in the stacking direction of the stack. This produces such an effect as the stress generated in the stacking direction can be mitigated by the stress relieving functions that are connected in series in the stacking direction of the stack, thus countering quickly developing stress. Since the stress relieving function is realized by means of the ion arrangement that can quickly change, the stress relieving effect is particularly remarkable for repetition of continuous stress. In case the ceramic lumps and the metallic lumps adjoin each other in the direction perpendicular to the stacking direction, such an effect is achieved as the stress relieving functions of the ceramic lumps and the metallic lumps were connected each other in the direction parallel to the stacking direction, and stresses generated in various directions can be mitigated.

Figure 41A:
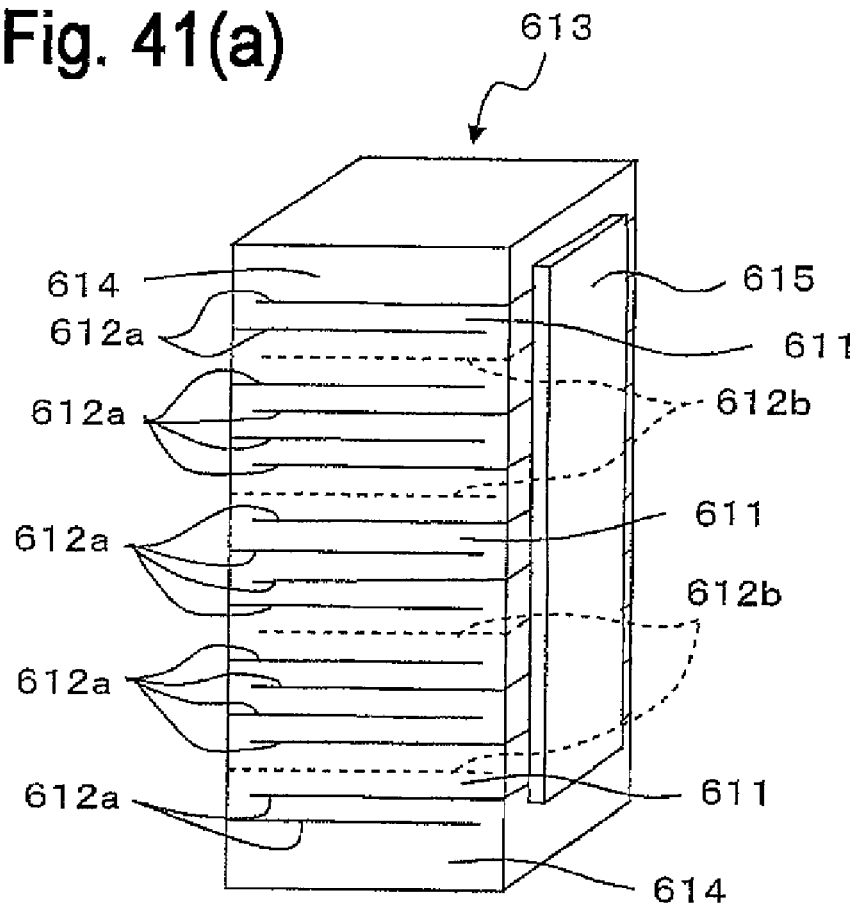
FIG. 41(a) is a perspective view showing a multi-layer piezoelectric device according to further another embodiment of the present invention.
Figure 41B:
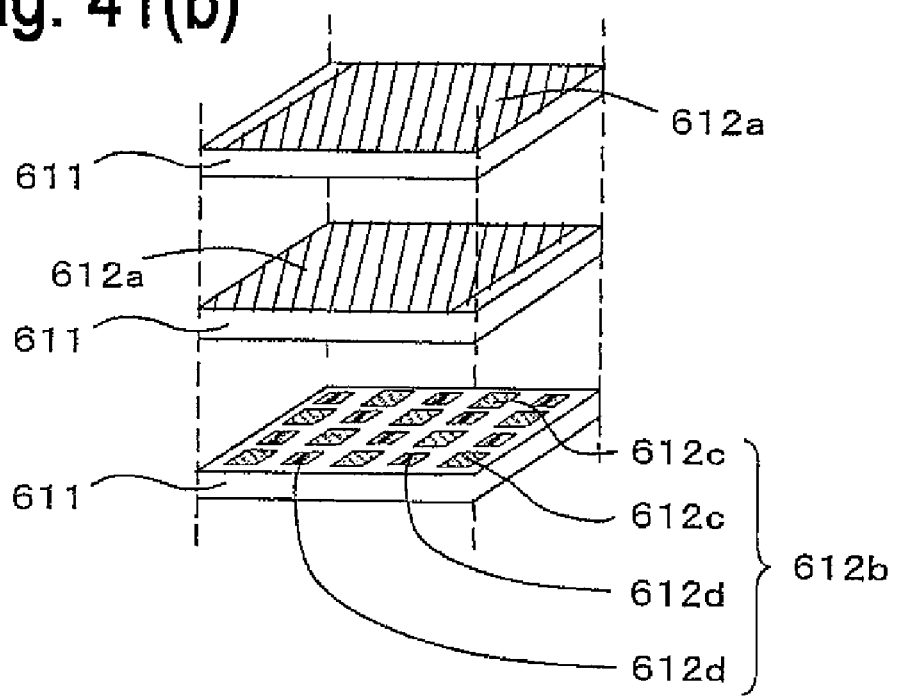
FIG. 41(b) is a partial perspective view of the state of piezoelectric layers and metal layers of FIG. 41(a) being stacked.
Figure 42:
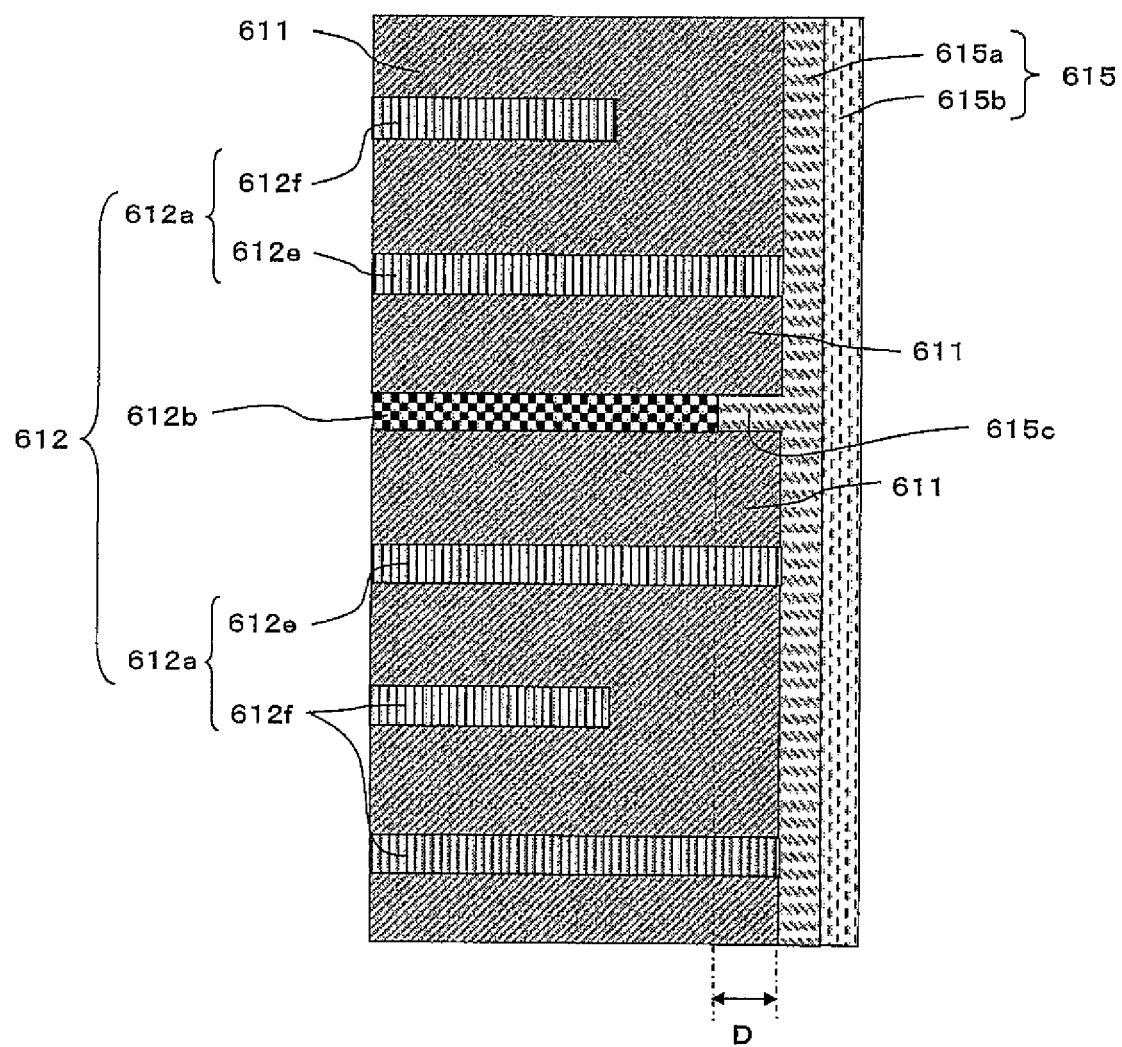
FIG. 42 is an enlarged sectional view of a junction between the external electrode and the side face of the stack of FIG. 41.

In the embodiment shown in FIG. 41(a) and FIG. 41(b), a plurality of lump containing layers 612b are disposed in the stack 615. The lump containing layers 612b are disposed regularly in the direction of thickness of the stack 615 via a plurality of piezoelectric layers 611 and a plurality of metal layers 612a.

Since the amount of displacement of the piezoelectric layer 611 can be controlled by changing the proportions of plural ceramic lumps 612c and plural metallic lumps 612d that constitute the lump containing layer 612b, a structure suitable for mass production is provided without the need for changing the thickness of the piezoelectric layer 11.

In order to operate the multi-layer piezoelectric device with stable amount of displacement, it is preferable to make the lump containing layer 612b that does not easily deform under the mass of the multi-layer piezoelectric device in operation. Since the lump containing layer 612b is constituted from plural ceramic lumps 612c and plural metallic lumps 612d, deformation in response to the mass can be controlled by means of the distributions thereof.

Volume V1 occupied by the ceramic lumps 612c and volume V2 occupied by the metallic lumps 612d preferably satisfy a relation V1>V2. When volume V3 of the voids in the lump containing layer 612b is considered, it is preferable that relation of V3>V2 is satisfied, and it is preferable that relation of V3>V1>V2 is satisfied. Such a constitution further increases the amount of displacement of the device and provides the multi-layer piezoelectric device having higher durability.

It is also preferable that the metal layers 612e that adjoin the lump containing layer 612b on both sides in the stacking direction include less voids than the metal layers (the lump containing layer 612b and the metal layers 612f) that adjoin the metal layer 612e on both sides in the stacking direction, as shown in FIG. 42. This constitution increases the contact area between the end of the dense metal layers 612e that have less voids and the external electrodes 615, thus making it easier for the electrically conductive components to diffuse. Bonding by this diffusion (diffusion bonding) makes it possible to increase the strength of bonding between the external electrodes 615 with the side faces of the stack 615. Void ratio in the metal layers 612e is preferably not higher than 95%, more preferably not higher than 90% of the void ratio in other metal layers such as the metal layers 612f.

Also according to the present invention, it is preferable that the metal layers 612e that adjoin the lump containing layer 612b on both sides in the stacking direction has larger thickness than the metal layers (the lump containing layer 612b and the metal layers 612f) that adjoin the metal layer 612e on both sides in the stacking direction. This constitution increases the contact area between the end of the metal layers 612e that have larger thickness and the external electrodes 615, thus making it easier for the electrically conductive components to diffuse. Bonding by this diffusion (diffusion bonding) makes it possible to increase the strength of bonding between the external electrodes 615 with the side faces of the stack 15. The thickness of the metal layers 612e is preferably not less than 105%, more preferably not less than 110% of the thickness of other metal layers such as the metal layers 612f.

It is also preferable that a part 15c of the external electrode 615 infiltrates between two piezoelectric layers 11 that adjoin the lump containing layer 612b on both sides in the stacking direction as shown in FIG. 42. Such a configuration as the part 15c of the external electrode 615 infiltrates into a region between two piezoelectric layers 11, 11 resembles such a such a structure as a pile is driven into the stack 615 through the side face thereof. This increases the bonding strength between the external electrode 615 and the stack 615, so as to prevent such a problem from occurring as the external electrode 615 peels off the side face of the stack 615 even when the device is operated continuously over a long period of time under a high electric field and high pressure. As a result, reliability of connection between a part of the metal layer 612a and the external electrode 615 is improved.

Depth D to which the external electrode 615 infiltrates into a region between the adjoining piezoelectric layers 611, 611 through the side face of the stack 615 is preferably 1 μm or more, more preferably 5 μm or more. When depth D has such a level, sufficient anchoring effect is achieved.

The external electrode 615 in this embodiment shown in FIG. 42 comprises a plurality of layers 615a, 615b that are stacked in a direction perpendicular to the side face of the stack 615. Among these, the external electrode layer 15a located on the side face of the stack 615 preferably includes a larger content of glass component than the external electrode layer 615b located on the outer surface. As the external electrode layer 15a proximate to the side face of the stack 615 includes a larger content of glass component, it becomes easier for the part 615c of the external electrode 615 to infiltrate into a region between the piezoelectric layers 11 that adjoin the lump containing layer 12b on both sides thereof in the stacking direction, thereby further increasing the bonding strength between the external electrode 615 and the stack 615. As the external electrode layer 15b located on the outer surface includes less glass component than the external electrode layer 15a, bonding strength of the lead wires that are soldered onto the external electrode 615 can be increased. This is because the glass component has lower wettability to the solder.

Figure 43:
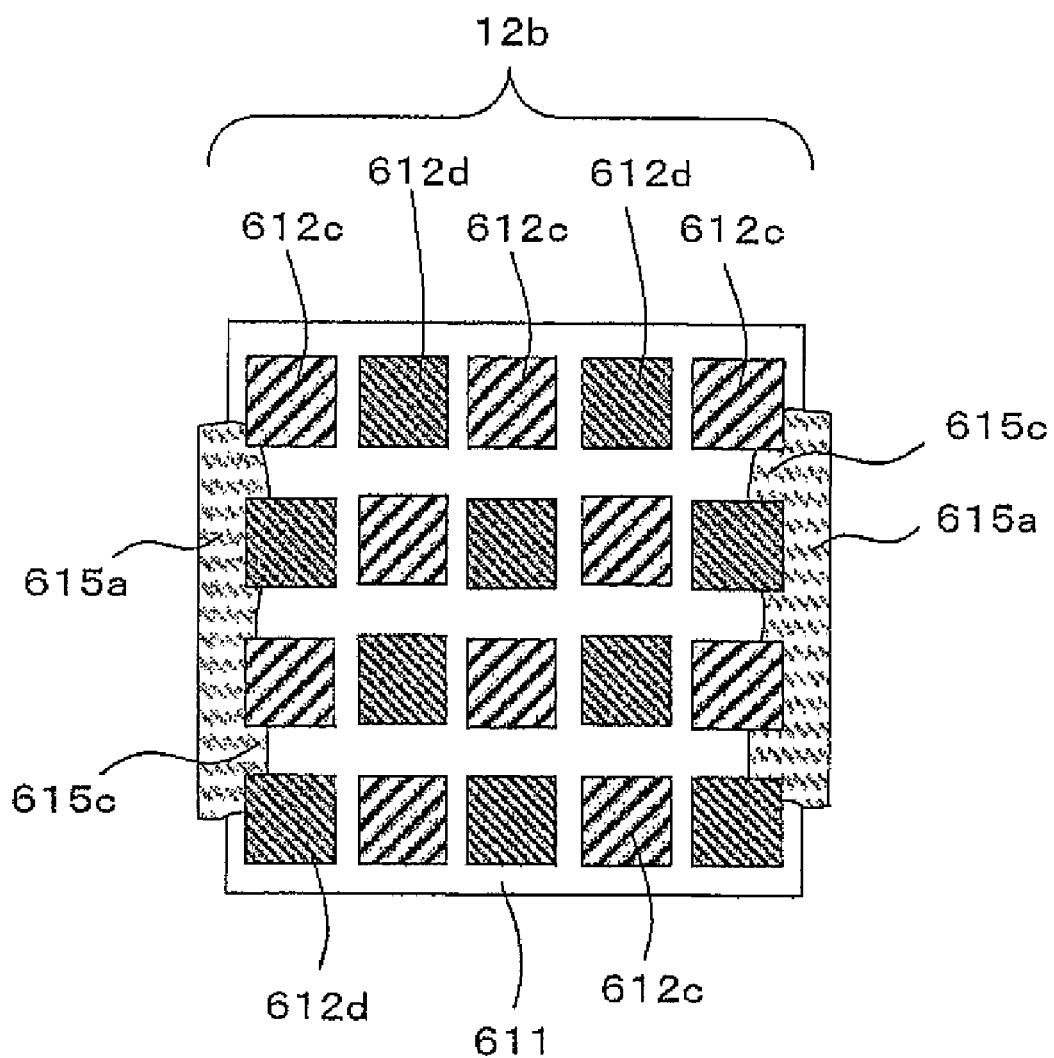
FIG. 43 is a sectional view of the stack of FIG. 41 along a plane that is perpendicular to the stacking direction and includes the lump containing layer.

FIG. 43 is a sectional view of the stack 615 in a plane containing lump containing layer 612b in the direction perpendicular to the stacking direction. As shown in FIG. 43, the part 615c of the external electrode 615 that infiltrates between the piezoelectric layers 611, 611 makes contact (bonds) with the ceramic lumps 612c that constitute the lump containing layer 612b. Contact of the part 615c of the external electrode 615 with both the ceramic lumps 612c and the metallic lumps 612d produces the following effect.

Since the electrically conductive component of the external electrode 615 has good wettability with the metal component of the metallic lumps 612d, contact of the part of the external electrode 615 with the ceramic lumps 612c enables these members to be bonded firmly together. Also because the glass component of the external electrode 615 has good wettability with the piezoelectric material of the ceramic lumps 612c, contact of the part of the external electrode 615 with the ceramic lumps 612c enables these members to be bonded firmly together. Moreover, because a part of the external electrode 615 infiltrates between the two piezoelectric layers 611, 611 that adjoin the lump containing layer 612b on both sides thereof in the stacking direction, the infiltrating portion holds the adjacent piezoelectric layers 11 together. As a result, the effect of preventing peel-off of the stack 615 via the lump containing layer 612b is achieved even when the device is operated with a large amount of displacement.

The stress generated in the interface between the stack 615 and the external electrode 615 by the deformation of the stack 615 during operation of the device is transmitted to the piezoelectric layer 11, via the part 615c of the external electrode 615 that infiltrates between the two piezoelectric layers 611, 611 that adjoin the lump containing layer 612b on both sides thereof in the stacking direction. Crystal structure of the piezoelectric layer that is in contact with the part 15c of the external electrode 615 changes in accordance to the transmitted stress, thereby absorbing the stress.

Particularly because the part 615c of the external electrode 615 includes a metal as the main component, stress relieving effect is achieved as the metal deforms. Also the part 615c of the external electrode 615 presses the piezoelectric layer with a strong force, crystal structure of the piezoelectric layer tends to change.

The portion where the piezoelectric layer 611 makes contact with the void does not receive the application of voltage and functions as a space that can deform in accordance to the stress. As a result, such a new stress relieving function can be provided as the stress newly generated in the piezoelectric layer due to the change in crystal structure is mitigated in the portion in contact with the void.

Moreover, the effect of distributing the stress is improved by causing the part 15c of the external electrode 615 to infiltrate while branching between the ceramic lumps 612c and the metallic lumps 612d, thereby improving the effect of distributing the stress. Thus reliability of bonding between the external electrode 615 and the stack 615 is improved further, thereby making the multi-layer piezoelectric device that has high durability and long service life.

It is preferable to cover the surface of the multi-layer piezoelectric device with a cladding resin (not shown), and have a part of the cladding resin infiltrate in a region between the adjacent two piezoelectric layer 611, 611. In case not only a part of the external electrode 615 but also a part of the cladding resin infiltrates between the two piezoelectric layers 611, 611 that adjoin the lump containing layer 612b on both sides thereof in the stacking direction, the infiltrating portion holds the adjacent piezoelectric layers 611 together. As a result, the effect of preventing peel-off of the stack 615 via the lump containing layer 612b is achieved even when the device is operated with a large amount of displacement.

The stress generated in the interface between the stack 615 and the cladding resin by the deformation of the stack 615 during operation of the device is transmitted to the piezoelectric layer 611, via a part of the cladding resin that infiltrates between the two piezoelectric layers 611, 611 that adjoin the lump containing layer 612b on both sides thereof in the stacking direction. Crystal structure of the piezoelectric layer that is in contact with the part of the cladding resin changes in accordance to the transmitted stress, thereby absorbing the stress.

Particularly because the part of the cladding resin that infiltrates between the piezoelectric layer includes a resin as the main component, not only the stress relieving effect is achieved by deformation of the resin but also the piezoelectric layer can be covered by the cladding resin that makes contact therewith. As a result, change in volume caused by the changing crystal structure of the piezoelectric layer can be absorbed so as to suppress further generation of stress.

In the portion where the piezoelectric layer 611 makes contact with the void, the piezoelectric layer may be oxidized or reduced depending on the oxygen concentration and humidity in the ambient atmosphere, leading to a change in the piezoelectric characteristics over a long period of operation of the multi-layer piezoelectric device. Such an influence of the operating environment can be minimized as the part of the cladding resin infiltrates. As a result, the piezoelectric layer has the stress relieving function with high durability, while reliability of bonding between the external electrode 615 and the stack 615 is improved further, thereby making the multi-layer piezoelectric device having high durability and long service life.

The multi-layer piezoelectric device of this embodiment can be manufactured similarly to that described previously. First, the stack is formed by a procedure similar to that described above. Then an electrically conductive silver-glass paste is prepared by adding a binder to a glass powder, and the paste is formed into a sheet that is dried to remove solvent while controlling the density of the green sheet in a range from 6 to 9 g/cm³. The sheet is transferred onto the external electrode forming surface of a column-shaped stack 615. The stack 615 is baked at a temperature that is higher than the softening point of the glass and is not higher than the melting point (965° C.) of silver and is not higher than 4/5 of the firing temperature (° C.). In this process, the binder component contained in the sheet that is formed from the electrically conductive silver-glass paste is evaporated and removed, so that the external electrode 615 is formed from a porous electrical conductor having three-dimensional mesh structure.

While plural sheets having the paste to form the external electrodes 615 applied thereon may be fired after being stacked or the layers may be stacked and fired one by one, it is more advantageous to fire plural sheets after being stacked for the reason of convenience for mass production. In case the glass component is varied from one external electrode layer to another, sheets having different contents of the glass component may be used. When it is desired to form a thin glass-rich layer in contact with the piezoelectric layer 11, a glass-rich paste may be printed by screen printing process or the like on the stack 615, so as to stack the multi-layer sheet. In this process, a sheet having thickness of 5 μm or less may be used instead of printing.

The temperature at which the electrically conductive silver-glass paste is bonded by baking is preferably in a range from 500 to 800° C. for the purpose of joining the silver content that is included in the electrically conductive silver-glass paste and the metal layer 612 through diffusion bonding so as to effectively form a neck portion, thus effectively causing the voids that exist in the external electrode 615 to remain and partially joining the external electrode 615 and the side face of the stack 615. Softening point of the glass component contained in the electrically conductive silver-glass paste is preferably in a range from 500 to 800° C. When the baking temperature is lower than 800° C., porous electrical conductor having effective three-dimensional mesh structure can be formed. Baking is preferably carried out at a temperature that is not higher than 1.2 times the softening point of the glass. When the baking temperature is higher than 500° C., on the other hand, the end of the metal layer 612 and the external electrode 615 is joined sufficiently through diffusion bonding, and therefore the neck portion is formed.

Then the stack 615 having the external electrodes 615 formed thereon is immersed in a silicone rubber solution while deaerating the silicone rubber solution by evacuation, so as to fill the groove of the stack 615 with the silicone rubber. Then the stack 615 is pulled out of the silicone rubber solution, with the stack 615 being coated with the silicone rubber on the side faces thereof. Then the silicon rubber that fills the groove and covers the side faces of the stack 615 is caused to cure, thereby to complete the multi-layer piezoelectric device of the present invention.

Another method of manufacturing the multi-layer piezoelectric device of this embodiment will now be described. First, the stack 615 is made as described previously. Then an electrically conductive paste, prepared by adding a binder, a plasticizer and a solvent to a mixture of an electrically conductive powder containing silver as the main component and would make the external electrode layer 615a and a glass powder, is applied to the side faces of the stack 615 whereon the external electrodes 615 are to be formed by screen printing or the like, followed by drying and further baking at a predetermined temperature. Then a conductive agent powder consisting mainly of silver-palladium that would constitute the external electrode 615b is optionally mixed with a trace amount of a glass powder, a binder, a plasticizer and a solvent to prepare an electrically conductive paste, which is then applied on the external electrode 615b by screen printing or the like. Then the stack is heated to predetermined temperatures for drying and baking, thereby forming the external electrodes 615 comprising external electrode layers 615b provided on the outside of external electrode layers 615a.

The external electrodes 615 having the external electrode layers 615a containing much glass content and the external electrode layers 615b containing less glass content can be formed by adjusting the glass content included in the electrically conductive pastes intended to form the external electrode layers 615a and the external electrode layers 615b. The external electrode 615 constituted from the external electrode layers 615a and 615b may also be formed by printing and drying the external electrode layer 615a, then printing and drying the external electrode layer 615b thereon, and baking the layers together. A case of the external electrode 615 having 2-layer structure is described above, although the external electrode layer may be constituted from more layers.

The glass component is preferably a glass which includes at least one of lead oxide and silicon oxide and has a softening point not higher than 800° C., in order to obtain a high strength of bonding with the piezoelectric layer 11 and cause it to effectively infiltrate between the piezoelectric layer 11, 11. Besides such a glass, the glass component may be silica glass, soda-lime glass, lead alkali silicate glass, aluminoborosilicate glass, borosilicate glass, aluminosilicate glass, borate glass, phosphate glass, lead glass or the like.

The borosilicate glass, for example, may include 40 to 70% by mass of $SiO_2$, 2 to 30% by mass of $B_2O_3$, 0 to 20% by mass of $Al_2O_3$, 0 to 10% by mass in total of oxides of alkali earth metals such as MgO, CaO, SrO and BaO, and 0 to 10% by mass of alkali metal oxide. The borosilicate glass described above may also include 5 to 30% by mass of ZnO. ZnO has an effect of lowering the processing temperature of borosilicate glass.

Phosphate glass may contain 40 to 80% by mass of $P_2O_5$, 0 to 30% by mass of $Al_2O_3$, 0 to 30% by mass of $B_2O_3$, 0 to 30% by mass of ZnO, 0 to 30% by mass of oxides of alkali earth metals and 0 to 10% by mass of oxides of alkali metals.

Lead glass may contain 30 to 80% by mass of PbO, 0 to 70% by mass of $SiO_2$, 0 to 30% by mass of $Bi_2O_3$, 0 to 20% by mass of $Al_2O_3$, 0 to 30% by mass of ZnO, 0 to 30% by mass of oxides of alkali earth metals and 0 to 10% by mass of oxides of alkali metals.

The electrically conductive material used to form the external electrodes 615 preferably contains silver as the main component, in order to have resistance to oxidation and low Young's modulus and to be low in cost. A trace of platinum or palladium may be added for the purpose of improving the resistance to electro-migration.

Example 1

Gas Sensor

A gas sensor device was manufactured as follows. First, a zirconia powder consisting mainly of a stabilized zirconia (5 mol % $Y_2O_3$-containing $ZrO_2$) powder having a mean particle size of 0.4 μm, a glass powder, a binder, and a plasticizer were mixed to prepare a slurry. The slurry was formed into a ceramic green sheet having a thickness of 150 μm by a doctor blade method.

Then, on one surface of the ceramic green sheet, an electrically conductive paste prepared by adding a binder to a raw powder such as a silver alloy powder with the composition shown in Table 1 was printed in a thickness of 30 μm using a screen printing method. At this time, with respect to the portion to be provided with a heating element, a heating element pattern was printed in the shape of a folded zigzag shape so as to ensure concentration of heat generation like a conventional ceramic heater. To the electrically conductive paste for forming a lump containing layer 45, a stabilized zirconia (5 mol % $Y_2O_3$-containing $ZrO_2$) powder having a mean particle size of 0.4 μm was added in the amount of 1% by mass based on the metal powder. Then, the respective green sheets were stacked to obtain a stacked compact having a shape shown in FIG. 16. Regarding the position where a predetermined thickness of a ceramic layer is required, a required number of only green sheets were stacked without printing the electrically conductive paste.

After heating the stacked compact to a predetermined temperature to remove the binder, the stacked compact was fired at a temperature from 800 to 1,200° C. to obtain a sintered stack. Therefore, when the metal layers with a difference in silver concentration are formed via a ceramic layer, silver diffused from the metal layer having a high concentration to the metal layer having a low concentration to form a lump containing layer 45 having a high void ratio, and thus a comparatively dense metal layer 47 was formed. In a ceramic layer 55, a metal pattern 57 with a printed platinum paste was previously formed, followed by stacking. Thus, a heater-integrated oxygen sensor was obtained.

The temperature of the gas sensor device was maintained at a temperature of 700° C. by applying a voltage to the heater. Then, a mixed gas of hydrogen, methane, nitrogen and oxygen at an air fuel ratio of 12 was sprayed over the sensor, and thus it was confirmed whether or not the sensors functions by the fact whether or not a electromotive force is generated by the sensor. After alternately spraying a mixed gas of an air fuel ratio of 12 and a mixed gas of an air fuel ratio of 23 $1 \times 10^9$ times at intervals of 0.5 seconds, it was confirmed that the electromotive force varies depending on a difference in the air fuel ratio. Then, after spraying a mixed gas at an air fuel ratio of 12 over the sensor, it was confirmed whether or not the electromotive force is generated by the sensor. The results are shown in Table 1.

ply a gas to a ceramic layer 43 as a solid electrolyte that enables the sensor to function, no electromotive force was generated and the sample did not function as an oxygen sensor. Samples Nos. 2 to 11 functioned as an oxygen sensor. As a result, it was found that samples show excellent durability when a mass percentage of silver of a metal paste layer is 85% or more and a difference in the mass percentage of the metal paste layer is large. In particular, samples Nos. 3, 5, 6, 10 and 11, in which a mass percentage X of silver of metal layers 45 and 47 is 90% or more and a difference in the mass percentage is from 3 to 5%, showed most excellent durability.

Example 2

Filter

A filter device was manufactured as follows. First, a cordierite powder consisting mainly of a cordierite (5 mol % $Y_2O_3$-containing cordierite) powder having a mean particle size of 0.4 μm, a glass powder, a binder, and a plasticizer were mixed to prepare a slurry. The slurry was formed into a ceramic green sheet having a thickness of 150 μm by a doctor blade method.

On one surface of the ceramic green sheet, an electrically conductive paste prepared by adding a binder to a raw powder such as a silver alloy powder with the composition shown in Table 1 was printed in a thickness of 30 μm using a screen printing method. To an electrically conductive paste for forming a lump containing layer 63, a cordierite (5 mol % $Y_2O_3$-containing cordierite) powder having a mean particle size of 0.4 μm was added in the amount of 1% by mass based on the metal powder.

Then, green sheets were stacked to obtain a stacked compact having a shape shown in FIG. 19. Regarding the position where a predetermined thickness of a ceramic layer is required, only green sheets were stacked without printing the electrically conductive paste.

After heating the stacked compact to a predetermined temperature to remove the binder, the stacked compact was fired at a temperature from 800 to 1,200° C. to obtain a filter device. An experimentally synthesized exhaust gas was supplied, and then filter characteristics were measured in a state of being maintained at 400° C. A continuous operation was conducted

TABLE 1

| No. | Metal composition of high-content metal paste | Metal composition of metal paste | Metal composition of high-content metal paste after firing | Void ratio of high-content metal paste after firing (%) | Metal composition of metal paste after firing | Void ratio of metal paste after firing (%) | Electromotive force (V) | Electromotive force after 1 × $10^9$ cycles (V) |
|---|---|---|---|---|---|---|---|---|
| 1 | 100% Ag | 100% Ag | 100% Ag | 25 | 100% Ag | 25 | 0 | None |
| 2 | 100% Ag | 99% Ag—1% Pt | 100% Ag | 70 | 99.5% Ag—0.5% Pd | 15 | 0.5 | 0.3 |
| 3 | 100% Ag | 97% Ag—3% Pt | 97% Ag—3% Pt | 85 | 97% Ag—3% Pt | 10 | 0.65 | 0.65 |
| 4 | 97% Ag—3% Pt | 95% Ag—5% Pt | 96% Ag—4% Pt | 75 | 96% Ag—4% Pt | 10 | 0.7 | 0.65 |
| 5 | 98% Ag—2% Pt | 95% Ag—5% Pt | 95% Ag—5% Pt | 85 | 95% Ag—5% Pt | 10 | 0.65 | 0.65 |
| 6 | 95% Ag—5% Pt | 90% Ag—10% Pt | 92% Ag—8% Pt | 80 | 91% Ag—9% Pt | 15 | 0.7 | 0.7 |
| 7 | 95% Ag—5% Pt | 85% Ag—15% Pt | 90% Ag—10% Pt | 75 | 86% Ag—14% Pt | 15 | 0.65 | 0.6 |
| 8 | 95% Ag—5% Pt | 75% Ag—25% Pt | 85% Ag—15% Pt | 65 | 80% Ag—20% Pt | 20 | 0.6 | 0.4 |
| 9 | 95% Ag—5% Pt | 65% Ag—35% Pt | 75% Ag—25% Pt | 60 | 70% Ag—30% Pt | 20 | 0.55 | 0.3 |
| 10 | 98% Ag—2% Pd | 95% Ag—5% Pd | 95% Ag—5% Pd | 85 | 95% Ag—5% Pd | 10 | 0.65 | 0.65 |
| 11 | 98% Ag—2% Pt | 95% Ag—5% Pd | 95% Ag—5% Pt | 85 | 95% Ag—5% Pd | 10 | 0.65 | 0.65 |

As is apparent from the results shown in Table 1, since sample No. 1 comprising a dense metal layer 45 cannot supat 400° C. for 1,000 hours and filter characteristics were measured again. The results are shown in Table 2.

TABLE 2

| No. | Metal composition of high-content metal paste | Metal composition of metal paste | Metal composition of high-content metal paste after firing | Void ratio of high-content metal paste after firing (%) | Metal composition of metal paste after firing | Void ratio of metal paste after firing (%) | Gas flow rate (l/cm²) | Gas flow rate after 1,000 hours (l/cm²) |
|---|---|---|---|---|---|---|---|---|
| 1 | 100% Ag | 100% Ag | 100% Ag | 30 | 100% Ag | 30 | 0 | 0 |
| 2 | 100% Ag | 99% Ag—1% Pt | 100% Ag | 65 | 99.5% Ag—0.5% Pd | 20 | 4 | 2 |
| 3 | 100% Ag | 97% Ag—3% Pt | 97% Ag—3% Pt | 80 | 97% Ag—3% Pt | 15 | 5.2 | 5.2 |
| 4 | 97% Ag—3% Pt | 95% Ag—5% Pt | 96% Ag—4% Pt | 70 | 96% Ag—4% Pt | 15 | 5 | 4.8 |
| 5 | 98% Ag—2% Pt | 95% Ag—5% Pt | 95% Ag—5% Pt | 85 | 95% Ag—5% Pt | 15 | 5.2 | 5.2 |
| 6 | 95% Ag—5% Pt | 90% Ag—10% Pt | 92% Ag—8% Pt | 80 | 91% Ag—9% Pt | 20 | 5.4 | 5.4 |
| 7 | 95% Ag—5% Pt | 85% Ag—15% Pt | 90% Ag—10% Pt | 70 | 86% Ag—14% Pt | 20 | 5.2 | 5 |
| 8 | 95% Ag—5% Pt | 75% Ag—25% Pt | 85% Ag—15% Pt | 60 | 80% Ag—20% Pt | 25 | 5.2 | 3 |
| 9 | 95% Ag—5% Pt | 65% Ag—35% Pt | 75% Ag—25% Pt | 55 | 70% Ag—30% Pt | 25 | 5.4 | 2.6 |
| 10 | 98% Ag—2% Pd | 95% Ag—5% Pd | 95% Ag—5% Pd | 85 | 95% Ag—5% Pd | 15 | 5.2 | 5.2 |
| 11 | 98% Ag—2% Pt | 95% Ag—5% Pd | 95% Ag—5% Pt | 80 | 95% Ag—5% Pd | 15 | 5.2 | 5.2 |

As is apparent from the results shown in Table 2, sample No. 1 comprising a metal layer 63 as a dense electrode layer did not function as a filter. Samples Nos. 2 to 11 functioned as a filter. As a result, it was found that samples show excellent durability when a mass percentage X of silver of a metal paste layer is 85% or more and a difference in the mass percentage of the metal paste layer is large. In particular, samples Nos. 3, 5, 6, 10 and 11, in which a mass percentage X of silver of metal layers is 90% or more and a difference in the mass percentage is from 3 to 5% of these metal layers, showed most excellent durability.

Example 3

Fuel Cell

A fuel cell device was manufactured as follows. First, a zirconia powder consisting mainly of a cordierite (5 mol % $Y_2O_3$-containing $ZrO_2$) powder having a mean particle size of 0.4 μm, a glass powder, a binder, and a plasticizer were mixed to prepare a slurry. The slurry was formed into a ceramic green sheet having a thickness of 150 μm by a doctor blade method.

On one surface of the ceramic green sheet, an electrically conductive paste prepared by adding a binder to a raw powder such as a silver alloy powder with the composition shown in Table 1 was printed in a thickness of 30 μm using a screen printing method.

Then, green sheets were stacked to obtain a stacked compact having a shape shown in FIG. 17. Regarding the position where a predetermined thickness of a ceramic layer is required, only green sheets were stacked without printing the electrically conductive paste. After heating the stacked compact to a predetermined temperature to remove the binder, the stacked compact was fired at a temperature from 800 to 1,200° C. to obtain a sintered stack. Therefore, when the metal layers with a difference in silver concentration are formed via a ceramic layer, silver diffused from the metal layer having a high concentration to the metal layer having a low concentration to form metal layers 63 and 65 having a high void ratio, and thus comparatively dense metal layers 73 and 77 were formed.

After machining the sintered stack into desired dimensions, external electrodes are formed thereon. First, a metal powder consisting mainly of silver, a binder, a plasticizer and a glass powder were mixed to prepare an electrically conductive paste for an external electrode. The electrically conductive paste was screen-printed on the position, where an external electrode 69 is to be formed, on the side faces of the sintered stack. Then, the sintered stack was fired at a temperature from 600 to 800° C. to form an external electrode, and thus a fuel cell device was obtained.

Oxygen was supplied to an air pole side and hydrogen was supplied to a fuel pole side, and then power density of power generation was measured at a state of being maintained at 800° C. A continuous operation was conducted at 800° C. for 1,000 hours and power density of power generation was measured again. The results are shown in Table 3.

TABLE 3

| No. | Metal composition of high-content metal paste | Metal composition of metal paste | Metal composition of high-content metal paste after firing | Void ratio of high-content metal paste after firing (%) | Metal composition of metal paste after firing | Void ratio of metal paste after firing (%) | Power density (mW/cm²) | Power density after 1,000 hours (mW/cm²) |
|---|---|---|---|---|---|---|---|---|
| 1 | 100% Ag | 100% Ag | 100% Ag | 25 | 100% Ag | 25 | 0 | None |
| 2 | 100% Ag | 95% Ag—1% Pt | 100% Ag | 70 | 99.5% Ag—0.5% Pd | 15 | 2 | 1 |
| 3 | 100% Ag | 97% Ag—3% Pt | 97% Ag—3% Pt | 85 | 97% Ag—3% Pt | 10 | 2.6 | 2.6 |
| 4 | 97% Ag—3% Pt | 95% Ag—5% Pt | 96% Ag—4% Pt | 75 | 96% Ag—4% Pt | 10 | 2.5 | 2.4 |
| 5 | 98% Ag—2% Pt | 95% Ag—5% Pt | 95% Ag—5% Pt | 85 | 95% Ag—5% Pt | 10 | 2.6 | 2.6 |
| 6 | 95% Ag—5% Pt | 90% Ag—10% Pt | 92% Ag—8% Pt | 80 | 91% Ag—9% Pt | 15 | 2.7 | 2.7 |
| 7 | 95% Ag—5% Pt | 85% Ag—15% Pt | 90% Ag—10% Pt | 75 | 86% Ag—14% Pt | 15 | 2.6 | 2.5 |

TABLE 3-continued

| No. | Metal composition of high-content metal paste | Metal composition of metal paste | Metal composition of high-content metal paste after firing | Void ratio of high-content metal paste after firing (%) | Metal composition of metal paste after firing | Void ratio of metal paste after firing (%) | Power density (mW/cm²) | Power density after 1,000 hours (mW/cm²) |
|---|---|---|---|---|---|---|---|---|
| 8 | 95% Ag—5% Pt | 75% Ag—25% Pt | 85% Ag—15% Pr | 65 | 80% Ag—20% Pt | 20 | 2.6 | 1.5 |
| 9 | 95% Ag—5% Pt | 65% Ag—35% Pt | 75% Ag—25% Pt | 60 | 70% Ag—30% Pt | 20 | 2.7 | 1.3 |
| 10 | 98% Ag—2% Pd | 95% Ag—5% Pd | 95% Ag—5% Pd | 85 | 95% Ag—5% Pd | 10 | 2.6 | 2.6 |
| 11 | 98% Ag—2% Pt | 95% Ag—5% Pd | 95% Ag—5% Pt | 85 | 95% Ag—5% Pd | 10 | 2.6 | 2.9 |

As is apparent from the results shown in Table 3, since sample No. 1 comprising metal layers 63 and 65 as a dense electrode layer can supply neither oxygen nor hydrogen to ceramic layer 67 as a solid electrolyte that enables a powder generation function via metal layers 63 and 65, no electromotive force was generated and the sample did not function as a fuel cell. Samples Nos. 2 to 11 functioned as a fuel cell. As a result, it was found that samples show excellent durability when a mass percentage X of silver of a metal paste layer is 85% or more and a difference in the mass percentage of the metal paste layer is large. In particular, samples Nos. 3, 5, 6, 10 and 11, in which a mass percentage X of silver of the metal paste layer is 90% or more and a difference in the mass percentage is from 3 to 5%, showed most excellent durability.

Example 4

Multi-Layer Piezoelectric Device

A multi-layer piezoelectric device was manufactured as follows. First, a raw powder consisting mainly of a lead titanate zirconate (PZT) powder having a mean particle size of 0.4 µm, a binder, and a plasticizer were mixed to prepare a slurry. The slurry was formed into a ceramic green sheet having a thickness of 150 µm by a doctor blade method. On one surface of the ceramic green sheet, an electrically conductive paste prepared by adding a binder to a raw powder such as a silver alloy powder with the composition shown in Table 4 was printed in a thickness of 30 µm using a screen printing method. To a metal paste layer for forming a lump containing layer 95, a lead titanate zirconate (PZT) powder having a mean particle size of 0.4 µm was added in the amount of 1% by mass based on the metal powder. Table 4 is divided into Table 4(1) and Table 4(2).

TABLE 4(1)

| No. | Metal composition of high-content metal paste | Metal composition of metal paste | Metal composition of high-content metal paste after firing | Void ratio of high-content metal paste after firing (%) | Metal composition of metal paste after firing | Void ratio of metal paste after firing (%) | Amount of displacement at initial state (µm) | Noise of harmonic components |
|---|---|---|---|---|---|---|---|---|
| 1 | 100% Ag | 100% Ag | 100% Ag | 25 | 100% Ag | 25 | 5 | generated |
| 2 | 100% Ag | 99% Ag—1% Pd | 100% Ag | 70 | 99.5% Ag—0.5% Pd | 15 | 10 | not generated |
| 3 | 100% Ag | 98% Ag—2% Pd | 99% Ag—1% PD | 80 | 99% Ag—1% Pd | 15 | 10 | not generated |
| 4 | 100% Ag | 95% Ag—5% Pd | 97% Ag—3% Pd | 85 | 96% Ag—4% Pd | 10 | 10 | not generated |
| 5 | 100% Ag | 90% Ag—10% Pd | 95% Ag—5% Pd | 75 | 90% Ag—10% Pd | 15 | 10 | not generated |
| 6 | 100% Ag | 80% Ag—20% Pd | 90% Ag—10% Pd | 65 | 85% Ag—15% Pd | 20 | 10 | not generated |
| 7 | 100% Ag | 70% Ag—30% Pd | 85% Ag—15% Pd | 60 | 75% Ag—25% Pd | 20 | 10 | not generated |
| 8 | 100% Ag | 98% Ag—2% Pt | 99% Ag—1% Pt | 80 | 99% Ag—1% Pt | 15 | 10 | not generated |
| 9 | 100% Ag | 97% Ag—3% Pt | 97% Ag—3% Pt | 85 | 97% Ag—3% Pt | 10 | 10 | not generated |
| 10 | 100% Ag | 95% Ag—5% Pt | 97% Ag—3% Pt | 85 | 96% Ag—4% Pt | 10 | 10 | not generated |
| 11 | 100% Ag | 90% Ag—10% Pt | 95% Ag—5% Pt | 75 | 90% Ag—10% Pt | 15 | 10 | not generated |
| 12 | 100% Ag | 80% Ag—20% Pt | 90% Ag—10% Pt | 65 | 85% Ag—15% Pt | 20 | 10 | not generated |
| 13 | 100% Ag | 70% Ag—30% Pt | 85% Ag—15% Pt | 60 | 75% Ag—25% Pt | 20 | 10 | not generated |
| 14 | 97% Ag—3% Pd | 95% Ag—5% Pd | 96% Ag—4% Pd | 75 | 96% Ag—4% Pt | 10 | 10 | not generated |
| 15 | 98% Ag—2% Pd | 95% Ag—5% Pd | 95% Ag—5% Pd | 85 | 95% Ag—5% Pt | 10 | 10 | not generated |
| 16 | 95% Ag—5% Pd | 90% Ag—10% Pd | 92% Ag—8% Pd | 80 | 91% Ag—9% Pd | 15 | 10 | not generated |
| 17 | 95% Ag—5% Pd | 85% Ag—15% Pd | 90% Ag—10% Pd | 75 | 86% Ag—14% Pd | 15 | 10 | not generated |
| 18 | 95% Ag—5% Pd | 75% Ag—25% Pd | 85% Ag—15% Pd | 65 | 80% Ag—20% Pd | 20 | 10 | not generated |
| 19 | 95% Ag—5% Pd | 65% Ag—35% Pd | 75% Ag—25% Pd | 60 | 70% Ag—30% Pd | 20 | 10 | not generated |

TABLE 4(1)-continued

| No. | Beat sound at 1 kHz or more | Amount of displacement after $1 \times 10^9$ cycles (μm) | Peeling at stacked portion after continuous operation ($1 \times 10^9$ times) |
|---|---|---|---|
| 1 | generated | Cracks occurred | occurred |
| 2 | not generated | 9.5 | not occurred |
| 3 | not generated | 9.9 | not occurred |
| 4 | not generated | 10 | not occurred |
| 5 | not generated | 9.9 | not occurred |
| 6 | not generated | 9 | not occurred |
| 7 | not generated | 8 | not occurred |
| 8 | not generated | 9.9 | not occurred |
| 9 | not generated | 10 | not occurred |
| 10 | not generated | 10 | not occurred |
| 11 | not generated | 9.9 | not occurred |
| 12 | not generated | 9 | not occurred |
| 13 | not generated | 8 | not occurred |
| 14 | not generated | 9.9 | not occurred |
| 15 | not generated | 10 | not occurred |
| 16 | not generated | 10 | not occurred |
| 17 | not generated | 9.9 | not occurred |
| 18 | not generated | 9 | not occurred |
| 19 | not generated | 8 | not occurred |

TABLE 4(2)

| No. | Metal composition of high-content metal paste | Metal composition of metal paste | Metal composition of high-content metal paste after firing | Void ratio of high-content metal paste after firing (%) | Metal composition of metal paste after firing | Void ratio of metal paste after firing (%) | Amount of displacement at initial state (μm) | Noise of harmonic components |
|---|---|---|---|---|---|---|---|---|
| 20 | 97% Ag—3% Pt | 95% Ag—5% Pt | 96% Ag—4% Pt | 75 | 96% Ag—4% Pt | 10 | 10 | not generated |
| 21 | 98% Ag—2% Pt | 95% Ag—5% Pt | 95% Ag—5% Pt | 85 | 95% Ag—5% Pt | 10 | 10 | not generated |
| 22 | 95% Ag—5% Pt | 90% Ag—10% Pt | 92% Ag—8% Pt | 80 | 91% Ag—9% Pt | 15 | 10 | not generated |
| 23 | 95% Ag—5% Pt | 85% Ag—15% Pt | 90% Ag—10% Pt | 75 | 86% Ag—14% Pt | 15 | 10 | not generated |
| 24 | 95% Ag—5% Pt | 75% Ag—25% Pt | 85% Ag—15% Pt | 65 | 80% Ag—20% Pt | 20 | 10 | not generated |
| 25 | 95% Ag—5% Pt | 65% Ag—35% Pt | 75% Ag—25% Pt | 60 | 70% Ag—30% Pt | 20 | 10 | not generated |
| 26 | 97% Ag—3% Pt | 95% Ag—5% Pd | 96% Ag—4% Pt | 75 | 96% Ag—4% Pd | 10 | 10 | not generated |
| 27 | 98% Ag—2% Pt | 95% Ag—5% Pd | 95% Ag—5% Pt | 85 | 95% Ag—5% Pd | 10 | 10 | not generated |
| 28 | 95% Ag—5% Pt | 90% Ag—10% Pd | 92% Ag—8% Pt | 80 | 91% Ag—9% Pd | 15 | 10 | not generated |
| 29 | 95% Ag—5% Pt | 85% Ag—15% Pd | 90% Ag—10% Pt | 75 | 86% Ag—14% Pd | 15 | 10 | not generated |
| 30 | 95% Ag—5% Pt | 75% Ag—25% Pd | 85% Ag—15% Pt | 65 | 80% Ag—20% Pd | 20 | 10 | not generated |
| 31 | 95% Ag—5% Pt | 65% Ag—35% Pd | 75% Ag—25% Pt | 60 | 70% Ag—30% Pd | 20 | 10 | not generated |
| 32 | 100% Pt + acryl beads | 100% Pt + acryl beads | 100% Pt | 60 | 100% Pt | 60 | 0 | not generated |
| 33 | Sputtering method 70% Ag—30% Pd | Sputtering method 70% Ag—30% Pd | 70% Ag—30% Pd | 10 | 70% Ag—30% Pd | 10 | 5 | not generated |

| No. | Beat sound at 1 kHz or more | Amount of displacement after $1 \times 10^9$ cycles (μm) | Peeling at stacked portion after continuous operation ($1 \times 10^9$ times) |
|---|---|---|---|
| 20 | not generated | 9.9 | not occurred |
| 21 | not generated | 10 | not occurred |
| 22 | not generated | 10 | not occurred |
| 23 | not generated | 9.9 | not occurred |
| 24 | not generated | 9 | not occurred |
| 25 | not generated | 8 | not occurred |
| 26 | not generated | 9.9 | not occurred |
| 27 | not generated | 10 | not occurred |
| 28 | not generated | 10 | not occurred |
| 29 | not generated | 9.9 | not occurred |
| 30 | not generated | 9 | not occurred |
| 31 | not generated | 8 | not occurred |
| 32 | not generated | not occurred | not occurred |
| 33 | generated | cracks occurred | occurred |

Then, green sheets were stacked to obtain a stacked compact having a shape shown in FIG. 25. Regarding the operation region, 100 metal layers were stacked. Regarding the position where a predetermined thickness of a ceramic layer is required, a required number of only green sheets were stacked without printing the electrically conductive paste.

After heating the stacked compact to a predetermined temperature to remove the binder, the stacked compact was fired at a temperature from 800 to 1,200° C. to obtain a sintered stack. Therefore, when the metal layers with a difference in silver concentration are formed via a ceramic layer, silver diffused from the metal layer having a high concentration to the metal layer having a low concentration to form a lump-containing layer 95 having a high void ratio, and thus comparatively dense metal layer 93 was formed.

After machining the sintered stack into desired dimensions, external electrodes are formed thereon. First, a metal powder consisting mainly of silver, a binder, a plasticizer and a glass powder were mixed to prepare an electrically conductive paste for an external electrode. The electrically conductive paste was screen-printed on the position, where an external electrode 101 is to be formed, on the side faces of the sintered stack. Then, the sintered stack was fired at a temperature from 600 to 800° C. to form an external electrode, and thus a multi-layer piezoelectric device was obtained.

Lead wires were connected to external electrodes 101, and DC voltage of 3 kV/mm was applied to positive and negative external electrodes 101 via the lead wires for 15 minutes so as to apply polarization treatment, thereby to complete a piezoelectric actuator that employs a multi-layer piezoelectric device. DC voltage of 170 V was applied to the resultant multi-layer piezoelectric device and, as a result, all piezoelectric actuators except for sample Nos. 32 undergo displacement in the stacking direction. The piezoelectric actuator was continuously operated up to $1 \times 10^9$ times by applying AC voltage of 0 to +170 V at room temperature at a frequency of 150 Hz. The results are shown in Table 3.

TABLE 5

| No. | Metal composition of high-content metal paste | Metal composition of metal paste | Metal composition of high-content metal paste after firing | Void ratio of high-content metal paste after firing (%) | Metal composition of metal paste after firing | Void ratio of metal paste after firing (%) | Amount of displacement at initial state (μm) | Noise of harmonic components |
|---|---|---|---|---|---|---|---|---|
| 1 | 100% Ag | 100% Ag | 100% Ag | 25 | 100% Ag | 25 | 5 | generated |
| 2 | 100% Ag | 99% Ag—1% Pd | 100% Ag | 55 | 99.5% Ag—0.5% Pd | 15 | 10 | not generated |
| 3 | 97% Ag—3% Pd | 95% Ag—5% Pd | 96% Ag—4% PD | 60 | 96% Ag—4% Pd | 15 | 10 | not generated |
| 4 | 98% Ag—2% Pd | 95% Ag—5% Pd | 97% Ag—3% Pd | 65 | 97% Ag—3% Pd | 15 | 10 | not generated |
| 5 | 95% Ag—5% Pd | 90% Ag—10% Pd | 92% Ag—8% Pd | 70 | 92% Ag—8% Pd | 15 | 10 | not generated |
| 6 | 95% Ag—5% Pd | 85% Ag—15% Pd | 90% Ag—10% Pd | 75 | 90% Ag—10% Pd | 10 | 10 | not generated |
| 7 | 95% Ag—5% Pd | 80% Ag—20% Pd | 90% Ag—10% Pd | 75 | 85% Ag—15% Pd | 10 | 10 | not generated |
| 8 | 95% Ag—5% Pd | 75% Ag—25% Pd | 85% Ag—15% Pd | 80 | 80% Ag—20% Pt | 10 | 10 | not generated |
| 9 | 95% Ag—5% Pd | 70% Ag—30% Pd | 85% Ag—15% Pd | 80 | 80% Ag—20% Pt | 10 | 10 | not generated |
| 10 | 95% Ag—5% Pd | 65% Ag—35% Pd | 75% Ag—25% Pd | 60 | 70% Ag—30% Pt | 20 | 10 | not generated |
| 11 | 100% Ag | 80% Ag—20% Pd | 90% Ag—10% Pd | 80 | 85% Ag—15% Pd | 10 | 10 | not generated |
| 12 | 100% Ag | 80% Ag—20% Pt | 90% Ag—10% Pt | 80 | 85% Ag—15% Pt | 10 | 10 | not generated |
| 13 | 95% Ag—5% Pt | 75% Ag—25% Pt | 85% Ag—15% Pt | 80 | 80% Ag—20% Pt | 10 | 10 | not generated |
| 14 | 95% Ag—5% Pt | 75% Ag—25% Pd | 85% Ag—15% Pt | 80 | 80% Ag—20% Pd | 10 | 10 | not generated |

| No. | Beat sound at 1 kHz or more | Amount of displacement after $1 \times 10^9$ cycles (μm) | Peeling at stacked portion after continuous operation ($1 \times 10^9$ times) |
|---|---|---|---|
| 1 | generated | cracks occurred | occurred |
| 2 | not generated | 9.9 | not occurred |
| 3 | not generated | 9.9 | not occurred |
| 4 | not generated | 9.9 | not occurred |
| 5 | not generated | 9.9 | not occurred |
| 6 | not generated | 10 | not occurred |
| 7 | not generated | 10 | not occurred |
| 8 | not generated | 10 | not occurred |
| 9 | not generated | 10 | not occurred |
| 10 | not generated | 9.5 | not occurred |
| 11 | not generated | 10 | not occurred |
| 12 | not generated | 10 | not occurred |
| 13 | not generated | 10 | not occurred |
| 14 | not generated | 10 | not occurred |

As is apparent from the results in Table 3, in samples Nos. 1 and 33, peeling occurred in the interface between the stacks during a continuous operation. It was found that, when the frequency of the drive voltage is gradually increased from 150 Hz so as to confirm rapid response of a piezoelectric actuator, beat sound is generated by the device at 1 kHz or more (beat sound could be heard with the ears). When the pulse waveform was confirmed by an oscilloscope DL1640L manufactured by Yokogawa Electric Corporation so as to confirm the frequency of the drive voltage in the device where beat sound is generated, harmonic noise could be confirmed at the position corresponding to frequencies integer times the frequency of the drive voltage. In sample No. 32, since displacement and deformation of a piezoelectric material was absorbed as a result of deformation of a metal layer by the cushion effect of the metal layer, the entire device caused no deformation.

In samples Nos. 2 to 31 as Examples of the present invention, an amount of displacement of the device did not drastically decrease even after the continuous operation $1\times10^9$ times and samples had an effective amount of displacement required as a piezoelectric actuator.

Samples show excellent durability when a mass percentage X of silver of a metal paste layer is 85% or more and a difference in the mass percentage of the metal paste layer is from 2 to 10%. Samples Nos. 4, 9, 10, 15, 16, 21, 22, 27 and 28, in which a mass percentage X of silver of the metal paste layer is 90% or more and a difference in the mass percentage is from 3 to 5%, showed most excellent durability.

Example 5

Multi-Layer Piezoelectric Device

Figure 44:
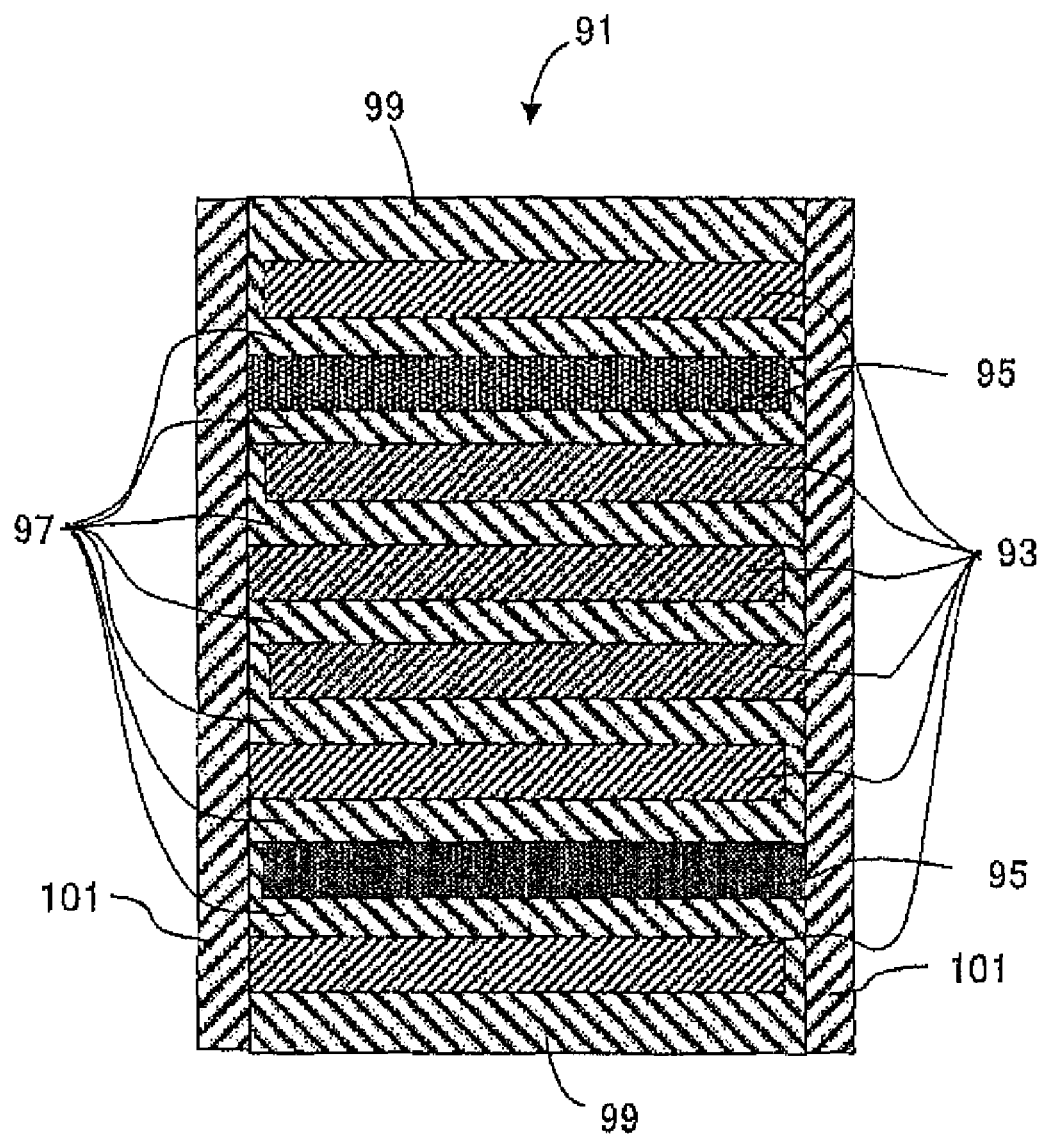
FIG. 44 is a sectional view showing a state of sample of Example 5 before firing.
Figure 45:
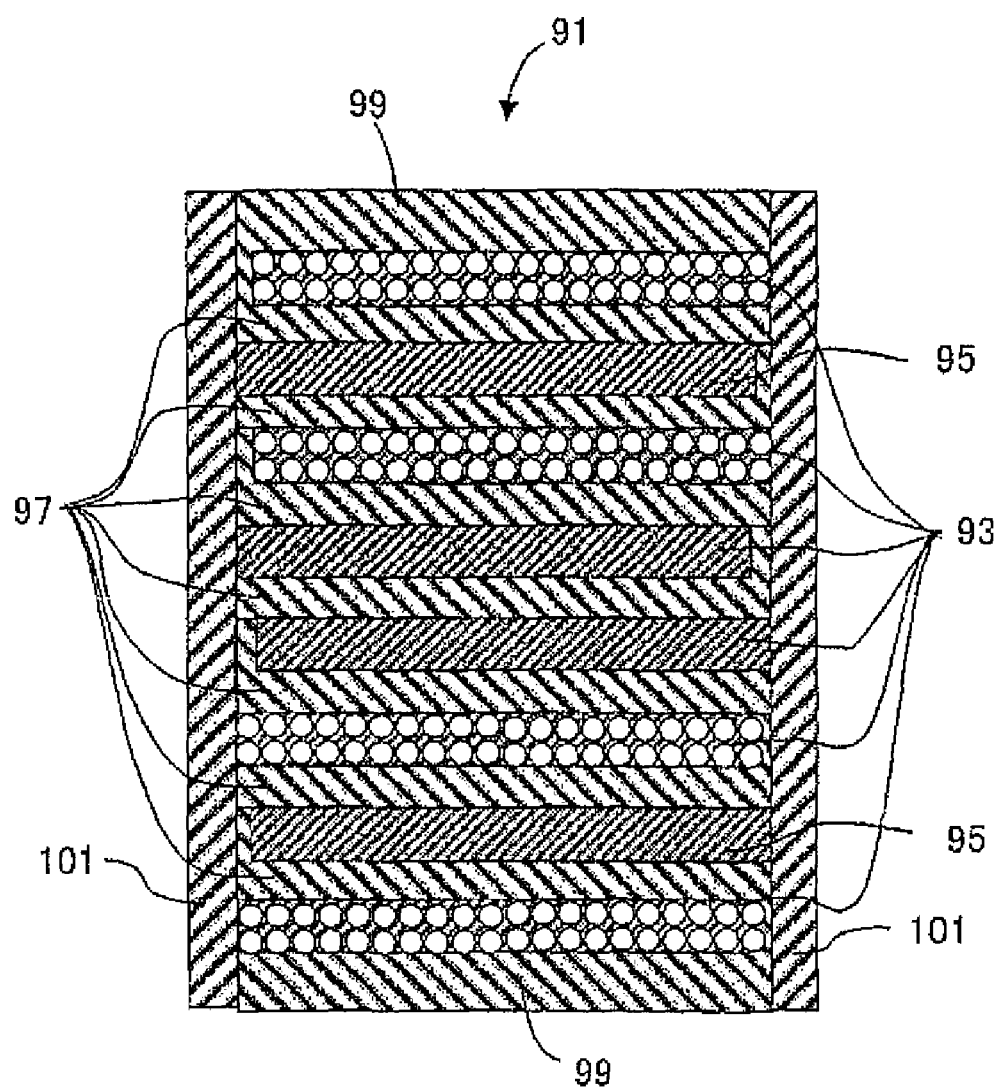
FIG. 45 is a sectional view showing a state of sample of Example 5 after firing.

Multi-layer piezoelectric devices of samples Nos. 1 to 14 shown in Table 5 were manufactured by a procedure similar to that described in Example 4 so as to have a shape shown in FIG. 45. FIG. 44 is a sectional view showing a multi-layer compact before firing. As shown in FIG. 44, low percentage metal paste layers 95 were respectively arranged on both sides in the stacking direction of the multi-layer piezoelectric device. Metal composition of the low percentage metal paste layers and that of the metal paste layer on both side of them are as shown in Table 5. With respect to the resultant samples Nos. 1 to 14, evaluation similar to that described in Example 4 was conducted. The results are shown in Table 5. In sample No. 1, characteristics deteriorated during the cycle test. Other samples showed good results. As a mass percentage X of the metal paste layer increases, good results may be obtained.

Example 6

A multi-layer piezoelectric device as shown in FIG. 32 was manufactured. First, a calcined powder of a piezoelectric ceramic consisting mainly of PZT having a mean particle size of 0.4 µm, a binder, and a plasticizer were mixed to prepare a slurry. The slurry was formed into a ceramic green sheet having a thickness of 150 µm by a doctor blade method.

On one surface of the ceramic green sheet, an electrically conductive paste prepared by adding a binder to a silver-palladium alloy (90 mass % silver—10 mass % palladium) for forming an internal electrode 402 was printed in a thickness of 4 µm using a screen printing method. Furthermore, on one surface of a portion of the ceramic green sheet, an inorganic paste, which is prepared by adding acryl beads having a mean particle size of 0.5 µm to a silver powder in the amount of 200% by volume based on 100% by volume of the silver powder and further adding a binder, was applied by a screen printing method so as to form a lump containing layer 403 having a thickness of 4 µm.

Then, the respective ceramic green sheets were stacked so as to form the lump containing layer 403 in the proportion of 1 layer to 20 layers of ceramic green sheets with an electrically conductive paste printed for forming an internal electrode 402. The number of green sheets with an electrically conductive paste printed for forming the internal electrode 402 was 300, while the number of inorganic pastes for forming the lump containing layer 403 was 14. On both sides of the outside in the stacking direction of the ceramic green sheet with the lump-containing paste printed thereon, a ceramic green sheet with the printed thereon was stacked so that the internal electrodes 402 functions as electrodes opposite in polarity. The resultant stacked compact was degreased at a predetermined temperature and then fired at 980 to 1,100° C. to obtain a fired stack. The resultant fired stack was ground by a surface grinder to obtain a stack 410.

Next, a silver glass electrically conductive paste for forming an external electrode 4 was formed on the side face of the stack 410 in a thickness of 30 µm by screen printing, and then baked at 700° C. for 30 minutes to form an external electrode 4. In the resultant device, a void ratio of the lump containing layer 403 was 80%, while a void ratio of the internal electrode 402 was 20%. In the lump containing layer 403, silver was dispersed and distributed, and voids were formed between these dispersed silvers.

Lead wires were connected to external electrodes 4, and DC electric field of 3 kV/mm was applied to positive and negative external electrodes 4 via the lead wires for 15 minutes so as to apply polarization treatment, thereby to complete a piezoelectric actuator that employs a multi-layer piezoelectric device as shown in FIG. 32. DC voltage of 160 V was applied to the resultant multi-layer piezoelectric actuator and, as a result, it undergoes displacement in the amount of 40 µm in the stacking direction. The multi-layer piezoelectric actuator was continuously operated up to $1\times10^9$ times by applying AC voltage of 0 to +160 V at room temperature at a frequency of 150 Hz. The results are shown in Table 6.

TABLE 6

| Sample No. | Complex layer | Initial amount of displacement | Amount of displacement after operation $1 \times 10^9$ times at 0 to +160 V |
|---|---|---|---|
| 1 | formed | 40 µm | 40 µm |
| 2 | none | 38 µm | Cracks occurred at $5 \times 10^7$ times |

As shown in Table 6, the multi-layer piezoelectric actuator (sample No. 1) of the present invention undergoes displacement in the amount of 40 µm in the stacking direction similar to that before the continuous operation, and there was no abnormality in the stack 410.

In a multi-layer piezoelectric actuator comprising neither a lump containing layer 403 nor a composite layer 411 of sample No. 2, that is not within the scope of the present invention, cracks occurred in a piezoelectric material at 5×07 cycles. The reason is considered that a piezoelectric material layer 1 could not sufficiently absorb stress generated during the operation and thus cracks occurred in the piezoelectric material layer 1.

Example 7

Except that the constitution of the lump containing layer 403 and the arrangement of the composite layer 411 were varied, a multi-layer piezoelectric actuator similar to Example 6 was manufactured. The evaluation results are shown in Table 7.

Figure 46:
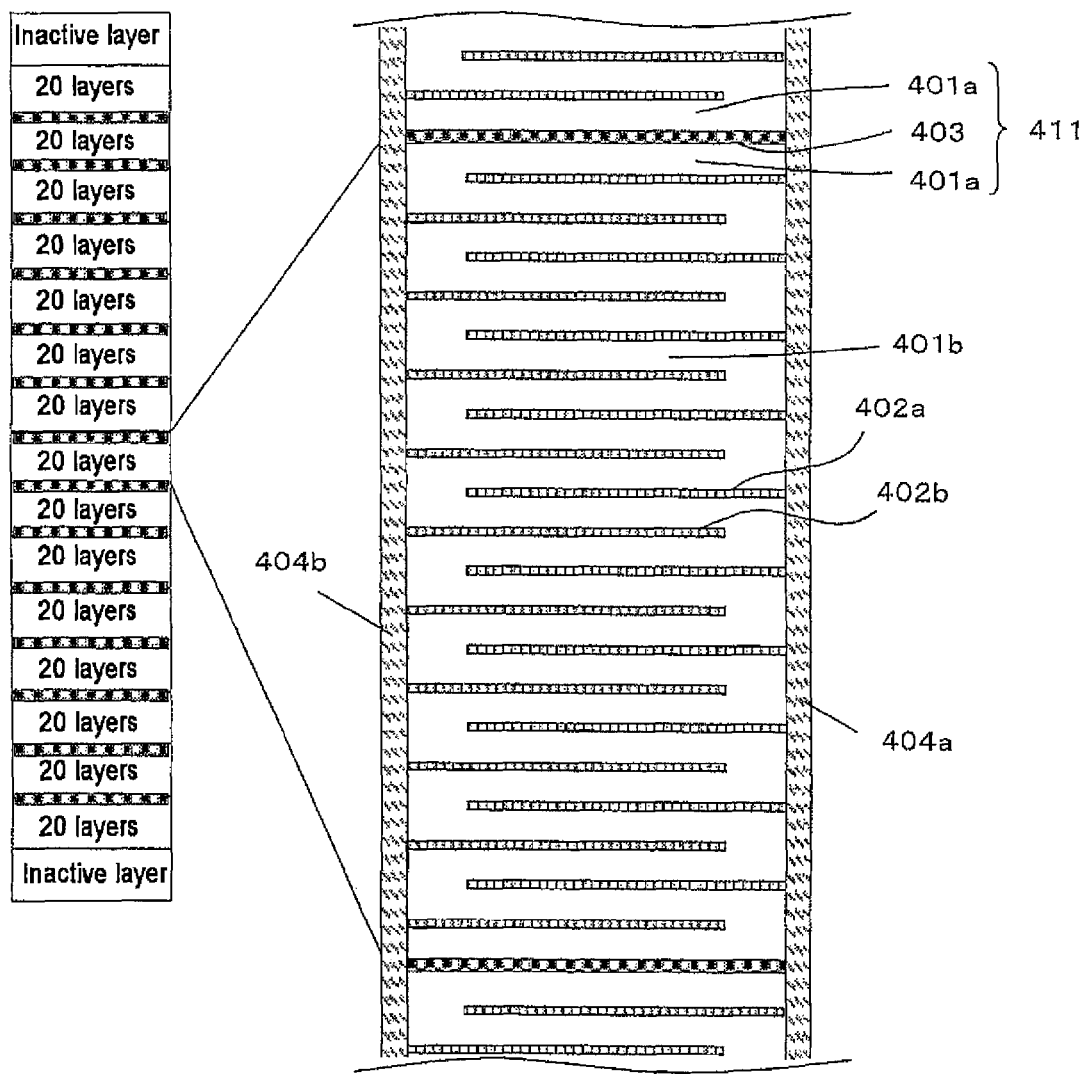
FIG. 46 is a schematic sectional view showing samples Nos. 1, 3 and 4 of Example 7.
Figure 47:
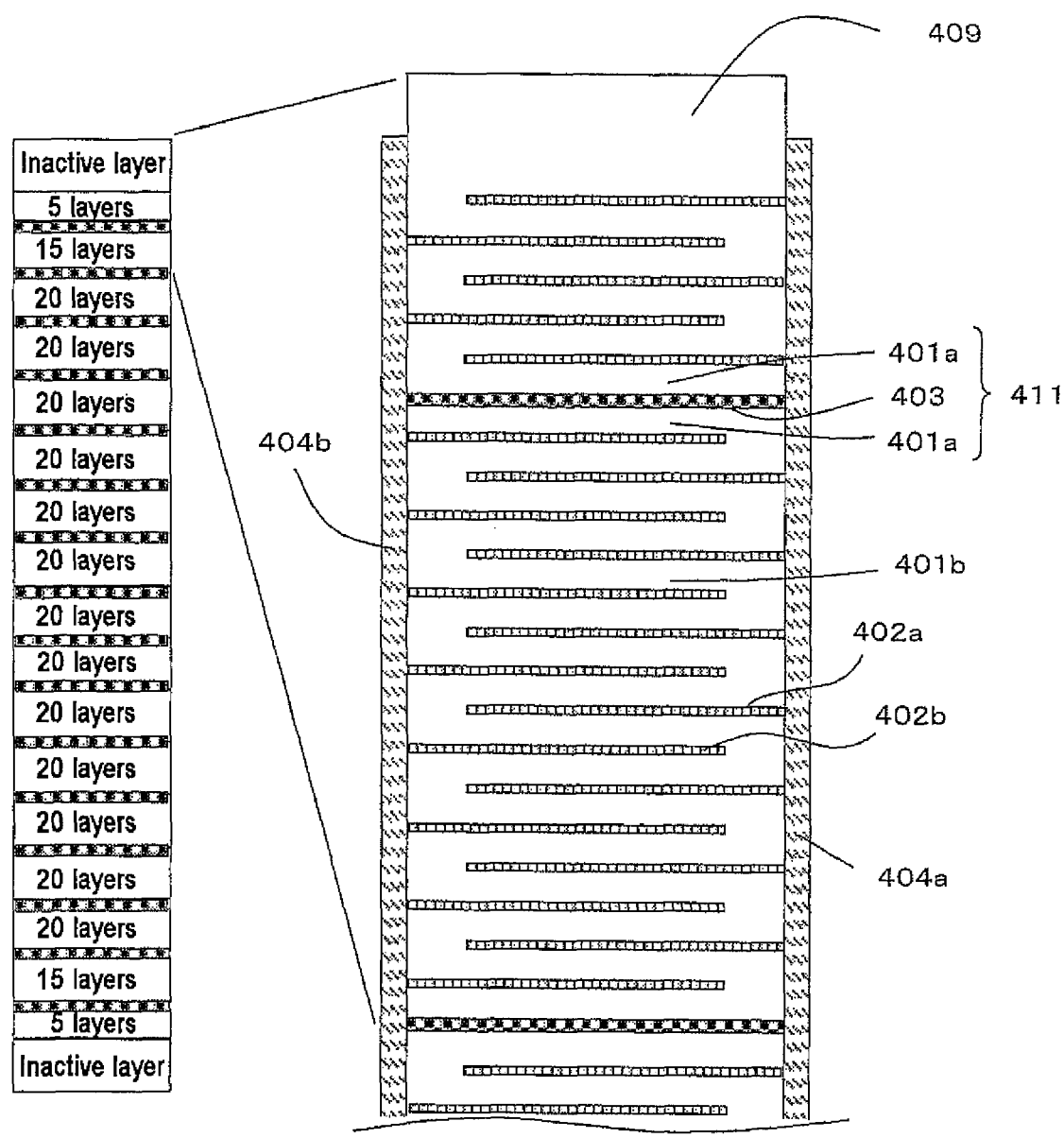
FIG. 47 is a schematic sectional view showing sample No. 5 of Example 7.
Figure 48:
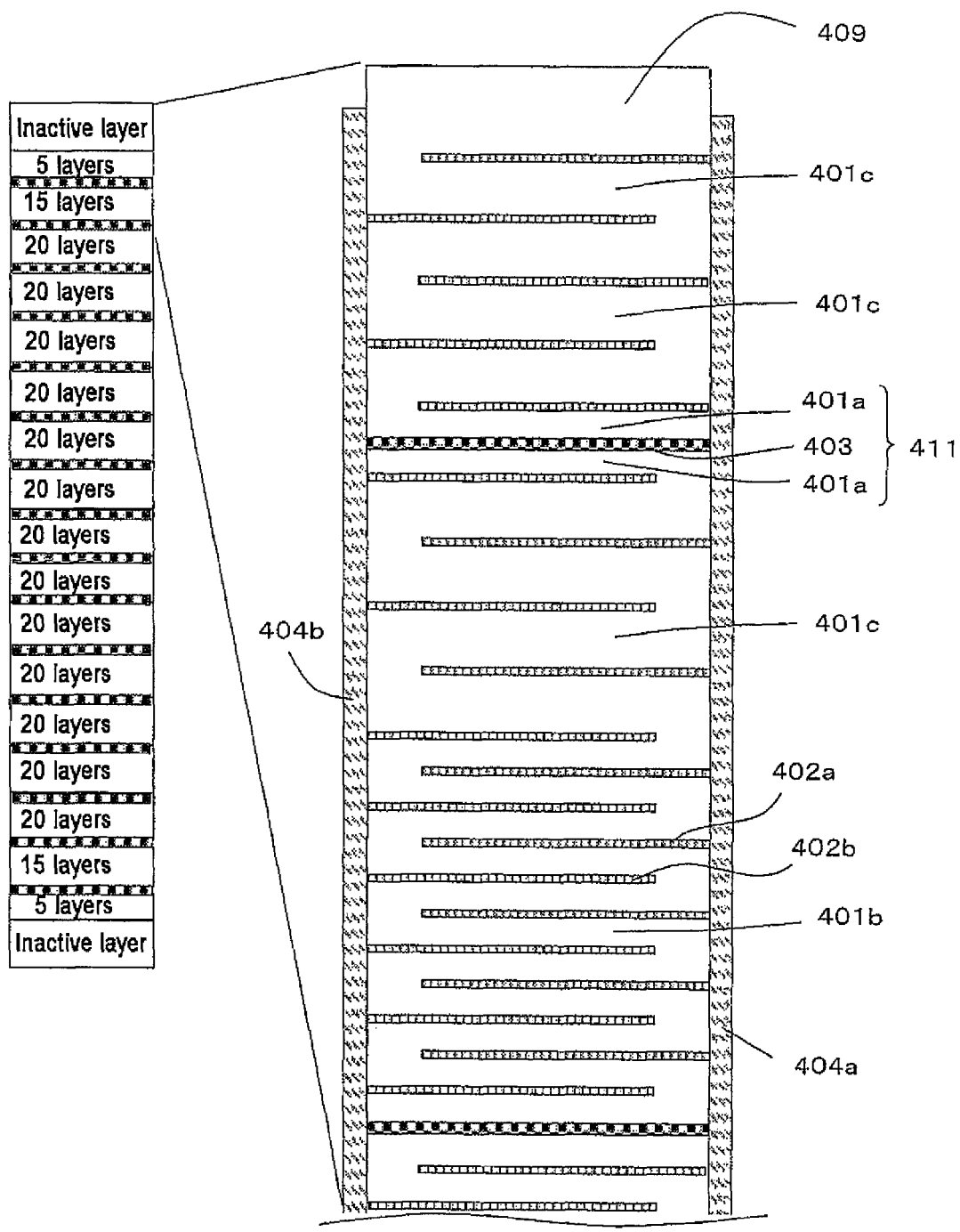
FIG. 48 is a schematic sectional view showing sample No. 6 of Example 7.

Except that the material of a lump 403a constituting the lump containing layer 403 was varied in samples Nos. 3 and 4, multi-layer piezoelectric actuators were manufactured similar to Example 1 (a schematic sectional view of samples Nos. 3 and 4 is shown in FIG. 46). Except that a composite layer was arranged next to the 5$^{th}$ internal electrode 402 from both ends, a multi-layer piezoelectric actuator, in which a lump containing layer 411 was formed in the proportion of 1 layer to 20 layers of internal electrodes 402 with an electrically conductive paste printed for forming an internal electrode 402 (a schematic sectional view of sample No. 5 is shown in FIG. 47) similar to Example 1. Furthermore, except that stress relieving regions in which a 300 μm thick 8-layer piezoelectric material 1c was formed from both ends is disposed and composite layer was formed next to the 5$^{th}$ internal electrode 402 from both ends in the stress relieving regions in sample No. 6, a multi-layer piezoelectric actuator was manufactured similar to Example 1. Each thickness of piezoelectric material layers 401a and 1a, that constitute the composite layer 411, was adjusted to 150 μm (a schematic sectional view of sample No. 6 is shown in FIG. 48).

The multi-layer piezoelectric actuator was continuously operated up to 1×10$^9$ times by applying AC voltage of 0 to +160 V at room temperature at a frequency of 150 Hz. The results are shown in Table 7.

TABLE 7

| Sample No. | Material of inorganic composition constituting inorganic layer | Arrangement of complex layer | Initial Amount of displacement | Amount of displacement after operation 1 × 10$^9$ times at 0 to +160 V |
|---|---|---|---|---|
| 1 | Ag | 1 layer every 20 layers | 40 μm | 40 μm |
| 3 | PZT | 1 layer every 20 layers | 40 μm | 40 μm |
| 4 | Ag + PZT | 1 layer every 20 layers | 40 μm | 40 μm |
| 5 | Ag | arranged at both ends | 40 μm | 40 μm |
| 6 | Ag | Complex layer was arranged in stress relieving region formed at both ends | 40 μm | 40 μm |

As is apparent from the results shown in Table 7, samples Nos. 1, 3, 4, 5 and 6 as multi-layer piezoelectric actuators of the present invention are piezoelectric actuators that undergo the same amount of displacement as that before the continuous operation, and also have high reliability, even when continuously operated 1×10$^9$ times.

Example 8

With respect to multi-layer piezoelectric actuators of samples Nos. 1 to 6, the drive voltage was further increased and the multi-layer piezoelectric actuator was continuously operated up to 1×10$^9$ times by applying AC voltage of 0 to +200 V at room temperature at a frequency of 150 Hz. The results are shown in Table 8.

TABLE 8

| Sample No. | Material of inorganic composition constituting inorganic layer | Arrangement of complex layer | Initial Amount of displacement | Amount of displacement after operation 1 × 10$^9$ times at 0 to +200 V |
|---|---|---|---|---|
| 1 | Ag | 1 layer every 20 layers | 40 μm | 35 μm |
| 2 | — | none | 40 μm | Cracks occurred at 3 × 10$^5$ times |
| 3 | PZT | 1 layer every 20 layers | 40 μm | 35 μm |
| 4 | Ag + PZT | 1 layer every 20 layers | 40 μm | 35 μm |
| 5 | Ag | arranged at both end sides | 40 μm | 38 μm |
| 6 | Ag | Complex layer was arranged in stress relieving region formed at both ends | 40 μm | 40 μm |

As is apparent from the results shown in Table 8, in a multi-layer piezoelectric actuator comprising neither a lump containing layer 3 nor a composite layer 411 of sample No. 2, that is not within the scope of the present invention, cracks occurred in a piezoelectric material at 3×10$^5$ cycles. It was found that samples Nos. 1, 3 to 6 as multi-layer piezoelectric actuators of the present invention are piezoelectric actuators that exert the effect of improving an amount of displacement after the operation and also have high reliability.

Example 9

A multi-layer piezoelectric device as shown in FIG. 36 was manufactured as follows. First, a calcined powder of piezoelectric ceramics consisting mainly of lead titanate zirconate (PbZrO$_3$—PbTiO$_3$) having a mean particle size of 0.4 μm, a binder, and a plasticizer were mixed to prepare a slurry. The slurry was formed into a ceramic green sheet that is converted into a piezoelectric material 11 having a thickness of 150 μm by a doctor blade method.

On one surface of the ceramic green sheet, an electrically conductive paste prepared by adding a binder to a silver-palladium alloy (95 mass % silver—5 mass % palladium) was printed in a thickness of 10 μm by a screen printing method using plate-making with a resist thickness of 20 μm, and then 300 sheets thus obtained were stacked and fired. After maintaining at 800° C., firing was conducted at 1,000° C.

At this time, the portion where a lump containing layer consisting of a plurality of lumps was formed as follows. With respect to samples Nos. 1 to 4, a binder was added to a calcined powder of piezoelectric ceramics, as the same material as that of a piezoelectric material layer to prepare a piezoelectric material paste, which was then printed in a thickness of 5 μm using plate-making with a resist thickness of 10 μm. With respect to sample No. 5, a binder was added to a mixed powder of a calcined powder of piezoelectric ceramics, as the same material as that of the piezoelectric material layer, and the same mass of a silver powder to prepare a mixed paste, and then printed in a thickness of 5 μm using plate-making with a resist thickness of 10 μm. With respect to samples Nos. 1 and 2, the lump containing layer was arranged at the 50$^{th}$ layer, 100$^{th}$ layer, 200$^{th}$ layer and 250$^{th}$ layer in the stack. With respect to samples Nos. 3, 4 and 5, the lump containing layer was arranged at the 50th layer, 100th layer, 150th layer, 200th layer and 250th layer in the stack. In sample No. 6, the lump containing layer was not arranged. In samples Nos. 1 and 4, an epoxy resin component was allowed to exist between adjacent lumps in a small sectional layer by the following procedure. After firing at 1,000° C., a paste of an epoxy resin was injected into voids of the lump containing layer. Using a brush impregnated with a resin paste, the resin paste was permeated into voids from the side face of the stack through a surface tension, and then resin was cured by heating. The lump containing layer was formed by arranging 6 lumps as shown in FIG. 37.

To a mixture of a flake-shaped silver powder having a mean particle size of 2 μm and an amorphous glass powder consisting mainly of silicon having a mean particle size 2 μm and having a softening point of 640° C., as a balance, a binder was added in the amount of 8 parts by mass based on 100 parts by mass of the total mass of the silver powder and the glass powder, followed by sufficient mixing to prepare a silver glass electrically conductive paste. The silver glass electrically conductive paste thus prepared was printed on a release film by screen printing and, after drying, a sheet was removed from the release film to obtain the sheet of silver glass electrically conductive paste.

The sheet of the silver glass paste was transferred to the side face of the stack 513, followed by stacking and further baking at 700° C. for 30 minutes to form external electrodes 515.

Lead wires were connected to external electrodes 515, and DC electric field of 3 kV/mm was applied to positive and negative external electrodes 515 via the lead wires for 15 minutes so as to apply polarization treatment, thereby to complete a piezoelectric actuator that employs a multi-layer piezoelectric device in the form shown in FIG. 36.

DC voltage of 170 V was applied to the resultant multi-layer piezoelectric device and, as a result, all piezoelectric actuators undergo displacement in the stacking direction. The piezoelectric actuator was continuously operated up to $1\times10^9$ times by applying AC voltage of 0 to +170 V at room temperature at a frequency of 150 Hz. The results are shown in Table 9.

TABLE 9

| No. | | Initial amount of displacement (μm) | Amount of displacement after continuous operation ($1 \times 10^9$ times) | Peeling at stacked portion after continuous operation ($1 \times 10^9$ times) | Noise of harmonic components | Beat sound at 1 kHz or more |
|---|---|---|---|---|---|---|
| 1 | 50th layer<br>100th layer<br>200th layer<br>250th layer | 50.0 | 49.9 | not occurred | not generated | not generated |
| 2 | 50th layer<br>100th layer<br>200th layer<br>250th layer | 55.0 | 54.9 | not occurred | not generated | not generated |
| 3 | 50th layer<br>100th layer<br>150th layer<br>200th layer<br>250th layer | 60.0 | 59.9 | not occurred | not generated | not generated |
| 4 | 50th layer<br>100th layer<br>150th layer<br>200th layer<br>250th layer | 60.0 | 60.0 | not occurred | not generated | not generated |
| 5 | 50th layer<br>100th layer<br>150th layer<br>200th layer<br>250th layer | 60.0 | 60.0 | not occurred | not generated | not generated |
| 6 | none | 45.0 | 42.0 | occurred | occurred | occurred |

As is apparent from the results shown in Table 9, in sample No. 6 as Comparative Example, stress generated in the interface between the stacks is concentrated into a point and a load increases to cause peeling, and also beat sound and noise were generated. To the contrary, in samples Nos. 1 to 5 as Examples of the present invention, an amount of displacement of the device did not drastically decrease even after the continuous operation $1\times10^9$ times and samples had an effective amount of displacement required as a piezoelectric actuator. Thus, a piezoelectric actuator having excellent durability could be made.

It is found that, in sample No. 2 in which a stress relieving layer (lump containing layer) and a stress concentrating layer (dense layer) are adjacently arranged via the other piezoelectric material, not only the amount of displacement of the device can be increased, but also a stacked actuator having a stable amount of displacement of the device can be made. Furthermore, in samples Nos. 3, 4 and 5 in which a stress relieving layer is regularly arranged every 50 layers via a piezoelectric material, not only the amount of displacement of the device can be increased to the largest amount, but also the amount of displacement of the device hardly varies and very excellent durability is ensured. Thus, a stacked actuator having a stable amount of displacement of the device can be obtained. In sample Nos. 5, since a binder was added to a mixed powder of a calcined powder of piezoelectric ceramics, as the same material as that of the piezoelectric material layer, and the same mass of a silver powder to prepare a mixed paste, which was then printed and fired at a temperature higher than a melting point of 960° C. of silver, entire silver in a mixed paste diffused to an adjacent metal layer via a piezoelectric material. Therefore, a stress relieving layer (lump containing layer) having a largest void ratio among samples could be formed and a stacked actuator having a very stable amount of displacement of the device could be made.

Example 10

A multi-layer piezoelectric device as shown in FIG. 41 was manufactured as follows. First, a calcined powder of a piezoelectric ceramic consisting mainly of lead titanate zirconate ($PbZrO_3$—$PbTiO_3$) having a mean particle size of 0.4 μm, a binder and a plasticizer were mixed to prepare a slurry. The slurry was formed into a ceramic green sheet that is converted into a piezoelectric material 11 having a thickness of 150 μm by a doctor blade method.

On one surface of the ceramic green sheet, an electrically conductive paste prepared by adding a binder to a silver-palladium alloy (95 mass % silver—5 mass % palladium) was printed by a screen printing method, and then 300 sheets thus obtained were stacked and fired to obtain a stack 615. After maintaining at 800° C., firing was conducted at 1,000° C.

At this time, on the green sheet where a metal layer 612a is formed, an electrically conductive paste was printed in a thickness of 10 μm using plate-making with a resist thickness of 20 μm. On the green sheet where a lump containing layer 612b is formed, a paste for a ceramic lump, comprising a calcined powder of a piezoelectric ceramic consisting mainly of lead titanate zirconate ($PbZrO_3$—$PbTiO_3$), a binder and a plasticizer was printed in a thickness of 5 μm using plate-making with a resist thickness of 10 μm. After drying at 80° C. for 20 minutes, on the portion where a metal lump is formed, the electrically conductive past used for formation of the metal layer 612a was printed in a thickness of 5 μm using plate-making with a resist thickness of 5 μm. The lump containing layer 612b was arranged at the $50^{th}$ layer, $100^{th}$ layer, $150^{th}$ layer, $200^{th}$ layer and $250^{th}$ layer. As shown in FIG. 41(*b*), the lump containing layer 612b is a layer in which 10 ceramic lump materials 12d and 10 metal lumps 12c are arranged.

To a mixture of a flake-shaped silver powder having a mean particle size of 2 μm and an amorphous glass powder consisting mainly of silicon having a mean particle size 2 μm and having a softening point of 640° C., as a balance, a binder was added in the amount of 8 parts by mass based on 100 parts by mass of the total mass of the silver powder and the glass powder, followed by sufficient mixing to prepare a silver glass electrically conductive paste. The silver glass electrically conductive paste thus prepared was printed on a release film by screen printing and, after drying, a sheet was removed from the release film to obtain the sheet of silver glass electrically conductive paste. The sheet of the silver glass paste was transferred to the side face of the stack 615, followed by stacking and further baking at 700° C. for 30 minutes to form external electrodes 615.

Lead wires were connected to external electrodes 615, and DC electric field of 3 kV/mm was applied to positive and negative external electrodes 615 via the lead wires for 15 minutes so as to apply polarization treatment, thereby to complete a piezoelectric actuator that employs a multi-layer piezoelectric device in the form shown in FIG. 41.

DC voltage of 170 V was applied to the resultant multi-layer piezoelectric device and, as a result, all piezoelectric actuators undergo displacement in the stacking direction. The piezoelectric actuator was continuously operated up to 1×109 times by applying AC voltage of 0 to +170 V at room temperature at a frequency of 150 Hz. The results are shown in Table 10.

In sample No. 1, the entire metal layers were formed only of a metal component (including no lump containing layer). In sample No. 2-9, the lump containing layer was arranged at the $50^{th}$ layer, $100^{th}$ layer, $150^{th}$ layer, $200^{th}$ layer and $250^{th}$ layer. The lump containing layer of sample No. 2-9 was formed of an Ag—Pd alloy. In the lump containing layer of sample No. 2-9, voids reaching the adjacent piezoelectric material layer existed.

The "arranged state of ceramic lumps" in Table 10 means a layer that is arranged so that both ends in the thickness direction of ceramic lumps are contacted with adjacent piezoelectric material layers of both ends. The "arranged state of metal lumps" in Table 1 means a layer that is arranged so that both ends in the thickness direction of metal lumps are contacted with adjacent piezoelectric material layers of both ends

TABLE 10

| No. | Layer having region where piezoelectric region and metal region are contacted with each other | Arranged state of piezoelectric region | Arranged state of piezoelectric region | Initial amount of displacement (μm) | Amount of displacement after continuous operation (1 × 10⁹ times) | Peeling at stacked portion after continuous operation (1 × 10⁹ times) |
|---|---|---|---|---|---|---|
| 1 | None | None | none | 40.0 | 37.0 | Peeling occurred at first metal layer |
| 2 | $50^{th}$ layer<br>$100^{th}$ layer<br>$150^{th}$ layer<br>$200^{th}$ layer<br>$250^{th}$ layer | $50^{th}$ layer<br>$100^{th}$ layer<br>$150^{th}$ layer<br>$200^{th}$ layer<br>$250^{th}$ layer | $50^{th}$ layer<br>$100^{th}$ layer<br>$150^{th}$ layer<br>$200^{th}$ layer<br>$250^{th}$ layer | 55 | 54.9 | not occurred |
| 3 | | $50^{th}$ layer<br>$100^{th}$ layer<br>$150^{th}$ layer<br>$200^{th}$ layer<br>$250^{th}$ layer | $50^{th}$ layer<br>$100^{th}$ layer<br>$150^{th}$ layer<br>$200^{th}$ layer<br>$250^{th}$ layer | 55 | 54.9 | not occurred |
| 4 | | | $50^{th}$ layer<br>$100^{th}$ layer<br>$150^{th}$ layer<br>$200^{th}$ layer<br>$250^{th}$ layer | 60 | 59.9 | not occurred |
| 5 | $50^{th}$ layer<br>$100^{th}$ layer<br>$150^{th}$ layer<br>$200^{th}$ layer<br>$250^{th}$ layer | | $50^{th}$ layer<br>$100^{th}$ layer<br>$150^{th}$ layer<br>$200^{th}$ layer<br>$250^{th}$ layer | 60 | 59.9 | not occurred |

TABLE 10-continued

| 6 | | 50th layer<br>100th layer<br>150th layer<br>200th layer<br>250th layer | 50 | 50 | not occurred |
|---|---|---|---|---|---|
| 7 | 50th layer<br>100th layer<br>150th layer<br>200th layer<br>250th layer | 50th layer<br>100th layer<br>150th layer<br>200th layer<br>250th layer | 50 | 50 | not occurred |
| 8 | 50th layer<br>100th layer<br>150th layer<br>200th layer<br>250th layer | | 60 | 60 | not occurred |
| 9 | | | 65 | 64 | not occurred |

| No. | Noise of harmonic components | Beat sound at 1 kHz or more | Volume V1 occupied by piezoelectric material region (%) | Volume V2 occupied by metal region (%) | Volume V3 occupied by voids (%) |
|---|---|---|---|---|---|
| 1 | generated | generated | 0 | 100 | 0 |
| 2 | not generated | not generated | 30 | 25 | 45 |
| 3 | not generated | not generated | 20 | 15 | 65 |
| 4 | not generated | not generated | 20 | 5 | 75 |
| 5 | not generated | not generated | 30 | 10 | 60 |
| 6 | not generated | not generated | 10 | 20 | 70 |
| 7 | not generated | not generated | 15 | 25 | 60 |
| 8 | not generated | not generated | 20 | 15 | 65 |
| 9 | not generated | not generated | 15 | 10 | 75 |

As is apparent from the results shown in Table 10, in sample No. 1 as Comparative Example, stress generated in the interface between the stacks is concentrated into a point and a load increases to cause peeling, and also beat sound and noise were generated. To the contrary, in samples Nos. 2 to 9 as Examples of the present invention, an amount of displacement of the device did not drastically decrease even after the continuous operation 1×109 times and samples had an effective amount of displacement required as a piezoelectric actuator.

In samples Nos. 2 to 5, 8 and 9 in which volume V1 occupied by the ceramic lumps, volume V2 occupied by the metallic lumps, and volume V3 occupied by voids satisfy a relationship of V3>V1>V2, the amount of displacement of the device can be increased. In samples Nos. 2 to 7 in which both ends in the thickness direction of ceramic lumps or metal lumps are adjacent to adjacent piezoelectric material layers of both ends, the amount of displacement of the device hardly varied and a stacked actuator having a stable amount of displacement of the device could be made.

Example 11

A piezoelectric actuator comprising the multi-layer piezoelectric device as shown in FIG. 41 was manufactured as follows. First, a calcined powder of a piezoelectric ceramic consisting mainly of lead titanate zirconate ($PbZrO_3$—$PbTiO_3$) having a mean particle size of 0.4 μm, a binder and a plasticizer were mixed to prepare a slurry. The slurry was formed into a ceramic green sheet that is converted into a piezoelectric material 11 having a thickness of 150 μm by a doctor blade method.

On one surface of the ceramic green sheet, an electrically conductive paste prepared by adding a binder to a silver-palladium alloy (95 mass % silver—5 mass % palladium) was printed by a screen printing method, and then 300 sheets thus obtained were stacked and fired to obtain a stack 615. After maintaining at 800° C., firing was conducted at 1,000° C.

At this time, on the green sheet where a metal layer 612a is formed, an electrically conductive paste was printed in a thickness of 10 μm using plate-making with a resist thickness of 20 μm. On the green sheet where a lump containing layer 612b is formed, a paste for a ceramic lump, comprising a calcined powder of a piezoelectric ceramic consisting mainly of lead titanate zirconate ($PbZrO_3$—$PbTiO_3$), a binder and a plasticizer was printed in a thickness of 5 μm using plate-making with a resist thickness of 10 μm. After drying at 80° C. for 20 minutes, on the portion where a metal lump is formed, the electrically conductive past used for formation of the metal layer 612a was printed in a thickness of 5 μm using plate-making with a resist thickness of 5 μm. Furthermore, on the portion where a metal layer 612e is formed, the electrically conductive past prepared by adding a binder to a silver-palladium alloy was printed in a thickness of 15 μm using plate-making with a resist thickness of 30 μm.

The lump containing layer 612b was arranged at the 50th layer, 100th layer, 150th layer, 200th layer and 250th layer. The metal layer located on both side in the stacking direction of the lump containing layer 612b was arranged so as to be a dense metal layer 612e. As shown in FIG. 41(b), the lump containing layer 612b is a layer in which 10 ceramic lump materials and 10 metal lumps are arranged.

To a mixture of a flake-shaped silver powder having a mean particle size of 2 μm and an amorphous glass powder consisting mainly of silicon having a mean particle size 2 μm and having a softening point of 640° C., as a balance, a binder was added in the amount of 8 parts by mass based on 100 parts by mass of the total mass of the silver powder and the glass powder, followed by sufficient mixing to prepare a silver glass electrically conductive paste. The paste was printed on the side face of the stack 615 by screen printing and then dried. Then, an electrically conductive paste prepared by adding a binder to a flake-shaped silver powder having a mean particle size of 2 μm was printed thereon, dried and then baked at 700° C. for 30 minutes. Thus, external electrodes 615 comprising external electrode layers 615a and 615b were formed.

Lead wires were connected to external electrodes 615, and DC electric field of 3 kV/mm was applied to positive and negative external electrodes 615 via the lead wires for 15 minutes so as to apply polarization treatment, thereby to complete a piezoelectric actuator that employs a multi-layer piezoelectric device in the form shown in FIG. 41.

At this time, the metal layer 612e that adjoin the lump containing layer 612b on both sides in the stacking direction had a thickness which is 1.3 times as the metal layer 612a, and a void ratio which is 4/5 times. A portion of the external electrode 615 is inserted between two piezoelectric materials 11 that adjoin the lump containing layer 612b on both sides in the stacking direction by a mean depth of 20 μm. With respect to the external electrode 615, the content of a glass material of an external electrode layer 615a located on the side face of the stack 615 was more than that of the external electrode layer 615b located outside.

Lead wires were connected to external electrodes 615, and DC electric field of 3 kV/mm was applied to positive and negative external electrodes 615 via the lead wires for 15 minutes so as to apply polarization treatment, thereby to complete a piezoelectric actuator (sample No. 10)

That is, in the device of sample No. 10, the external electrode 615 has a two-layer structure in which the layer on the side face of the stack 615 has larger content of the glass component, and the metal layer 612e located on both sides in the stacking direction of the lump containing layer 612b has a larger thickness and a smaller void ratio as compared with the metal layer 612a, and also a portion of external electrodes is inserted into a portion of regions between a piezoelectric material 11 located on both sides in the stacking direction of the lump containing layer 612b.

DC voltage of 170 V was applied to the resultant multi-layer piezoelectric device and, as a result, all piezoelectric actuators undergo displacement in the stacking direction. The piezoelectric actuator was continuously operated up to 1×109 times by applying AC voltage of 0 to +200 V at room temperature at a frequency of 150 Hz. The results are shown in Table 11. The above description is the same as that of sample No. 2 of Example 10.

TABLE 11

| No. | External electrode | Void state of metal layer that adjoin complex layer | Thickness of metal layer that adjoin complex layer | Insertion of external electrode into piezoelectric material | Initial amount of displacement at 200 V (μm) | Amount of displacement after continuous operation at 200 V (1 × 10$^9$ times) | Peeling at stacked portion after continuous operation at 200 V (1 × 10$^9$ times) |
|---|---|---|---|---|---|---|---|
| 1 | Single-layer structure | — | — | not occurred | 47.1 | 23.5 | Peeling occurred at first metal layer |
| 10 | Two-layer structure containing large amount of glass component at stack side | 4/5 times more than void ratio of other metal layer | 1.3 times more than thickness of other metal layer | Inserted between piezoelectric materials located at both sides of complex layer in depth of 20 μm | 64.7 | 64.6 | not occurred |

| No. | Peeling of external electrode after continuous operation at 200 V (1 × 10$^9$ times) | Noise of harmonic components | Beat sound at 1 kHz or more |
|---|---|---|---|
| 1 | Peeling occurred | generated | generated |
| 10 | not occurred | not generated | not generated |

As is apparent from the results shown in Table 11, an actuator of sample No. 10 did not cause such a problem that a portion of external electrodes 615 is peeled from the side face of the stack 615, resulting in deterioration of displacement characteristics, even when it is continuously operated at a high speed under a high electric field and a high pressure.

The invention claimed is:

1. A ceramic member having a three-layer structure comprising a metal layer containing the metal component $M_1$, a lump containing layer that include more voids than the metal layer and a plurality of ceramic lumps dispersed while being separated from each other by the voids, and a ceramics layer sandwiched by the metal layer and the lump containing layer.

2. The ceramic member according to claim 1, wherein the lump containing layer further comprises a plurality of metal lumps dispersed while being separated from each other by the voids, said metal lumps having a metal element M1.

3. The ceramic member according to claim 2, wherein, when a mass percentage Y is a proportion of the metal component $M_1$ to the total metal content in the metal layer and a mass percentage Yc is a proportion of the metal component $M_1$ to the total metal content in the lump containing layer, Yc>Y is satisfied.

4. The ceramic member according to claim 2, wherein the lump containing layer has a void ratio higher than the metal layer.

5. The ceramic member according to claim 2, wherein the lump containing layer has a region including the ceramic lumps and the metallic lumps that are contact with each other.

6. The ceramic member according to claim 2, wherein the ceramic lumps and the metallic lumps that compose the lump containing layer have widths, which are defined in a direction perpendicular to the stacking direction, decreasing or increasing with closing to piezoelectric layers that adjoin to the lump containing layer.

7. The ceramic member according to claim 2, wherein a volume V1 occupied by the ceramic lumps and a volume V2 occupied by the metallic lumps are set so as to satisfy V1>V2 in the lump containing layer.

8. The ceramic member according to claim 2, wherein a volume V2 occupied by the metallic lumps and a volume V3 occupied by the voids are set so as to satisfy V3>V2 in the lump containing layer.

9. The ceramic member according to claim 2, wherein a volume V1 occupied by the ceramic lumps, a volume V2 occupied by the metallic lumps and a volume V3 occupied by the voids are set so as to satisfy V3>V1>V2 in the lump containing layer.

10. The ceramic member according to claim 1, comprising at least two said three-layer structures.

11. The ceramic member according to claim 1, comprising a five-layer structure composed of two said three-layer structures which share the metal layer.

12. The ceramic member according to claim 1, comprising a five-layer structure composed of two said three-layer structures which share the lump containing layer.

13. The ceramic member according to claim 1, wherein the mass percentage has a peak of the mass percentage Yc of the lump containing layer and the mass percentage gradually decreases away from the lump containing layer over both at least two metal layers.

14. The ceramic member according to claim 1, wherein the lump containing layer has a thickness smaller than those of the metal layers that adjoin on both sides of the lump containing layer in the stacking direction.

15. The ceramic member according to claim 1, wherein the lump containing layer has an electric resistance higher than those of the metal layers that adjoin on both sides of the lump containing layer in the stacking direction.

16. The ceramic member according to claim 1, wherein the lump containing layers are disposed in accordance with a predetermined rule in the stacking direction of the stacked compact.

17. The ceramic member according to claim 16, wherein the lump containing layers are disposed so as to sandwich a plurality of metal layers other than the lump containing layers.

18. The ceramic member according to claim 16, wherein the lump containing layers and the metal layers are alternately disposed.

19. The ceramic member according to claim 1, wherein the lump containing layers are disposed on both ends of said plurality of metal layers respectively.

20. The ceramic member according to claim 1, further comprising a pair of external electrodes electrically connected to said plurality of metal layers, wherein the lump containing layers is used positive side.

21. The ceramic member according to claim 1, wherein the metal element M1 is silver and the lump containing layer contains platinum.

22. The ceramic member according to claim 1, wherein a part of said plurality of ceramic lumps make contact with the piezoelectric layers that are located on both sides with which both ends of the ceramic lump in the stacking direction, and the rest of the ceramic lumps make contact with the piezoelectric layer only on one end of the ceramic lump in the stacking direction.

23. The ceramic member according to claim 1, wherein a part of said plurality of metal lumps make contact with the piezoelectric layers that are located on both sides with which both ends of the metal lump in the stacking direction, and the rest of the metal lumps make contact with the piezoelectric layer only on one end of the metal lump in the stacking direction.

24. The ceramic member according to claim 1, wherein the lump containing layers disposed at one end or both ends of the stack.

25. The ceramic member according to claim 1, wherein the lump containing layers have stress relieving regions which are thicker than the piezoelectric layers disposed at the center and the lump containing layers are disposed in the stress relieving regions.

26. The ceramic member according to claim 1, comprising a pair of external electrodes connected with said plurality of the metal layers, wherein the two metal layers that adjoin the lump containing layer on both sides thereof in the stacking direction are connected to the external electrodes of different polarities.

27. A multi-layer piezoelectric device the comprising the ceramic member according to claim 1.

28. An injection apparatus comprising:
a container having an injection hole; and
the multi-layer piezoelectric device according to claim 27, wherein
a liquid that fills in the container is discharged through the injection hole by the operation of the multi-layer piezoelectric component.

29. A fuel injection system comprising:
a common rail that stores a high-pressure fuel;
the injection apparatuses according to claim 28 to eject the fuel stored in the common rail;
a pressure pump that supplies the high-pressure fuel to the common rail; and
an injection control unit that sends a drive signal to the injection apparatus.

30. A gas sensor comprising the ceramic member according to claim 1.

31. A fuel cell device comprising the ceramic member according to claim 1.

32. A filter device comprising the ceramic member according to claim 1.

33. A method for manufacturing the ceramic member of claim 1 comprising:
a step of forming a stacked compact from a plurality of metallic paste layers containing a metal component $M_1$ that are stacked one on another via ceramic green sheets; and
a step of firing the stacked compact, wherein
a mass percentage X is a proportion of the metal component $M_1$ to the total metal content in the metallic paste layer, at least one of said plurality of metallic paste layers is formed as a second metallic paste layer that has the mass percentage X higher than that of a first metallic paste layer which is the metallic paste layer that adjoins the second metallic paste layer in the stacking direction and the second metallic paste layer contains a ceramic powder in the step of forming the stacked compact.

34. The method for manufacturing a ceramic member according to claim 33, wherein the mass percentage X of the second metallic paste layer is set higher than those of the first metallic paste layers that adjoin on both side of the second metallic paste layer in the stacking direction.

35. The method for manufacturing a ceramic member according to claim 33, wherein a mass percentage XH which is the mass percentage X of the second metallic paste layer and a mass percentage XL which is the mass percentage X of the first metallic paste layer adjacent to the second metallic paste layer in the stacking direction are set so as to satisfy XL+0.1≦XH≦XL+30.

36. The method for manufacturing a ceramic member according to claim 33, wherein the mass percentages X of said plurality of metallic paste layers are set so as to satisfy 85≦X≦100.

37. The method for manufacturing a ceramic member according to claim 33, wherein a plurality of said second metallic paste layers are disposed in the step of forming a stacked compact.

38. The method for manufacturing a ceramic member according to claim 37, wherein said plurality of second metallic paste layers are disposed so that a plurality of metal layers other than the second metallic paste layers are interposed between the second metallic paste layers.

39. The method for manufacturing a ceramic member according to claim 37, wherein said plurality of second metallic paste layers are disposed in accordance with a predetermined rule in the stacking direction of the stacked compact.

40. The method for manufacturing a ceramic member according to claim 37, wherein the second metallic paste layers and metal layers other than the second metallic paste layers are alternately disposed.

41. A method for manufacturing the ceramic member of claim 1 comprising:
a step of forming a stacked compact from a plurality of metallic paste layers containing a metal component $M_1$ that are stacked one on another via ceramic green sheets; and
a step of firing the stacked compact, wherein
when a mass percentage X is a proportion of the metal component $M_1$ to the total metal content in the metallic paste layer, at least one of said plurality of metallic paste layers is formed as a first metallic paste layer that has the mass percentage X lower than that of a second metallic paste layers which are the metallic paste layers that adjoin on both sides of the first metallic paste layer in the stacking direction and the second metallic paste layers that adjoin the first metallic paste layer contain a ceramic powder in the step of forming the stacked compact.

42. The method for manufacturing a ceramic member according to claim 41, wherein a mass percentage XL which is the mass percentage X of the first metallic paste layer and a mass percentage XH which is the mass percentage X of the second metallic paste layer adjacent to the second metallic paste layer in the stacking direction are set so as to satisfy XH−0.1≦XL≦XH−30.

43. The method for manufacturing a ceramic member according to claim 41, wherein the mass percentages X of said plurality of metallic paste layers are set so as to satisfy 85≦X≦100.

44. The method for manufacturing a ceramic member according to claim 41, wherein a plurality of said first metallic paste layers are disposed in the step of forming a stacked compact.

45. The method for manufacturing a ceramic member according to claim 44, wherein said plurality of first metallic paste layers are disposed so that a plurality of metallic past layers other than the first metallic paste layers are interposed between the first metallic paste layers.

46. The method for manufacturing a ceramic member according to claim 44, wherein said plurality of first metallic paste layers are disposed in accordance with a predetermined rule in the stacking direction of the stacked compact.

47. The method for manufacturing a ceramic member according to claim 44, wherein the first metallic paste layers and metallic past layers other than the first metallic paste layers are alternately disposed.

48. A method for manufacturing the ceramic member of claim 1 comprising:
a step of forming a stacked compact from a plurality of metallic paste layers containing a metal component $M_1$ that are stacked one on another via ceramic green sheets; and
a step of firing the stacked compact, wherein
when a mass percentage X is a proportion of the metal component $M_1$ to the total metal content in the metallic paste layer, a mass percentage X of a portion of at least one layer of said plurality of metallic paste layers is set higher than a mass percentage X of the metallic paste layer that adjoins said at least one layer in the stacking direction and said portion contains a ceramic powder.

49. The method for manufacturing a ceramic member according to claim 48, wherein the mass percentage X of the portion is set higher than mass percentage Xs of the metallic paste layers that adjoin on both sides of said at least one layer in the stacking direction.

50. The method for manufacturing a ceramic member according to claim 48, wherein the mass percentage X of a region other than said portion is set same as a mass percentage X of the metallic paste layer that adjoin said at least one layer in the stacking direction.

51. The method for manufacturing a ceramic member according to claim 48, wherein a group 11 element is used as the metal component $M_1$ and a group 10 element is contained as an other metal component.

52. The method for manufacturing a ceramic member according to claim 51, wherein the metal component $M_1$ is silver and the other metal component is palladium.

53. The method for manufacturing a ceramic member according to claim 52, wherein platinum is contained in the metallic paste layer.

54. A method for manufacturing the ceramic member of claim 1 comprising:
a step of forming a stacked compact from a plurality of metallic paste layers containing at least one of an alloy powder comprising a metal component $M_1$ and a metal powder consist of the metal component $M_1$ that are stacked one on another via ceramic green sheets; and
a step of firing the stacked compact,
wherein when a mass percentage X is a proportion of the metal component $M_1$ to the total metal content in the metallic paste layer, at least one layer of said plurality of metallic paste layers is used as a second metallic paste layer having a mass percentage X higher than a mass percentage X of the metallic paste layer that adjoins said at least one layer in the stacking direction in the step of forming a stacked compact, and
wherein the stacked compact is fired at a temperature higher than the melting point of at least one of the alloy powder and the metal powder in the step of firing.

55. A method for manufacturing the ceramic member of claim 1 comprising:
a step of forming a stacked compact from a plurality of metallic paste layers containing at least one of an alloy powder comprising a metal component $M_1$ and a metal powder consist of the metal component $M_1$ that are stacked one on another via ceramic green sheets; and
a step of firing the stacked compact,
wherein, when a mass percentage X is a proportion of the metal component $M_1$ to the total metal content in the metallic paste layer, at least one layer of said plurality of metallic paste layers is used as a low-content metallic paste layer having a mass percentage X lower than mass percentage Xs of the metallic paste layers that adjoin both sides of said at least one layer in the stacking direction in the step of forming a stacked compact, and wherein the stacked compact is fired at a temperature higher than the melting point of at least one of the alloy powder and the metal powder in the step of firing.

56. A method for manufacturing the ceramic member of claim 1 comprising:

a step of forming a stacked compact from a plurality of metallic paste layers containing at least one of an alloy powder comprising a metal component $M_1$ and a metal powder consist of the metal component $M_1$ that are stacked one on another via ceramic green sheets; and a step of firing the stacked compact, wherein, when a mass percentage X is a proportion of the metal component $M_1$ to the total metal content in the metallic paste layer, the mass percentage X of a portion of at least one layer of said plurality of metallic paste layers is set higher than a mass percentage X of the metallic paste layer that adjoins said at least one layer in the stacking direction in the step of forming a stacked compact, and wherein the stacked compact is fired at a temperature higher than the melting point of at least one of the alloy powder and the metal powder in the step of firing.

* * * * *